United States Patent
Namba et al.

(10) Patent No.: US 8,384,449 B2
(45) Date of Patent: Feb. 26, 2013

(54) SYNTHESIZER AND RECEPTION DEVICE USING THE SAME

(75) Inventors: Akihiko Namba, Osaka (JP); Yasunobu Tsukio, Osaka (JP); Susumu Fukushima, Osaka (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 12/866,951

(22) PCT Filed: Feb. 10, 2009

(86) PCT No.: PCT/JP2009/000520
§ 371 (c)(1),
(2), (4) Date: Aug. 10, 2010

(87) PCT Pub. No.: WO2009/101792
PCT Pub. Date: Aug. 20, 2009

(65) Prior Publication Data
US 2010/0315138 A1 Dec. 16, 2010

(30) Foreign Application Priority Data

Feb. 12, 2008 (JP) .................. 2008-030248
Feb. 14, 2008 (JP) .................. 2008-032855

(51) Int. Cl.
*H03L 7/06* (2006.01)

(52) U.S. Cl. ...................... 327/156; 327/147
(58) Field of Classification Search .................. 327/147, 327/149, 156, 158
See application file for complete search history.

(56) References Cited

U.S. PATENT DOCUMENTS

| 6,573,769 B1 * | 6/2003 | Zhang et al. .................. 327/156 |
| 6,995,622 B2 | 2/2006 | Partridge et al. |
| 7,221,230 B2 | 5/2007 | Partridge et al. |
| 7,224,236 B2 | 5/2007 | Partridge et al. |
| 7,405,627 B2 | 7/2008 | Shimomura et al. |

(Continued)

FOREIGN PATENT DOCUMENTS

| JP | 62-025543 A | 2/1987 |
| JP | 03-209917 | 9/1991 |

(Continued)

OTHER PUBLICATIONS

Nguyen et al., "Micromachined Devices for Wireless Communiations," Proceedings of the IEEE, vol. 86, No. 8, Aug. 1998, pp. 1756-1768.

(Continued)

*Primary Examiner* — Adam Houston
(74) *Attorney, Agent, or Firm* — RatnerPrestia

(57) ABSTRACT

A synthesizer of the present invention includes a synthesizer section that generates an oscillation signal based on a reference oscillation signal output from a MEMS resonator and inputs the oscillation signal to a frequency converter; and a control section that adjusts a frequency of the oscillation signal output from the synthesizer section. In frequency adjustment by the control section, when a frequency adjustment unit of the synthesizer section is defined as predetermined value F in which quality of an output signal from the frequency converter is a quality limit threshold value, frequency adjustment unit Δfcont of the synthesizer section is within predetermined value F.

14 Claims, 26 Drawing Sheets

U.S. PATENT DOCUMENTS

| | | | |
|---|---|---|---|
| 7,436,227 B2 * | 10/2008 | Thomsen et al. | 327/147 |
| 7,453,324 B2 | 11/2008 | Partridge et al. | |
| 7,532,081 B2 | 5/2009 | Partridge et al. | |
| 7,616,073 B1 * | 11/2009 | Taheri et al. | 331/176 |
| 7,907,027 B2 | 3/2011 | Partridge et al. | |
| 2004/0232995 A1 * | 11/2004 | Thomsen et al. | 331/2 |
| 2004/0232997 A1 * | 11/2004 | Hein et al. | 331/16 |
| 2005/0151592 A1 | 7/2005 | Partridge et al. | |
| 2005/0185722 A1 | 8/2005 | Abe et al. | |
| 2005/0285692 A1 * | 12/2005 | Mattila et al. | 331/175 |
| 2006/0022764 A1 | 2/2006 | Partridge et al. | |
| 2006/0033589 A1 | 2/2006 | Partridge et al. | |
| 2006/0139107 A1 * | 6/2006 | Ota et al. | 331/16 |
| 2007/0057737 A1 * | 3/2007 | Davis et al. | 331/17 |
| 2007/0152758 A1 | 7/2007 | Shimomura et al. | |
| 2008/0150642 A1 | 6/2008 | Partridge et al. | |
| 2008/0157884 A1 * | 7/2008 | Lee | 331/44 |
| 2008/0164953 A1 | 7/2008 | Partridge et al. | |
| 2009/0039968 A1 * | 2/2009 | Thomsen et al. | 331/10 |
| 2009/0278619 A1 | 11/2009 | Partridge et al. | |
| 2010/0315138 A1 * | 12/2010 | Namba et al. | 327/157 |
| 2012/0032555 A1 * | 2/2012 | Koning et al. | 310/315 |

FOREIGN PATENT DOCUMENTS

| | | |
|---|---|---|
| JP | 05-122064 A | 5/1993 |
| JP | 07-154252 | 6/1995 |
| JP | 07-245563 | 9/1995 |
| JP | 07-336220 | 12/1995 |
| JP | 09-098109 | 4/1997 |
| JP | 10-271001 | 10/1998 |
| JP | 2003-069426 A | 3/2003 |
| JP | 2003-133951 A | 5/2003 |
| JP | 2004-201286 A | 7/2004 |
| JP | 2007-175577 A | 7/2007 |
| JP | 2007-518351 A | 7/2007 |
| JP | 2008-030248 | 2/2008 |
| JP | 2008-032855 | 2/2008 |
| WO | WO2006/027831 A1 | 3/2006 |

OTHER PUBLICATIONS

International Search Report for International Application No. PCT/JP2009/000520, May 12, 2009, Panasonic Corporation.

Japanese Office Action for 2008-030248, Aug. 9, 2011.

* cited by examiner

Δfcont=Δfa

Δfcont=Δfb

Δfcont=Δfc

Δfcont=Δfd

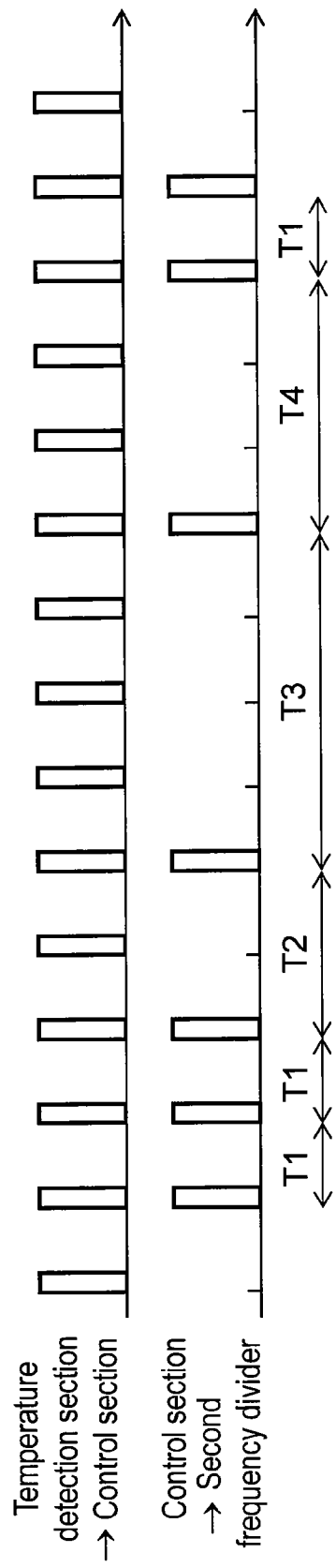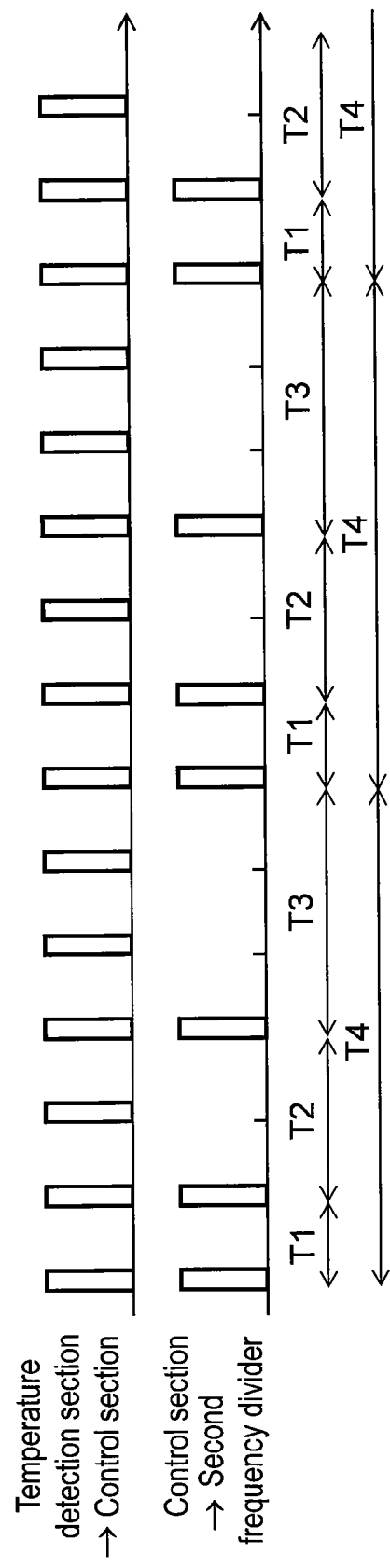

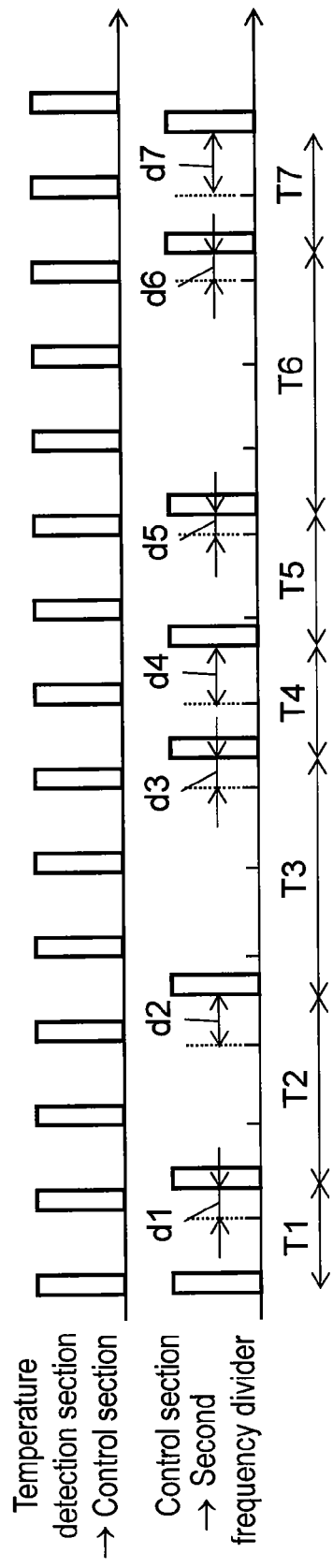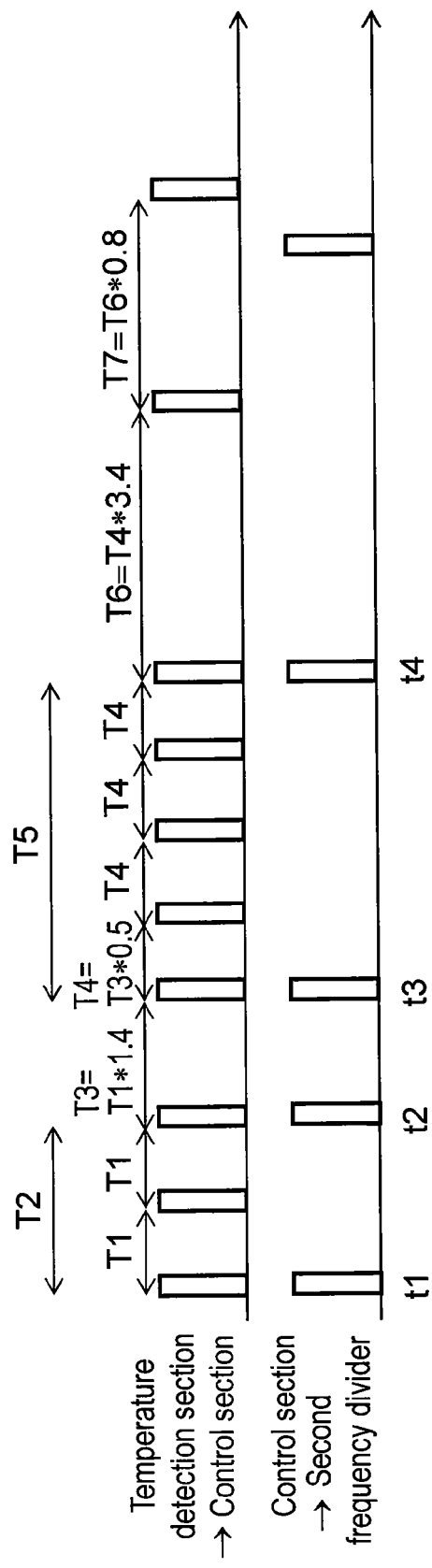

SYNTHESIZER AND RECEPTION DEVICE USING THE SAME

THIS APPLICATION IS A U.S. NATIONAL PHASE APPLICATION OF PCT INTERNATIONAL APPLICATION PCT/JP2009/000520.

TECHNICAL FIELD

The present invention relates to a synthesizer that has frequency-temperature characteristics and corrects a frequency with respect to a temperature such that the frequency changes discretely (digitally), and a reception device using the synthesizer.

BACKGROUND ART

Hereinafter, a conventional synthesizer is described with reference to FIG. 31. The synthesizer carries out temperature compensation of a reference oscillator for outputting a reference oscillation signal.

FIG. 31 is a block diagram showing conventional synthesizer 100. In FIG. 31, conventional synthesizer 100 includes first frequency divider 102 for frequency-dividing a reference oscillation signal output from reference oscillator 101, comparator 103 for receiving an output signal from first frequency divider 102, and low-pass filter 104 for receiving an output signal from comparator 103 and outputting a signal voltage value having a near-DC frequency. Synthesizer 100 further includes oscillator 105 for outputting an oscillation signal based on the signal voltage value output from low-pass filter 104, which is input into second frequency divider 106 at the other side. As oscillator 105, a voltage controlled oscillator (VCO) is often used. Furthermore, synthesizer 100 includes second frequency divider 106 for frequency-dividing an output signal from oscillator 105 by a frequency division number designated by control circuit 107 according to channel designation. Comparator 103 compares an output signal from second frequency divider 106 with the output signal from first frequency divider 102.

The above-mentioned configuration is that of a general synthesizer. Synthesizer 100 shown in FIG. 31 further includes temperature sensor 108 for sensing an ambient temperature, and control circuit 107 for controlling a frequency division number of second frequency divider 106 based on a temperature sensed by temperature sensor 108. Thus, synthesizer 100 corrects shift of an oscillation frequency caused by the change of the ambient temperature by using temperature sensor 108. An example of the literature information of the related art of the invention of the present application includes Patent Document 1.

In conventional synthesizer 100, however, for example, a frequency adjustment unit of control circuit 107 is larger than predetermined value F, the phase noise of an oscillation signal is increased, and C/N of a reception device is deteriorated. Thus, excellent reception characteristics cannot be achieved.

[Patent Document 1] Japanese Patent Unexamined Publication No. H3-209917

SUMMARY OF THE INVENTION

The present invention provides a synthesizer that suppresses the occurrence of spuriousness caused by frequency control and is capable of achieving a reception device having excellent reception characteristics, and a reception device using the synthesizer.

A synthesizer of the present invention includes a synthesizer section for generating an oscillation signal based on a reference oscillation signal output from a reference oscillator including a MEMS (Micro-Electro-Mechanical System) resonator and inputting the oscillation signal to a frequency converter, and a control section for adjusting a frequency of the oscillation signal output from the synthesizer section. In frequency adjustment by the control section, when a frequency adjustment unit of the synthesizer section is defined as predetermined value F in which quality of an output signal from the frequency converter is a quality limit threshold value, frequency adjustment unit Δfcont of the synthesizer section is within predetermined value F.

With the above-mentioned configuration, the synthesizer of the present invention makes the frequency adjustment unit of the synthesizer within predetermined value F when frequency adjustment is carried out such that a frequency division number of a frequency divider is changed according to the temperature change. Thereby, the synthesizer can suppress the deterioration of reception quality.

BRIEF DESCRIPTION OF THE DRAWINGS

FIG. 21 is a timing chart showing a state in which a control section of the synthesizer transmits a control signal to a second frequency divider in the fourth exemplary embodiment of the present invention.

FIG. 22 is another timing chart showing a state in which a control section of the synthesizer transmits a control signal to a second frequency divider in the fourth exemplary embodiment of the present invention.

FIG. 24 is still another timing chart showing a state in which the control section of the synthesizer transmits a control signal to a second frequency divider in the fourth exemplary embodiment of the present invention.

FIG. 25 is yet another timing chart showing a state in which the control section of the synthesizer transmits a control signal to a second frequency divider in the fourth exemplary embodiment of the present invention.

REFERENCE MARKS IN THE DRAWINGS

| | |
|---|---|
| 1, 201, 401 | synthesizer |
| 2, 202, 402 | reference oscillator |
| 3, 203, 403 | first frequency divider |
| 4, 204, 404 | comparator |
| 5 | oscillator |
| 6, 206, 406 | second frequency divider |
| 7, 207, 407 | control section |
| 8 | temperature sensor |
| 9, 410 | loop filter |
| 10, 409 | charge pump |
| 11 | accumulator |
| 12 | adder |
| 13 | variable frequency divider |
| 14, 211, 421 | MEMS resonator |
| 15, 414 | driver amplifier |
| 16 | synthesizer section |
| 17 | memory |
| 18, 411 | frequency converter (mixer) |
| 22 | reception device |
| 20 | RF-IC (Radio Frequency IC) |
| 21 | BB-IC (Base Band IC) |
| 19, 213, 419 | base substrate |
| 23, 214, 423 | antenna |
| 24 | first frequency filter |
| 25, 216, 425 | LNA (Low Noise Amplifier) |
| 26 | second frequency filter |
| 27, 218, 427 | balun |
| 28 | MPEG decoder |
| 29 | front end |
| 30 | demodulation section |
| 31 | reception IC (RF-IC + BB-IC) |
| 32, 33 | control line |
| 205, 405 | voltage controlled oscillator |
| 208, 408 | temperature detection section |
| 209 | charge pump |
| 210 | loop filter |
| 212, 418 | semiconductor IC |
| 215, 424 | first filter |
| 217, 426 | second filter |

DETAILED DESCRIPTION OF THE PREFERRED EMBODIMENT

First Exemplary Embodiment

Figure 1:
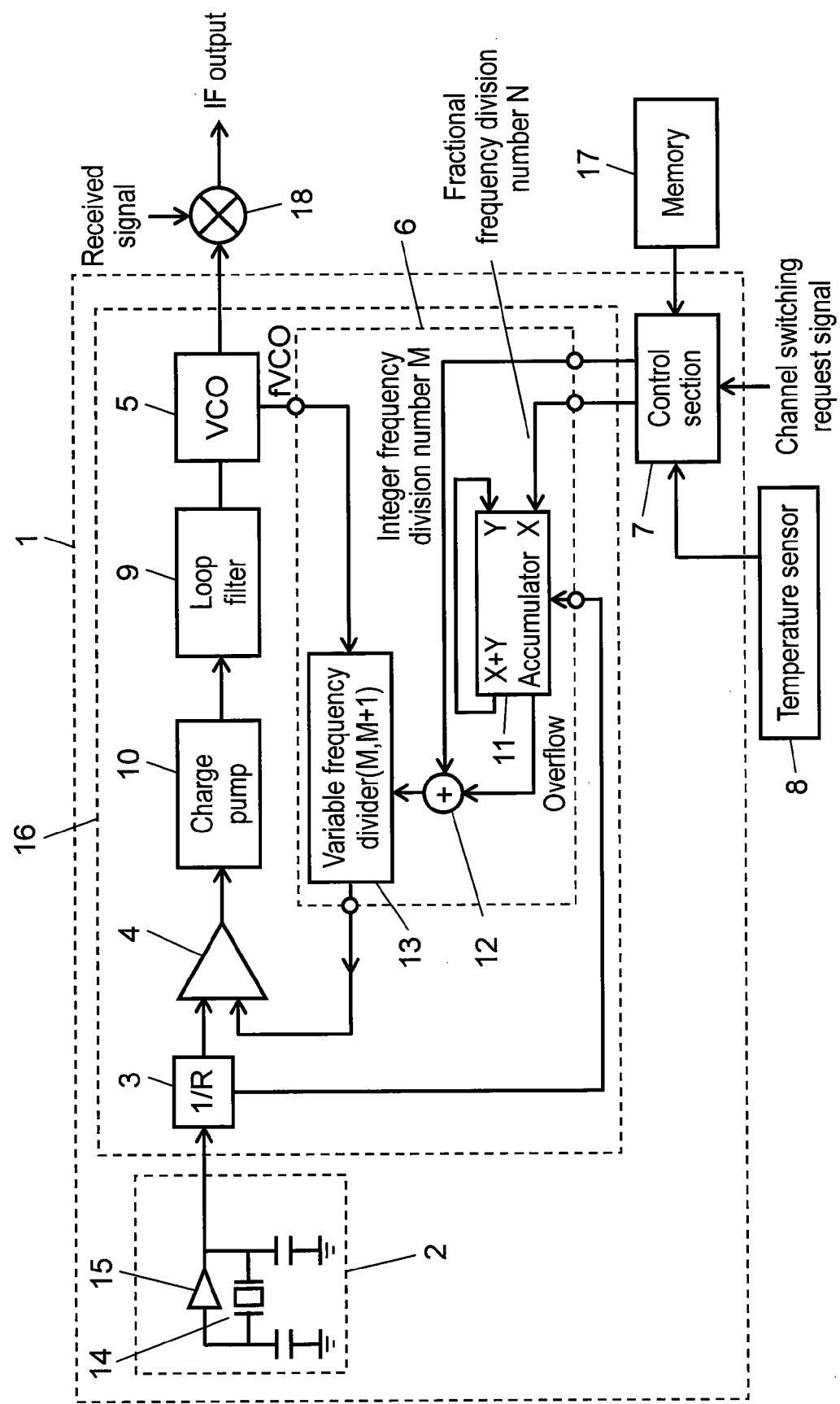
FIG. 1 is a block diagram showing a synthesizer in accordance with a first exemplary embodiment of the present invention.

Hereinafter, a synthesizer in accordance with a first exemplary embodiment is described. FIG. 1 is a block diagram showing a synthesizer in accordance with the first exemplary embodiment of the present invention.

In FIG. 1, synthesizer 1 includes reference oscillator 2 including MEMS resonator 14 made of silicon and driver amplifier 15 for electrically driving MEMS resonator 14. Furthermore, synthesizer 1 includes synthesizer section 16 for generating an oscillation signal based on a reference oscillation signal output from reference oscillator 2 and inputting the generated oscillation signal into frequency converter 18.

Synthesizer section 16 includes, for example, first frequency divider 3 for frequency-dividing the reference oscillation signal, comparator 4 for comparing an output signal from first frequency divider 3 with an output signal from second frequency divider 6, and oscillator 5 for inputting an oscillation signal into frequency converter 18 based on a signal indicating a comparison result output from comparator 4. An example of oscillator 5 includes a voltage controlled oscillator (VCO) in which a frequency changes according to a DC voltage. Furthermore, synthesizer section 16 includes second frequency divider 6 connected to the other output side of oscillator 5. Second frequency divider 6 changes a frequency division number based on the control from control section 7 and inputs a frequency-divided signal into comparator 4. Synthesizer section 16 may include, for example, charge pump 10 connected between comparator 4 and oscillator 5 and converting the output of comparator 4 into an electric current component, and loop filter 9 for extracting only a near-DC component among the output of charge pump 10. Loop filter 9 includes a portion for charging an electric current (electric charge) from comparator 4 by a capacitor and a low-pass filter for allowing a low frequency to pass.

Furthermore, synthesizer 1 includes control section 7 for transmitting appropriate control signals of integer frequency division number M and fractional frequency division number N to second frequency divider 6 based on an output signal of temperature sensor 8 for detecting a temperature, and changing a frequency division number of second frequency divider 6. Furthermore, memory 17 stores, for example, frequency division numbers corresponding to temperatures. Control section 7 controls second frequency divider 6 based on the frequency division number read out from memory 17. Needless to say, control section 7 changes the frequency division number of second frequency divider 6 also based on a channel switching request signal.

Second frequency divider 6 includes an integer portion into which frequency division number M is input and a fraction portion into which frequency division number N is input. Second frequency divider 6 changes an output frequency from oscillator 5 by switching the frequency division numbers. Fractional frequency division is achieved by adding additional values to accumulator 11. When accumulator 11 overflows, "1" is output. The "1" is added to integer frequency division number M by adder 12, and the frequency division number of variable frequency divider 13 becomes "M+1." By alternately switching frequency division numbers M and M+1, the fractional frequency division number can be controlled.

Note here that the frequency divider described herein is a frequency divider called a fractional frequency divider, which is capable of controlling frequencies finely. However, depending upon a frequency range or a frequency division number to be changed, other frequency dividers such as an integer frequency divider may be used. Furthermore, fractional frequency dividers other than that described herein may be used. In a word, any component circuits may be employed as long as they are capable of switching frequencies of oscillator 5. Furthermore, herein, as a sensor for sensing a frequency fluctuation amount of a reference oscillator, temperature sensor 8 is used. However, the sensor is not necessarily limited to this, any sensors can be used as long as they are capable of directly or indirectly sensing a frequency fluctuation amount of a reference oscillator and, as a result, allowing an output frequency of synthesizer 1 to be a predetermined value.

Figure 2:
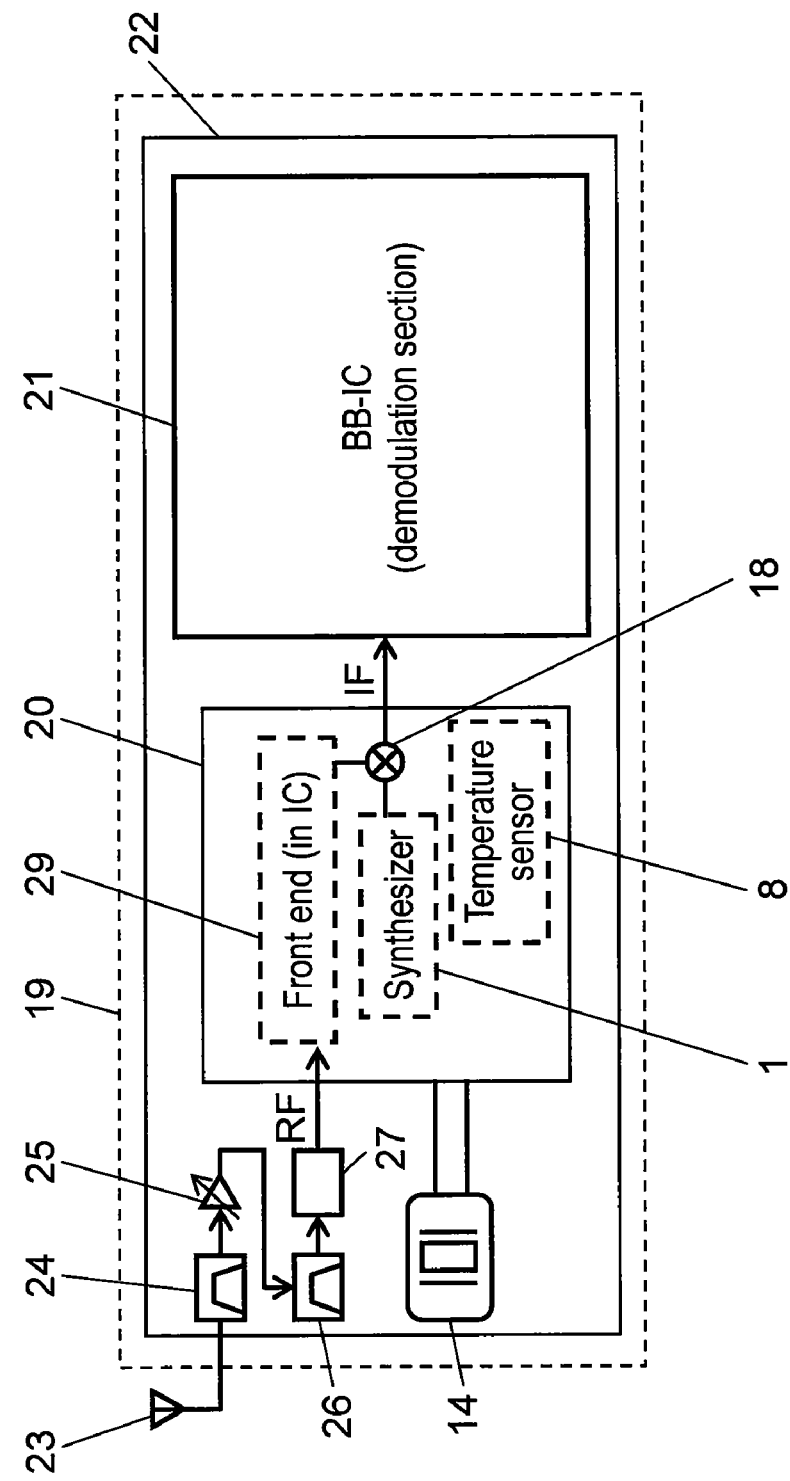
FIG. 2 is a block diagram showing a reception device equipped with the synthesizer in accordance with the first exemplary embodiment of the present invention.

FIG. 2 is a block diagram showing a reception device equipped with the synthesizer in accordance with the first exemplary embodiment of the present invention. In reception device 22 used in the first exemplary embodiment, synthesizer 1 of the first exemplary embodiment is installed in the Japanese terrestrial digital television broadcasting (Integrated Services Digital Broadcasting for Terrestrial, ISDB-T) reception system.

Herein, ISDB-T is described. ISDB-T uses Orthogonal Frequency Division Multiplexing (OFDM). The reception bandwidth is about 5.6 MHz, and it is divided into 13 frequency segments. Among them, 12 segments (full segment) are used for televisions for household use, and 1 segment (one segment) is used for televisions of mobile terminals such as portable telephones and the like. Furthermore, the OFDM employs a multiple-carrier system. In, for example, mode 3 of one-segment system, 433 carriers are arranged at a carrier interval of about 1 kHz so as to form one reception channel.

Synthesizer 1 is incorporated in RF-IC 20. In FIG. 2, a television signal received by antenna 23 passes through first frequency filter 24 for removing interference waves. For example, in a television reception device installed in a portable telephone, a signal output from the portable telephone itself is the strongest interference wave against the television reception device, and therefore a frequency filter for removing such an interference wave is provided. Then, an output signal from first frequency filter 24 passes through low noise amplifier 25 for amplifying a signal, and further passes through second frequency filter 26 for removing interference waves. Second frequency filter 26 removes interference waves that have not been completely removed by first frequency filter 24 or other interference waves with relatively less intensity.

Next, an output signal from second frequency filter 26 passes through balun 27 for converting an unbalance signal into a balance signal, and is input into front end 29 of RF-IC 20. A signal amplified by a low noise amplifier in front end 29 is input into frequency converter 18, then synthesized with an oscillation signal as an output of synthesizer 1, and converted into an intermediate frequency (IF). Note here that a driver circuit section for driving MEMS resonator 14 and a load capacity are not shown.

The signal converted into the intermediate frequency IF is input into BB-IC (Base Band IC) 21, that is, a demodulation IC. At the demodulation side, signal processing such as deinterleaving or decoding of an error correction code is carried out, and data are demodulated. Herein, the "deinterleaving" denotes releasing of interleave, which rearranges data at the time of modulation, in order to reduce burst errors. Furthermore, systems such as Japanese ISDB-T and foreign DVB-H use Viterbi code and Reed-Solomon code as the error correction code.

A signal entering the demodulation section is firstly subjected to decoding of Viterbi code, and then to decoding of Reed-Solomon code. At this time, in order to obtain a state in which errors hardly occur, that is, an error-free state (for example, BER=$1 \times 10^{-11}$ or less, wherein "^" represents exponentiation, 10 is a base and −11 is an exponent), it is necessary that the BER after decoding of Viterbi code is carried out is a predetermined value or less (for example, BER=$2 \times 10^{-4}$ or less). BER (Bit Error Rate) denotes a bit error rate, and functions as a standard for evaluating quality of an output signal from frequency converter 18, that is, quality of a received signal. The value of BER=$1 \times 10^{-11}$ or less as an example of the reception quality in the "error free" state described herein denotes a threshold value capable of achieving a state that several bit errors or less occur after reception is continued for one day. This is a threshold value in the strictest condition. Furthermore, the reception quality state can be defined also by the term: "no recognizable errors on a screen," which indicates a level at which image deterioration is not visually observed in viewing television. Practically, this level is more realistic. Also in this case, it is necessary that the BER after decoding of Viterbi code is a predetermined value or less (for example, BER=$3\times10^{-3}$). Furthermore, the quality can be defined also based on whether or not "synchronization" of initial data can be established. The "synchronization" of the initial data herein denotes synchronization to be established before data undergo deinterleaving that allows interleave code to return to an original arrangement and decoding of an error correction code. Specific examples of the quality of received signals are described in detail later.

With the above-mentioned processing, processing from data reception to data demodulation is completed. The first exemplary embodiment describes a configuration in which a demodulation section including BB-IC 21 as a main component circuit is contained in reception device 22. However, the configuration is not necessarily limited to this. Reception device 22 may be a portion that does not include a demodulation section. Actually, some television reception devices for household use and television reception devices used in portable telephones may employ a portion that does not include a demodulation section as a reception device. In this case, a demodulation section is separately provided outside the reception device.

Figure 3:
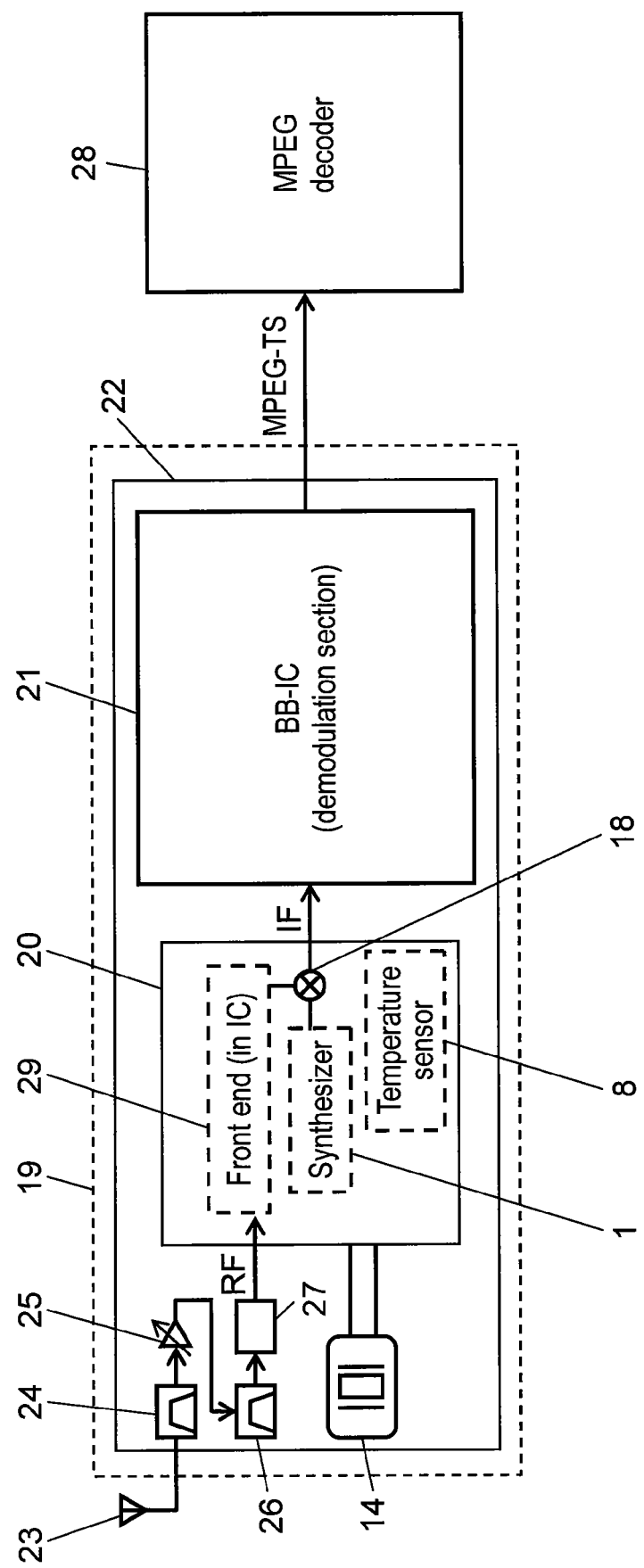
FIG. 3 is a block diagram showing an electronic device equipped with the reception device in accordance with the first exemplary embodiment of the present invention.

FIG. 3 is a block diagram showing an electronic device equipped with the reception device in accordance with the first exemplary embodiment of the present invention. FIG. 3 does not show a display for displaying an image, that is, a display section. MPEG decoder 28 is further connected to the output side of reception device 22 described in FIG. 2. Data, in which decoding of Reed-Solomon code has been completed in the demodulation section, are input into MPEG decoder 28 as an MPEG-TS signal. MPEG decoder 28 reproduces an image signal and displays it as an image.

Next, an operation of the synthesizer of the first exemplary embodiment and a configuration to achieve the operation are described.

Figure 4:
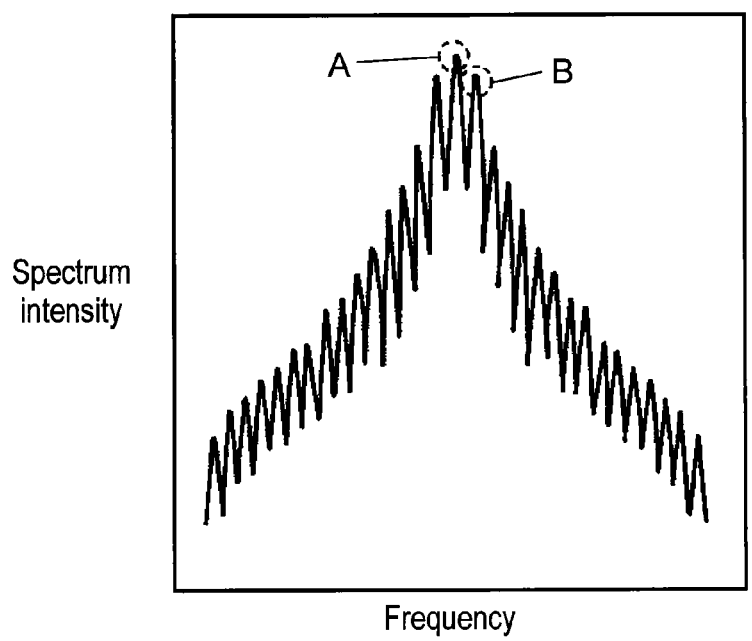
FIG. 4 is a graph showing an instantaneous output spectrum of oscillator 5 shown in FIG. 1 when frequency adjustment unit Δfcont is changed.

FIG. 4 is a graph showing an instantaneous output spectrum of oscillator 5 shown in FIG. 1 when frequency adjustment unit Δfcont is changed. Note here that Δfcont is an absolute value. Actually, a plus sign is given when adjustment is carried out to the plus side, and a minus sign is given when adjustment is carried out to the minus side. Hereinafter, all cases describe a plus side. The same is true to predetermined value F mentioned below. For example, predetermined value F of 60 Hz means that the absolute value of predetermined value F is 60 Hz. Furthermore, in the first exemplary embodiment, the output of oscillator 5 directly becomes an oscillation signal.

In FIG. 4, the ordinate shows output intensity, which is shown in logarithm scale, and the abscissa shows a frequency. A peak denoted by A in the center part is a peak of an original oscillation signal. Other sub-peaks, for example, a part denoted by B is an originally unnecessary electric power called spuriousness. If many spurious parts are present, the quality of an output signal obtained after a local oscillation output is multiplied by a received signal by frequency converter 18 is deteriorated. As a result, reception performance is deteriorated.

Electric power ratio per unit frequency between noise components such as spuriousness and originally desired signal (oscillation signal in FIG. 4) components is referred to as phase noise. When the phase noise performance is bad, in an output signal from a frequency mixer as frequency converter 18, C/N (Carrier Noise Ratio) that is a ratio of the desired signal components (carrier) to the noise components may be also deteriorated. Furthermore, errors may be increased also at the reception side, that is, in the latter stage such as a demodulation section that receives an IF output in FIG. 1. For example, in digital communication, BER (Bit Error Rate) as the error rate of the received signal may be deteriorated. In television, such deterioration of BER may cause disturbance in received pictures. At worst, reception may become impossible. Such C/N and BER are a standard for understanding the quality of received signals.

In a conventional general synthesizer, since variable frequency divider 13 is not switched so frequently, noise such as spuriousness is not a problem. However, when a resonator having bad frequency-temperature characteristics, for example, a MEMS resonator, is used as a reference oscillator, it is necessary to switch variable frequency divider 13 frequently. Therefore, it is important to reduce noise components such as spuriousness shown in FIG. 4.

Figure 5A:
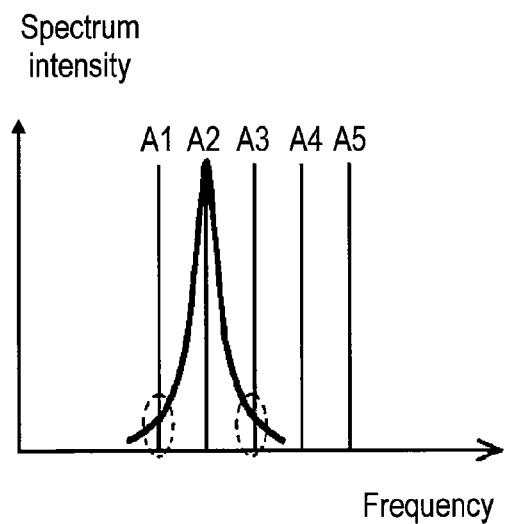
FIG. 5A is a graph showing a frequency spectrum of a received signal in a television system using OFDM.
Figure 5B:
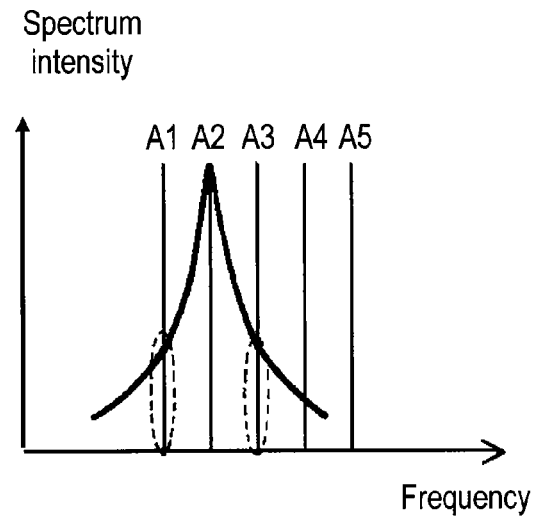
FIG. 5B is a graph showing a frequency spectrum of a received signal in a television system using OFDM.
Figure 6A:
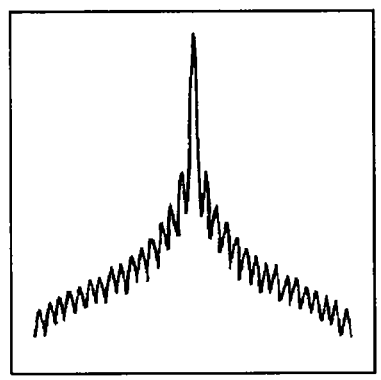
FIG. 6A is a graph showing an instantaneous output spectrum of VCO when frequency adjustment unit Δfcont is changed.
Figure 6B:
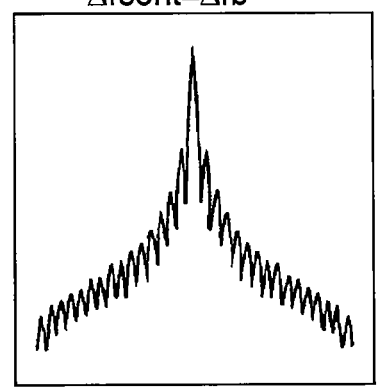
FIG. 6B is a graph showing an instantaneous output spectrum of VCO when frequency adjustment unit Δfcont is changed.
Figure 6C:
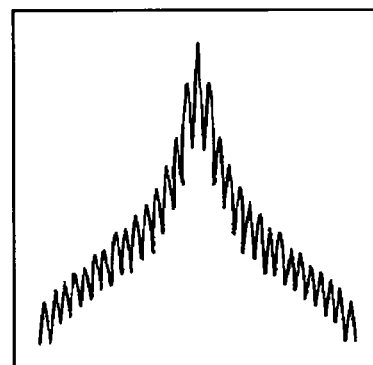
FIG. 6C is a graph showing an instantaneous output spectrum of VCO when frequency adjustment unit Δfcont is changed.
Figure 6D:
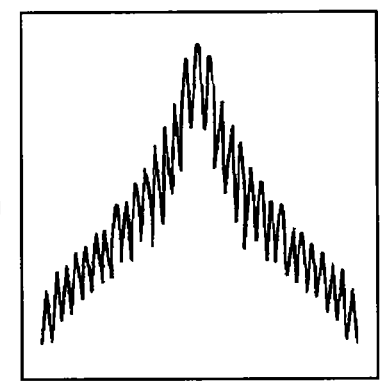
FIG. 6D is a graph showing an instantaneous output spectrum of VCO when frequency adjustment unit Δfcont is changed.

FIGS. 5A and 5B are graphs showing a frequency spectrum of a received signal in a television system using OFDM. The OFDM uses a multiple-carrier system and includes a plurality of carriers carrying information. FIGS. 5A and 5B show only five carriers, but actually, in many cases, a signal includes 1000 carriers or more. For easy understanding of the phase noise, actual signals and tip portions of spuriousness are linked in the graphs conveniently.

In FIG. 5A, when carrier A2 is noted, the spread of the spectrum of carrier A2 is small and an influence of carrier A2 on neighboring carriers A1 and A3 is small. This shows a state in which the phase noise of a synthesizer is excellent. However, when the phase noise of an oscillation signal is deteriorated, the phase noise of carrier A2 has an influence on neighboring carriers A1 and A3 as shown in FIG. 5B, causing deterioration of C/N of a received signal. A state in which the phase noise of an oscillation signal is large, that is, a state shown in FIG. 4 has an influence also on a received signal to be multiplied by the received signal by frequency converter 18, thus causing the situation shown in FIG. 5B.

Thus, the phase noise performance of a synthesizer or an oscillator has a large influence on an entire system of a reception device or an electronic device. As shown in FIG. 4, even instantaneous deterioration of the phase noise in switching may deteriorate the signal quality, cause temporary reception deterioration and reception incapability, and further cause interruption or disturbance of images.

FIGS. 6A to 6D are graphs showing an instantaneous output spectrum of VCO when frequency adjustment unit Δfcont is changed. In FIGS. 6A to 6D, the ordinate shows output intensity, which is shown in logarithm scale, and the abscissa shows frequency.

Frequency adjustment units Δfcont in FIGS. 6A, 6B, 6C and 6D are Δfa, Δfb, Δfc, and Δfd, respectively, which satisfy the relation: Δfa<Δfb<Δfc<Δfd. That is to say, as the frequency adjustment unit Δfcont increases, the level of spuriousness increases, and the phase noise increases. This result shows that the frequency adjustment amount and the phase noise level have a correlation.

In the first exemplary embodiment, from this result, when the frequency division number is changed, the amount of frequency to be changed at a time, that is, frequency adjustment unit Δfcont is made to be such a level at which the deterioration of quality of an output signal is small. The quality of an output signal herein denotes quality of a signal after it passes through frequency converter 18, that is, a signal after an output of synthesizer 1 and a received signal are synthesized. This is because the present invention focuses on the influence of deterioration of the phase noise of the synthesizer on received signals. Furthermore, parameters (C/N, BER, and the like) for judging the quality of the output signal are set, and a quality limit threshold value (BER=2×10^−4, and the like) is set according to the assumed reception quality (error free, no recognizable error on an image, and the like). In order to make the quality more excellent than the quality limit threshold value, Δfcont is made to be within predetermined value F, thereby suppressing the deterioration of the reception characteristics to such a level at which the assumed reception quality can be obtained.

As parameters for quality of an output signal, standards that can be numerically expressed are more preferable, and for example, C/N, BER, and the like, as mentioned above are used. A C/N monitor may be connected immediately behind frequency converter 18. However, the same effect can be obtained when the monitor is connected to any parts behind converter 18 in the circuit block.

Figure 7:
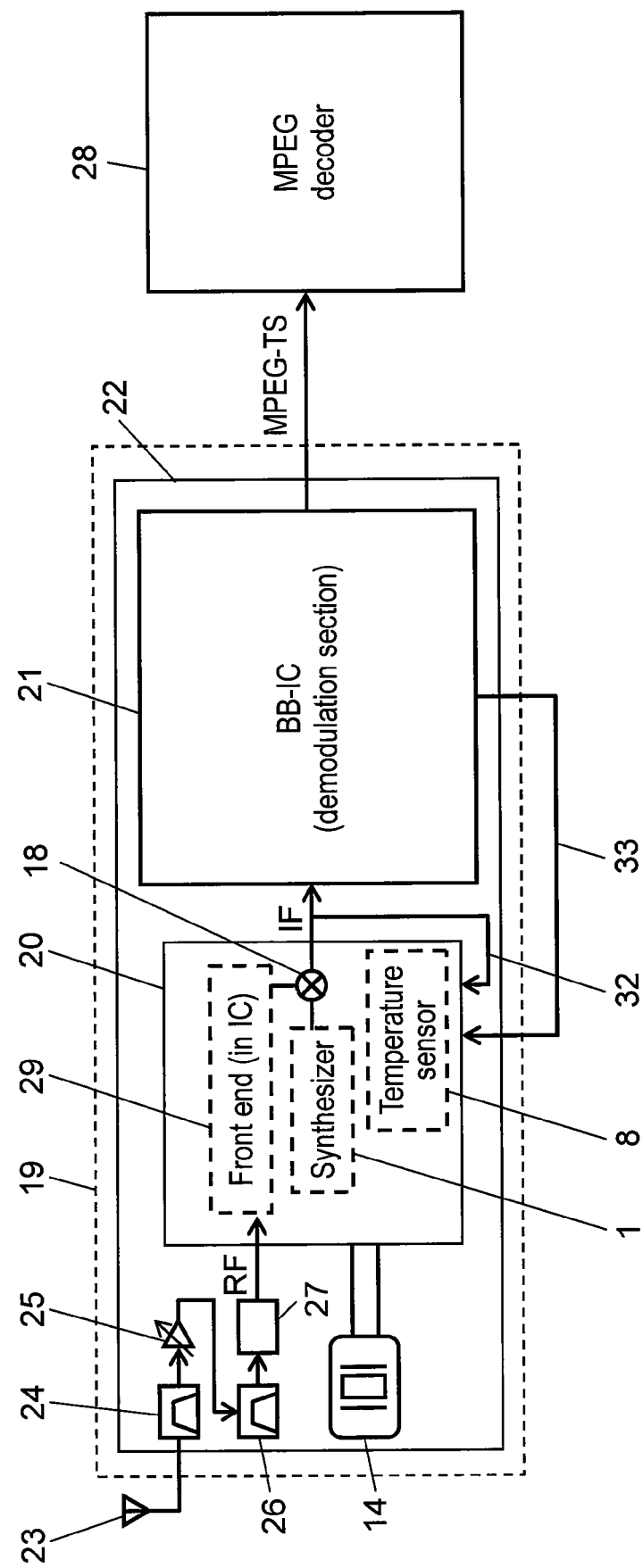
FIG. 7 is another block diagram showing an electronic device in accordance with the first exemplary embodiment of the present invention.

FIG. 7 is another block diagram showing an electronic device in accordance with the first exemplary embodiment of the present invention. In FIG. 7, when a C/N monitor is connected immediately behind frequency converter 18, control line 32 is added. Furthermore, when C/N is monitored by other circuit blocks, it is possible to employ a method of calculating the C/N from a shift (EVM: Error Vector Magnitude) in the constellation before digital demodulation. The first exemplary embodiment uses this method. As shown in FIG. 7, control line 33 is added (a detail circuit block in BB-IC is not shown).

The C/N is linked to reception sensitivity by defining a digital modulation method and the like, and the reception sensitivity can be used as parameters for quality of an output signal. Furthermore, the BER includes a BER after decoding of Viterbi code, a BER after decoding of Reed-Solomon code, and the like. Examples of the error rates include a frame error rate, a packet error rate, or the like, in addition to the BER, and they may be used as a parameter for quality of an output signal.

Also in the above-mentioned case, similarly, control line 33 shown in FIG. 7 is added. Since a circuit such as an arithmetic circuit is provided in BB-IC 21, the values of the parameters for quality of an output signal (for example, C/N, and BER) can be calculated easily in use. Thus, a configuration in which determination control line 33 is added is more preferable.

Figure 8:
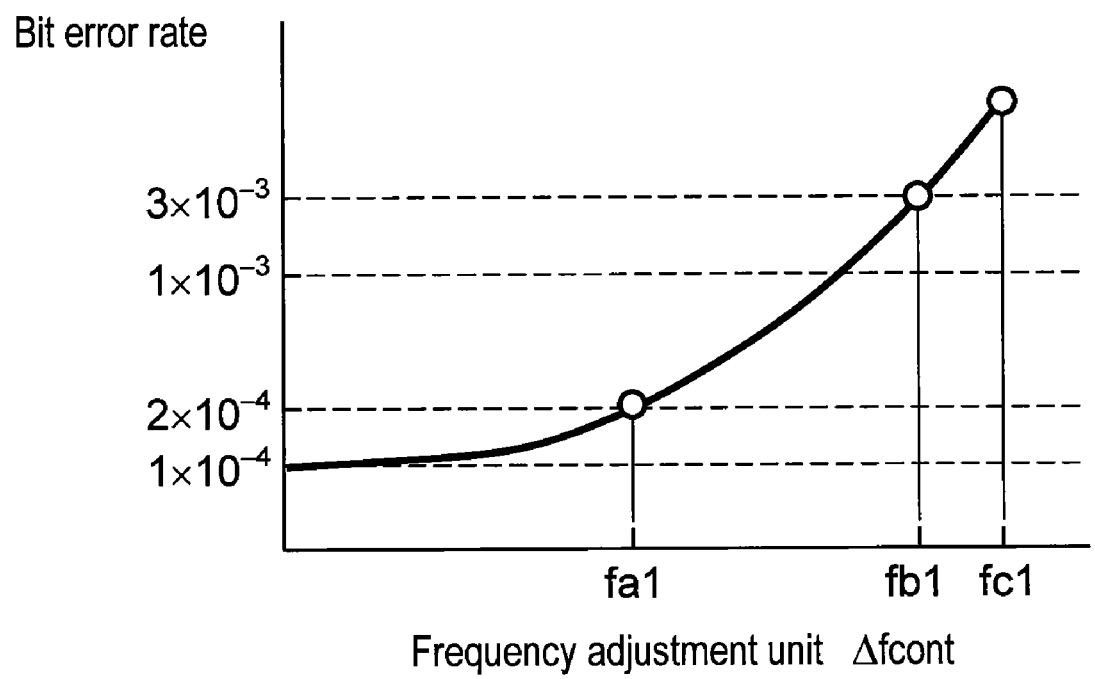
FIG. 8 is a graph showing a change in BER when frequency adjustment unit Δfcont is sequentially changed.

FIG. 8 is a graph showing a change in BER when frequency adjustment unit Δfcont is sequentially changed. In FIG. 8, the ordinate shows BER after decoding of Viterbi code is carried out, which is used as a parameter for evaluating the quality of an output signal, that is, a parameter for determining the quality limit threshold value in the present invention. The abscissa shows frequency adjustment unit Δfcont. Furthermore, the measurement value of BER in FIG. 8 is a measurement value around the minimum sensitivity point of a reception device assuming a severe reception environment. That is to say, it shows a measurement value around the power supply of the received signal, which is minimum necessary for reception in an error-free state in the stage when the final error correction decoding is completed (in the above-mentioned example, after the decoding of Reed-Solomon code is carried out).

As shown in FIG. 8, when frequency adjustment unit Δfcont is 0 in a state in which temperature control is not carried out, the BER after decoding of Viterbi code is set to BER=1×10^−4. Originally, BER for achieving an error-free state is 2×10^−4. The reason why the initial BER is set to 1×10^−4 is because even when a quartz resonator is used as a reference oscillator, deterioration of about 1×10^−4 is expected to occur due to various variations, fluctuations, and the like. By setting this value as the initial value, the error-free state can be achieved even when deterioration may occur finally.

Firstly, the case in which a quality limit threshold value is set so that an error-free state is achieved after the final error correction decoding is finished (after decoding of Reed-Solomon code is carried out) is described.

In FIG. 8, a broken line of BER=2×10^−4 shows a quality limit threshold value. Herein, the quality limit threshold value is defined as an error rate limit threshold value. Frequency fa1 crossing this line is predetermined value F that is a limit of frequency adjustment unit Δfcont. That is to say, when Δfcont ≦F=fa1 is satisfied, signal quality is not damaged and the error-free reception quality can be maintained.

Although depending on digital modulation methods, the above-mentioned deterioration of 1×10^−4 generally corresponds to about 0.1 dB in terms of the minimum input sensitivity. Another quality limit threshold value may be, for example, a value that is deteriorated by 0.1 dB from the initial value of the minimum input sensitivity. In this case, substantially the same effect can be obtained. Furthermore, the same is true to C/N, and the value that is deteriorated by 0.1 dB from the initial value may be a quality limit threshold value. In the determination of the initial value herein, the value when Δfcont=0 is satisfied may be used.

With the configuration using a quality limit threshold value mentioned above, it is possible to achieve a state that does not have an influence on a signal quality almost completely. This is because it is possible to achieve a state in which a bit error hardly occurs even in a digital modulation method in the strictest condition (BER=2×10^−4). The same is true to the other systems using digital modulation such as telephone communication systems by portable telephones and data communication systems, in addition to television systems. With similar configurations, the same effect can be obtained.

Secondly, a case in which a quality limit threshold value is set to a level at which image deterioration cannot be visually observed in actually viewing television is described. This is a state of reception quality with "no recognizable image error." Practically, this level is a more realistic and more preferable quality limit threshold value.

A broken line of BER=3×10^−3 in FIG. 8 shows a quality limit threshold value, and it is defined as an error rate limit threshold value.

Frequency fb1 crossing this line is predetermined value F as a limit of frequency adjustment unit Δfcont. That is to say, when Δfcont ≦F=fb1 is satisfied, the signal quality in viewing television is not damaged and the reception quality with no recognizable image error can be maintained. In general, the deterioration of BER from 1×10^−4 to 3×10^−3 corresponds to about 1 to 1.2 dB in the minimum input sensitivity. Another quality limit threshold value may be, for example, a value that is deteriorated by 1 dB from the initial value of the minimum input sensitivity. Also in this case, the same effect can be obtained. Furthermore, the same is true to C/N, the value that is deteriorated by 1 dB from the initial value may be defined as a quality limit threshold value. In general, this state corresponds to a packet error-free state. Also when this is made to be a quality limit threshold value, the same effect can be obtained.

In addition to television systems, the same is true to digital modulation systems such as telephone communication systems by portable telephones in which a bit error can be permitted to some extent. In each system, when predetermined value F as a limit of Δfcont is set by defining a quality limit value from the quality of an output signal, the same effect can be obtained from the same configuration. In the communication systems by portable telephone and the like, substantially the same effect can be obtained by using substantially the same quality limit threshold value. This is because the relation between the recognition power of human eye and ear and the error rate is not so different. Furthermore, also in the systems such as systems for data communication in which error tolerance is strict, this quality limit threshold value can be used by combining a resending request function of allowing data to be resent for error data.

Thirdly, a case in actual television viewing in which a quality limit threshold value is set to a level at which deterioration of image is permitted and viewing is possible in a state in which an image can be recognized is described. This quality limit threshold value can be judged based on whether or not synchronization is established. The synchronization used herein denotes synchronization of data. Thereafter, deinterleaving and decoding of error correction code are carried out. Therefore, whether or not this synchronization is established has a large influence on the later demodulation and becomes a threshold value that brings the largest influence on the determination of the reception quality.

In FIG. 8, fc1 is predetermined value F that is a limit in establishing synchronization. When $\Delta fcont \leq F=fd1$ is satisfied, synchronization is established. With the subsequent deinterleaving and decoding of an error correction code, the error rate is reduced, and a signal with certain signal quality can be obtained. In television viewing for obtaining only information such as weather forecast, news, and the like, and television viewing by which process of sports game is desired to be obtained, a sufficient effect can be obtained only with this quality limit threshold value.

The same is true to the other systems using digital modulation such as telephone communication systems by portable telephones, in addition to television systems. With a similar configuration, the same effect can be obtained. Setting of the quality limit threshold value is very effective when only contact is desired to be obtained or only an important thing is desired to be transmitted in, for example, a severe environment for telephone conversation in which a temperature fluctuation is large. This is because receiving merit can be obtained even in a state with low-level reception quality. That is to say, human ear and brain themselves have an error correction ability, so that human ear and brain can correct and understand wrong portions or inaudible portions.

Next, specific numeric values are described. For example, when the first exemplary embodiment is applied in mode 3 of one-segment broadcasting of Japanese ISDB-T, predetermined value F as a limit is fa1=60 Hz, fb1=130 Hz, and fc1=160 Hz. This means that television viewing is possible when $\Delta fcont$ is set to 160 Hz or less around the minimum sensitivity point. The carrier interval of multiple-carriers in mode 3 is about 1 kHz. The mode 3 is a mode that is the most susceptible to the phase noise in one-segment broadcasting. Therefore, by applying a quality limit threshold value and predetermined value F as a limit, the effect of the same level or more can be obtained in other modes. Note here that in DVB-T or DVB-H that is a foreign standard, for example, European standard, a similar OFDM method is employed. In any case, minimum carrier interval is 1 kHz, and the effect of the same level or more can be obtained as mentioned above.

Japanese domestic digital television (full-segment) and DVB-T (Digital Video Broadcasting-Terrestrial) that is European standard employ more multi-valued digital modulation method (64QAM). In this case, fa1 is a value in the range of 20 Hz to 30 Hz. Furthermore, although few operations are actually done, also in the one-segment system using 16QAM digital modulation method, fa1 is about 40 Hz to 50 Hz. The one-segment generally uses QPSK as a digital modulation method, which is the same as in the DVB-H (Digital Video Broadcasting-Handheld) that is European standard for mobile communication. Furthermore, 256QAM method that is used in a part of foreign countries' cable televisions, and the like, fa1 is 10 Hz to 15 Hz.

The above description relates to predetermined value F of frequency adjustment unit $\Delta fcont$ in three conditions of the limit threshold values. This exhibits a large effect, particularly when a reference oscillator with bad frequency-temperature characteristics is used. When the frequency-temperature characteristics are bad, a frequency fluctuation with respect to temperatures occurs largely, and therefore it is necessary to largely adjust a frequency based on the frequency division number. When a frequency is adjusted unintentionally, the quality of output signals may be considerably deteriorated. Parameters for defining the quality of output signals are determined, the quality limit threshold value is determined, and further predetermined value F of frequency adjustment unit $\Delta fcont$ is determined as in the first exemplary embodiment. Thereby, the reception quality can be secured. At this time, in particular, by selecting predetermined value F by considering the finally necessary reception quality, suitable reception can be achieved.

The above description relates to a case in which the reception state around the minimum sensitivity point is bad. When the reception state is good, $\Delta fcont$ may be further increased.

Figure 9:
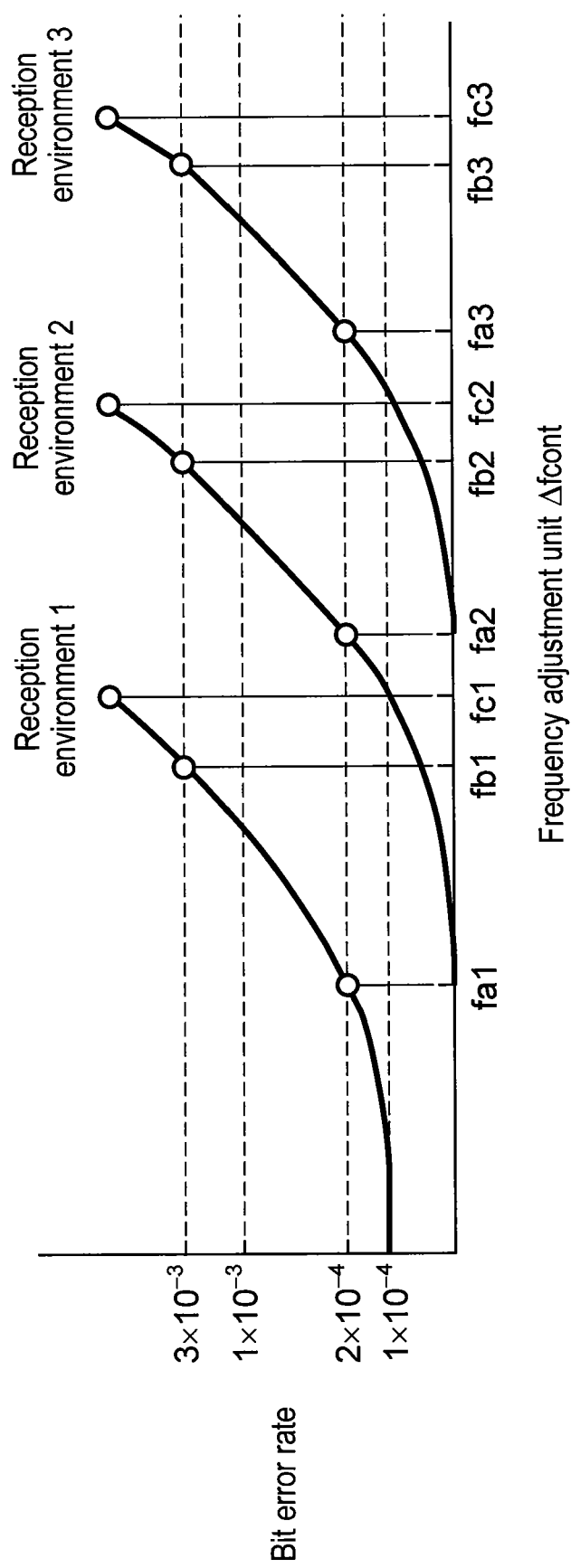
FIG. 9 is a graph showing a change in BER when frequency adjustment unit Δfcont is sequentially changed in different reception environments.

FIG. 9 is a graph showing a change in BER when frequency adjustment unit $\Delta fcont$ is sequentially changed in different reception environments. That is to say, FIG. 9 shows the relation between $\Delta fcont$ and BER in three types of reception environments. In FIG. 9, the degree of severity of reception environment becomes lower (reception environment is improved) from reception environment 1, reception environment 2, to reception environment 3 in this order.

In many cases, the reception environment is determined whether or not the reception state of radio wave is excellent. When the reception state of the radio wave is excellent, the received signal intensity is higher, and thus the ratio with respect to the noise becomes larger. That is to say, received wave with high C/N can be received. Therefore, even when $\Delta fcont$ is large and the phase noise is deteriorated, since the C/N of the initial received signal is high, permissible $\Delta fcont$ is increased. That is to say, in a quality limit threshold value in which an error-free state is obtained, the relation: fa1<fa2<fa3 is satisfied. In a quality limit threshold value in which a state with a level at which a noise cannot be visually observed in image viewing is obtained, the relation: fb1<fb2<fb3 is satisfied. In a quality limit threshold value in which a state with a level at which an image can be recognized is obtained, the relation: fc1<fc2<fc3 is satisfied.

From the above description, predetermined value F of $\Delta fcont$ as a limit changes depending upon reception states. By determining the value based on the intensity of a desired wave of an output signal from the frequency converter or signal quality, larger $\Delta fcont$ can be obtained. As a result, it is possible to provide a synthesizer that is resistant to a large reference frequency fluctuation and to provide a reception device and an electronic device using the synthesizer.

In order to measure BER, a predetermined period of time is required. Therefore, when more instantaneous determination is needed, it is more preferable that C/N is monitored. Furthermore, in a state in which the C/N of the received signal is high to some extent, since BER shows only an error-free state, it is preferable that the C/N is monitored.

When BER is monitored, for example, a change of BER is measured while Δfcont is being increased, and Δfcont is set to be around the error rate limit threshold value or lower. That is to say, frequency adjustment unit Δfcont is changed; based on signal quality that changes according to the changed frequency adjustment unit Δfcont, predetermined value F of Δfcont is determined such that it is not beyond the signal quality limit threshold value; and then a frequency is adjusted within the determined predetermined value F.

In the above-mentioned configuration of the first exemplary embodiment, control is carried out by using control line 33 output from BB-IC 21. This is because an operation of BER itself is carried out in BB-IC 21. When a value of the BER is transmitted to MPEG decoder 28, a control line may be output from MPEG decoder 28. Depending upon the parameters for determining the quality of the desired signal, a circuit block from which a control line is output may be selected.

The effect of the first exemplary embodiment can be obtained when monitoring of C/N and BER is not carried out by providing such a control line 33. For example, when a reception system is fixed, predetermined value F is determined at the initial time, and frequency may be adjusted by adjusting the frequency adjustment unit according to predetermined value F. In QPSK in one segment, when predetermined value F of fa1 is set to 60 Hz, the conditions for error-free state are always satisfied. Furthermore, when it is intended to be used for digital televisions in household use, fa1 may be set to 20 Hz.

In the first exemplary embodiment, as MEMS resonator 14 constituting reference oscillator 2, a MEMS resonator such as a silicon resonator is used. Before the reason therefore is described, frequency-temperature characteristics are described.

In general, a reference temperature is T0, a current temperature is T, a resonance frequency at the reference temperature is f, and a change amount of resonance frequency is δT when the temperature is changed from T0 to T, the frequency fluctuation rate δf/f when the temperature is changed from T0 to T is represented by the following mathematical formula Math. 1:

$$\delta f/f = \alpha(T-T0) + \beta(T-T0)^2 + \gamma(T-T0)^3 \quad \text{[Math. 1]}$$

Herein, α, β, and γ are referred to as primary, secondary, and tertiary frequency-temperature coefficients, respectively. Resonators with small temperature coefficient have good frequency-temperature characteristics. Hereinafter, an effect of the present invention when a MEMS resonator such as a silicon resonator is used is described.

Firstly, the frequency-temperature characteristics of a MEMS resonator are worse than those of a quartz resonator. For example, in a quartz resonator, the primary frequency-temperature coefficient is 0 and the secondary and tertiary frequency-temperature coefficients are also small. In general, the temperature coefficients become smaller from primary, secondary, and tertiary coefficients sequentially in this order, and the influences on the frequency-temperature characteristics in the operating temperature range become also smaller. Therefore, the primary temperature coefficient of 0 means that the frequency-temperature characteristic of the resonator is extremely excellent. Each temperature coefficient of quartz varies depending upon a cut angle when a quartz plate is cut out from a quartz ingot (a lump after quartz is pulled). An AT-cut quartz resonator is one of the quartz resonators to be used most widely because of its excellent frequency-temperature characteristics. For example, the frequency fluctuation rate in the temperature range (−30° C. to 85° C.) is about ±20 ppm to ±100 ppm. The range of the frequency fluctuation rate is generated by a fine difference in cut angles.

Unlike the quartz resonator, a silicon resonator that is one of the MEMS resonators has poor frequency-temperature characteristics.

In a silicon resonator, a primary temperature coefficient is large as −30 ppm/° C. Since the primary temperature coefficient is dominant in the operating temperature range, the frequency fluctuation rate is considered with the secondary and tertiary temperature coefficients ignored. The frequency fluctuation rate of a silicon resonator is ±1725 ppm in entire operating temperature range, which is not less than ten times larger than that of the quartz resonator.

In synthesizer 1 used in the first exemplary embodiment, when the reference oscillator is shifted due to, for example, a temperature change, by changing the frequency division number of second frequency divider 6 of synthesizer 1, a frequency output from synthesizer 1 is set to a substantially constant value. Alternatively, a frequency is set to a value that does not have an influence on the latter stage.

Herein, when the frequency fluctuation of reference oscillator 2 with respect to a temperature is large, a frequency correction range is required to be large. Unless frequency adjustment unit Δfcont is made to be predetermined value F, the phase noise performance of the output of synthesizer 1 is deteriorated. The details are described later. An example in mode 3 of the one-segment broadcasting in Japanese domestic ISDB-T is described briefly.

In silicon resonators, when a temperature changes by 1° C./sec, the frequency fluctuation of 30 ppm occurs. Assuming that a frequency of an oscillation signal is 500 MHz, the frequency fluctuation of 15 kHz is generated. When the frequency control interval is set to 100 msec, frequency adjustment unit Δfcont becomes 1.5 kHz, thus causing a state in which reception is impossible. In quartz, however, the fluctuation is only 1 ppm/° C., and frequency adjustment unit Δfcont is 50 Hz. Thus, an error-free level can be achieved. Thus, as the temperature characteristics of a resonator installed in a reference oscillator are worse, the effect of the present invention is exhibited more remarkably.

Furthermore, since the fluctuation is large when the frequency-temperature characteristics are bad, the frequency is required to be changed dynamically. On the contrary, since high frequency accuracy is required, the frequency is required to be changed finely. Since it is necessary to satisfy both requirements, frequency correction methods to be selected are limited. Thus, inevitably, the method includes digitally changing as described in the first exemplary embodiment. Such a change may cause an influence on the phase noise performance mentioned above. In other words, with a configuration using the frequency temperature compensation method that may cause phase discontinuity caused by a digital frequency change, the phase noise becomes large, and C/N of the reception device is deteriorated. Consequently, excellent reception characteristics cannot be obtained. Therefore, in systems such as portable telephones and television systems that require the phase noise performance, it is difficult to use a configuration formed by providing a reference oscillator using a MEMS resonator in a configuration that is shown in the conventional example.

Secondary, the phase noise performance of an MEMS oscillator using a MEMS resonator is worse than that of a quartz resonator. Since a quartz oscillator using a quartz resonator is excellent in the phase noise performance, even when the phase noise is deteriorated by frequency compensation, necessary performance in the entire synthesizer may be able to be maintained. On the other hand, although depending upon structures, materials, vibration modes to be used, and the like, in many cases, MEMS oscillators do not have such a phase noise performance as that of quartz-quartz resonators. Furthermore, even when the phase noise performance is excellent, since the amount of frequency to be changed is large, it takes a long time to reach a target frequency. On the other hand, when the frequency change is intended to be controlled quickly, the frequency may overshoot (phase discontinuity increases). As a result, the phase noise performance in the entire synthesizer may be deteriorated.

Examples of the MEMS resonator include a resonator based on semiconductor such as silicon, a resonator called FBAR (Film Bulk Acoustic Resonator) including a thin film piezoelectric material such as AlN, ZnO, and PZT as a base, a resonator including other thin film materials such as $SiO_2$ as a base, and the like. Examples of the MEMS resonator also include a SAW (Surface Acoustic Wave) resonator using surface acoustic wave, and a resonator using a boundary wave transmitting over boundaries of different materials. Most of the resonators hardly have the same level of frequency-temperature characteristic as those of the AT-cut quartz resonator and almost all of them have the primary temperature coefficient (not negligible).

For example, the frequency-temperature characteristic of a resonator using thickness longitudinal vibration (vibration in the direction in which an electric field is applied) is −25 ppm/° C. in FBAR using AlN, and about −60 ppm/° C. in FBAR using ZnO. Furthermore, also in resonators using SAW, a resonator using 36° y-cut lithium tantalite as a base material has the frequency-temperature characteristic of about −35 ppm/° C., and a resonator using 64° y-cut lithium niobate as a base material has the frequency-temperature characteristic of about −72 ppm/° C.

In many cases, these MEMS resonators can be formed in a smaller size than the size of quartz resonators. Furthermore, most of the MEMS resonators can be integrated into semiconductor IC. In particular, the silicon resonator has many merits, for example, it can be formed along with IC formation because most of semiconductors are formed on a silicon substrate. Furthermore, because AlN, ZnO, and the like, can be formed on a semiconductor substrate, the effect of integration is large.

When a resonator using SAW or boundary wave, or FBAR is used, in order to reduce the size, it is preferable that a resonator is configured to have a higher resonance frequency. In some configurations, a PLL (Phase Locked Loop) may not be included. In one configuration example, a second frequency divider is provided behind the reference oscillator including a SAW resonator, and the second frequency divider is adjusted so as to adjust the frequency. In another configuration example, a plurality of capacitors having a switching function are used as load capacity of the reference oscillator formed of a SAW resonator, and the load capacity is discretely switched by switching capacitors, and thus frequency adjustment is carried out. The above-mentioned configuration examples also include the digital frequency change, and therefore the effect of the present invention can be remarkably exhibited.

MEMS resonators such as a silicon resonator using a MEMS technique as mentioned above have a great merit of reducing the size and cost. However, such resonators have bad frequency-temperature characteristics. Therefore, it is difficult to use such resonators in televisions and portable telephones which require frequency accuracy even when the temperature compensation is controlled. Furthermore, it is difficult to use them in other applications for a timing clock for an electronic device and the like, in which requirements with respect to the frequency accuracy and the phase noise performance are strict. When the phase noise performance is evaluated based on time, the phase noise corresponds to a jitter. In the field of the timing clock, instead of evaluating the phase noise performance, the jitter performance is evaluated. When a high level is required in this performance, it is difficult to use such resonators. The jitter is evaluated by directly measuring a jitter time, or measuring by using the superimposed waveform of digital signals, referred to as an eye pattern.

For the above-mentioned reasons, the use of a MEMS resonator, in particular, a silicon resonator has been limited in spite of the great merits mentioned above.

Herein, even in the above-mentioned case, the configuration of the first exemplary embodiment makes it possible to achieve a synthesizer using a MEMS resonator, a reception device and an electronic device using the synthesizer without deteriorating the reception quality. Hereinafter, the exemplary embodiment is described assuming the use environment, more specifically and quantitatively.

Firstly, a temperature change in the environment inside a room is assumed to be about 0.1° C./sec. In this case, the frequency fluctuation is about 3 ppm/sec. This frequency fluctuation corresponds to 1500 Hz/sec when the local frequency is assumed to be 500 MHz. Herein, reception in mode 3 in one-segment broadcasting is taken as an example. When the practically permissible level at which visually recognizable noises are hardly present in an image is assumed, it is necessary to satisfy $\Delta fcont \leq 130$ Hz.

Figure 10A:
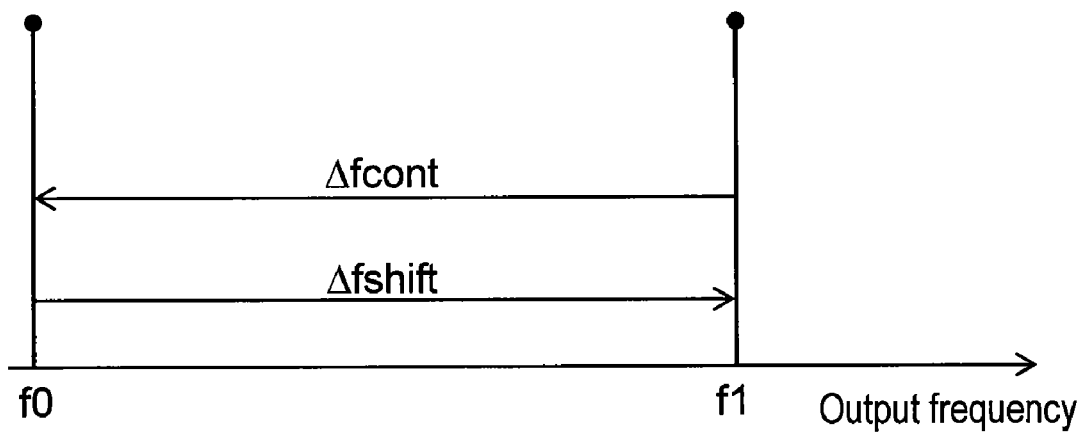
FIG. 10A is a graph showing a transition state of a frequency when frequency adjustment is carried out in a circuit configuration of a general reception device.
Figure 10B:
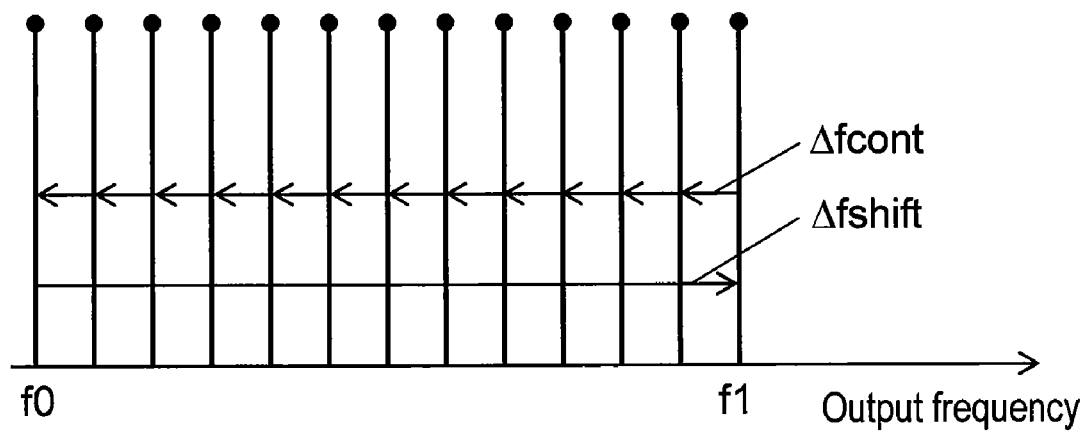
FIG. 10B is a graph showing a transition state of a frequency when frequency adjustment is carried out in a circuit configuration of the reception device in accordance with the first exemplary embodiment.

FIGS. 10A and 10B are graphs showing frequency adjustment in a reception device. That is to say, FIGS. 10A and 10B show a transition state of frequency when a frequency fluctuates by $\Delta fshift$ from f0 to f1 at a certain moment.

FIG. 10A is a graph showing a transition state of a frequency when frequency adjustment is carried out in a circuit configuration of a general reception device. In FIG. 10A, the control section returns a frequency to f0 at a time simultaneously with the start of adjustment. When $\Delta fshift$ is assumed to be 1500 Hz, since frequency adjustment unit $\Delta fcont$ is 1500 Hz, deviation in frame synchronization occurs, and images are hardly output.

FIG. 10B is a graph showing a transition state of a frequency when frequency adjustment is carried out in a circuit configuration in accordance with the first exemplary embodiment. In FIG. 10B, the control section returns a frequency to f0 in twelve times. When $\Delta fshift$ is assumed to be 1500 Hz, since the amount of frequency adjustment is divided into twelve times, frequency adjustment unit $\Delta fcont$ is 125 Hz and television viewing is possible.

Note here that a quartz resonator has better temperature characteristics than a silicon resonator by one digit or more. Therefore, when the quartz resonator is used, when the temperature change is about 0.1° C./sec, the frequency fluctuation is 130 Hz or less that is a practically permissible level. Therefore, in FIG. 10B showing the first exemplary embodiment, a remarkable effect can be obtained particularly when a resonator such as a silicon resonator having bad frequency-temperature characteristics is used. In this example, since frequency adjustment is carried out twelve times per second, each frequency adjustment is carried out in 83 msec or less.

Secondly, electronic devices for mobile use, for example, television for portable telephones, notebook-sized personal computers, mobile televisions, and the like, are assumed. When a user enters a room from the outside or when a user viewing television in an automobile goes out of the automobile or opens the door, an ambient temperature of the portable telephone is expected to be largely changed by, for example, 1 to 2° C./sec. In this case, the frequency fluctuation is about 30 to 60 ppm/sec. The frequency fluctuation corresponds to 15000 to 30000 Hz/sec when the local frequency is assumed to be 500 MHz. Similarly, reception in mode 3 in one-segment broadcasting is assumed, it is necessary to divide frequency adjustment in 116 to 232 times per second. Thus, each adjustment is carried out in about 8.6 to 4.3 msec.

Thus, even when a frequency rapidly shifts due to a rapid temperature change, it is preferable that the frequency is returned to a predetermined frequency and allowed to reach a predetermined frequency not at a time but at a plurality of times by considering permissible Δfcont. Although it takes a long time to allow the frequency to reach a predetermined frequency because adjustment time is limited, for example, the minimum adjustment time is limited to 10 msec, it is preferable that the frequency is returned to the predetermined frequency in a plurality of times by considering Δfcont. This is because less influence may be given to the reception performance. Furthermore, the degree of the temperature changes by the surrounding environments as mentioned above is also changed by thermal capacity. In particular, in small electronic devices such as portable telephones, the first exemplary embodiment exhibits a more remarkable effect because a temperature changes according to the environmental temperature more sensitively because they have a small temperature capacity. Also in indoor electronic devices, it is expected that such a temperature change may occur, for example, immediately after power supply of such devices is turned on, or an air conditioner in the room is turned on.

Thirdly, an environment in which a temperature changes more rapidly is assumed. Examples of such environments include a case in which a user moves to the outside from the inside of the automobile or the inside of the room, and vice versa, in a cold region, and furthermore, a case in which power supply of an electronic device is turned on, and the like. In such cases, it is necessary to increase the adjustment time by extremely reducing an adjustment time interval. In some cases, however, the limitation of systems may make it difficult. That is to say, examples of the case include a case in which a frequency fluctuation amount (or frequency to be changed) in minimum adjustment time of possible frequency is larger than predetermined value F of frequency adjustment unit Δfcont. The condition of the frequency fluctuation at this time is defined as being out of the permissible range.

An example of the case includes a case in which when frequency adjustment unit Δfcont is 160 Hz and the minimum adjustment time that is possible in a system is 50 msec, 200 Hz of frequency fluctuation occurs in 49 msec. In this condition, a frequency is adjusted by sacrificing a predetermined period of reception time. That is to say, in a predetermined period of time, noises entering an image or disturbance on an image are permitted or in an extreme case, reception itself is stopped.

Figure 11:
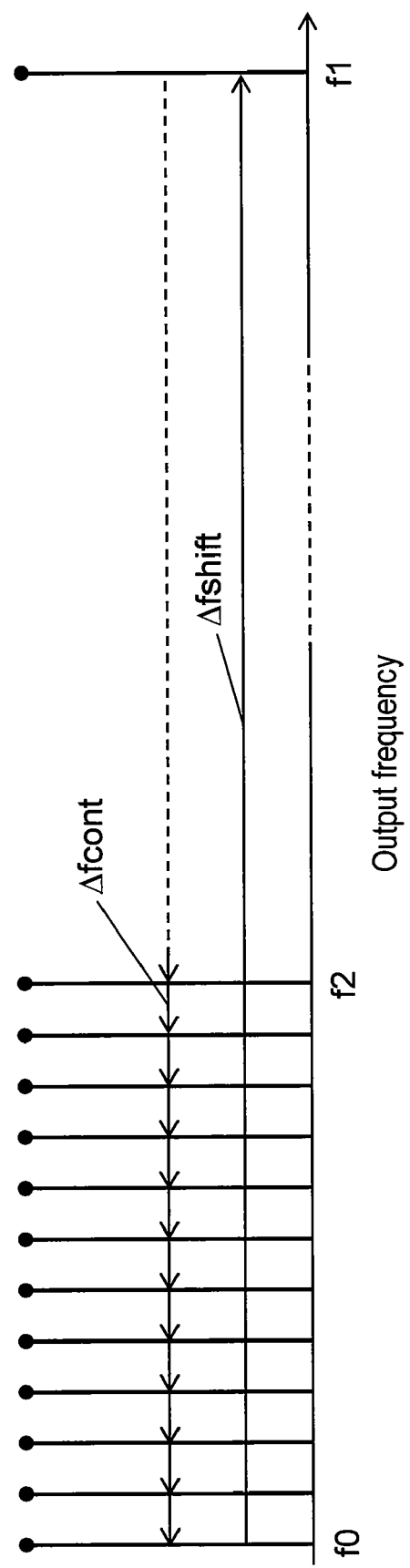
FIG. 11 is a graph showing a transition state of a frequency when another frequency adjustment is carried out in a circuit configuration of the reception device in accordance with the first exemplary embodiment.

FIG. 11 is a graph showing a transition state of frequency when another frequency adjustment is carried out in a circuit configuration in the first exemplary embodiment. In FIG. 11, at a certain moment, reference oscillator 2 fluctuates by a temperature. As a result, the output frequency of the synthesizer is largely changed from f0 to f1. At the next adjustment timing, the control section adjusts the frequency from f1 to f2 at a time. During this period, television reception or demodulation is disabled. Thereafter, however, the control section returns the frequency based on predetermined Δfcont. Although television viewing is disabled during the time in which the control section returns the frequency from f1 to f2, television viewing is possible in most of the time. In general, this period of time is such a short period as 1 sec or less, for example, 8.6 msec in the above-mentioned example. Except that such a temperature change occurs frequently, viewing at a level with no substantial problem is possible.

In the thirdly described example, it is necessary to make frequency adjustment unit Δfcont larger than predetermined value F for a predetermined period of time. Only in a predetermined period of time, the effect: "Δfcont is within predetermined value F" that is a feature of the present invention cannot be obtained. However, most of the reception time uses this feature of the present invention. This control method makes the most of the feature of the present invention by sacrificing only a small period of time.

It is more preferable that a period of time during which the control section returns a frequency from f1 to f2 is Δfcont that is defined by signal quality capable of establishing synchronization. For example, in the above-mentioned example, it is more preferable that Δfcont 160 Hz is satisfied. In this case, there is no time band during which image reception is disabled.

Thus, it is more preferable that the timing at which the control section largely adjusts a frequency from f1 to f2 is a period of time that does not have a problem in data reception, or a period of time that has a small problem. For example, in the ISDB-T system, a received signal includes a guard interval signal. This signal is originally provided for taking a multipath measure. This signal is introduced in order to avoid intersymbol interference due to multipath by considering a delayed wave. In many cases, this guard interval signal is, for example, a copy of part of signals in the effective symbol period. The guard interval signal is not data themselves. Therefore, even when the control section makes a frequency adjustment unit of the synthesizer section larger than predetermined value F during the reception time of the guard interval signal (hereinafter, which is referred to as a "guard interval period"), the reception quality is not largely influenced. The guard interval period is detected by BB-IC 21. The code-correlation output is detected, and by using the detected signal, the guard interval period can be obtained. In the thus detected guard interval period, the control section may adjust a frequency.

Furthermore, in DVB-H that is a system for foreign mobile televisions, a technique called time slicing is used. This is a system for receiving time-divided signal for the purpose of power saving. That is to say, a period of time for receiving a desired signal and a period of time without receiving a desired signal are present. In the period of time without receiving a desired signal, the control section may control so that the frequency adjustment unit of the synthesizer section is made to be larger than predetermined value F. This control can be applied to a time division system of a portable telephone, for example, TDMA (Time Division Multiple Access) and transmission/reception time switching TDD (Time Division Duplex), and the like.

The above description assumes an environment in which a rapid temperature change occurs. However, even in a case in which an adjustment interval cannot be shortened due to system restriction, the same effect can be obtained by the above-described first exemplary embodiment. Furthermore, the control method is more effective in a small-size electronic device having a small thermal capacity. Assuming that a temperature changes immediately after power supply is turned on, in the initial period of time during which television is less likely to be viewed at an moment after the power supply is turned on, the control section controls so that the frequency adjustment unit of the synthesizer section to be larger than predetermined value F and thereby shift the frequency largely. The initial period is preferably, for example, several tens msec to several hundreds msec. Furthermore, when channel switching is carried out, it is assumed that the initial frequency fluctuates although it is not frequency fluctuation due to temperatures. Also in this case, by carrying out the control of the present invention, the same effect can be obtained.

As mentioned above, a configuration in which a synthesizer includes a reference oscillator is described. However, a reference oscillation signal may be supplied from the outside of a synthesizer. Since a synthesizer of the first exemplary embodiment has a frequency correction function in which the phase noise is not deteriorated, even when a signal is supplied from the outside of the synthesizer, highly accurate signal supply is not particularly required. In this case, since the synthesizer is advantageous for reducing the size and cost because it does not include a reference oscillator inside thereof.

Furthermore, in the first exemplary embodiment, as a resonator, a MEMS resonator is described. However, the resonator is not necessarily limited to this. One of the features of the first exemplary embodiment is that a resonator can be selected without being affected by frequency-temperature characteristics. A resonator using a piezoelectric single crystal, a ceramic resonator, or the like, may be used.

In the above-mentioned first exemplary embodiment, an output of oscillator 5 is an output of synthesizer 1. However, a frequency divider is provided behind oscillator 5, and an output from the frequency divider may be an output from synthesizer 1. Thus, the oscillation frequency of oscillator 5 can be increased, and the size of oscillator 5 can be reduced.

In FIG. 1, second frequency divider 6 is controlled so that the frequency of oscillator 5 is made to be a substantially predetermined value. However, a configuration is not necessarily limited to this. The adjustment may be carried out such that reception performance can be obtained in the entire system. For example, a second frequency converter is further provided in the latter stage of frequency converter 18, and a frequency adjustment mechanism is provided in the circuit block in the front and back sides thereof. Then control is carried out such that the output from the second frequency converter is made to have a predetermined frequency.

Second Exemplary Embodiment

Next, an exemplary embodiment of a television reception device using a synthesizer of the present invention is described.

Figure 12:
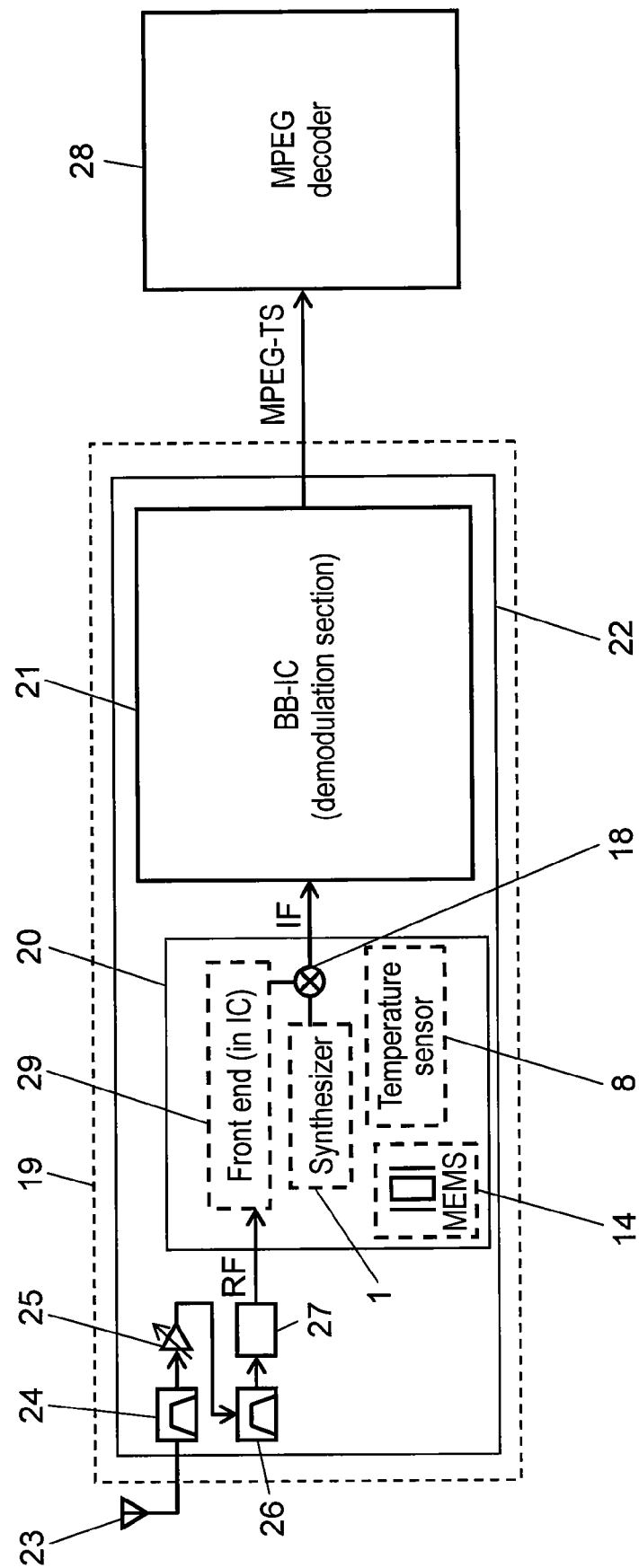
FIG. 12 is a block diagram showing a reception device in accordance with a second exemplary embodiment of the present invention.

FIG. 12 is a block diagram showing a reception device in accordance with a second exemplary embodiment of the present invention. In FIG. 12, synthesizer 1 of the present invention together with temperature sensor 8 are integrated into the same RF-IC 20, and packaged on base substrate 19. Furthermore, MEMS resonator 14 is used as a component element of a reference oscillator, and is packaged on base substrate 19. By using MEMS resonator 14 as the component element of the reference oscillator, the size of television reception device 22 can be reduced.

For example, a quartz resonator of the equal cost has a size of 2.5×2.0 mm while the MEMS resonator can be formed in a size of 0.5×0.5 mm to 0.3 mm×0.3 mm. Furthermore, the MEMS resonator can be formed at half height or lower. In a small-size television receiving module such as a module to be installed in a portable telephone, the size is 9×9 mm to 8×8 mm. Therefore, the size effect is extremely large.

On base substrate 19, first frequency filter 24 for receiving a received signal received by antenna 23, LNA (Low Noise Amplifier) 25 for receiving an output signal of first frequency filter 24, second frequency filter 26 for receiving an output signal of LNA 25, and balun 27 for receiving an output signal of second frequency filter 26 are packaged. Then, an output signal of balun 27 is input into RF-IC 20. The present invention describes an example in which a synthesizer section is formed in RF-IC. However, the synthesizer section may be formed at the BB-IC side.

In FIG. 12, MEMS resonator 14 is incorporated in RF-IC 20. In this way, since MEMS resonator 14 and temperature sensor 8 are integrated in the same IC chip (RF-IC 20), an actual temperature of the MEMS resonator can be sensed more accurately. Therefore, adjustment accuracy of an oscillation frequency of the MEMS oscillator can be improved. For example, even when a rapid temperature change occurs, a temperature can be sensed in a state in which temperature conductivity is hardly delayed. Reception deterioration by the temperature change does not occur. Furthermore, since the MEMS resonator is integrated into RF-IC 20, the MEMS itself has a size effect and in addition, space between neighboring components in packaging is not needed. In other words, space between components that is necessary when the components are separately packaged, for example, about 0.2 mm each of the four sides of MEMS resonator 14, can be eliminated. The effect of reducing the size is increased.

Furthermore, although not shown, when front end 29 in RF-IC 20 is optimized, a configuration excluding LNA 25, second frequency filter 26, balun 27, and the like, can be employed, and thus the size can be further reduced. In this case, it is expected that it is necessary to design to increase a gain of LNA provided in front end 29, and that heat generation is increased. Therefore, an effect of incorporating the MEMS resonator and the temperature sensor in the same IC is further expected.

Figure 13:
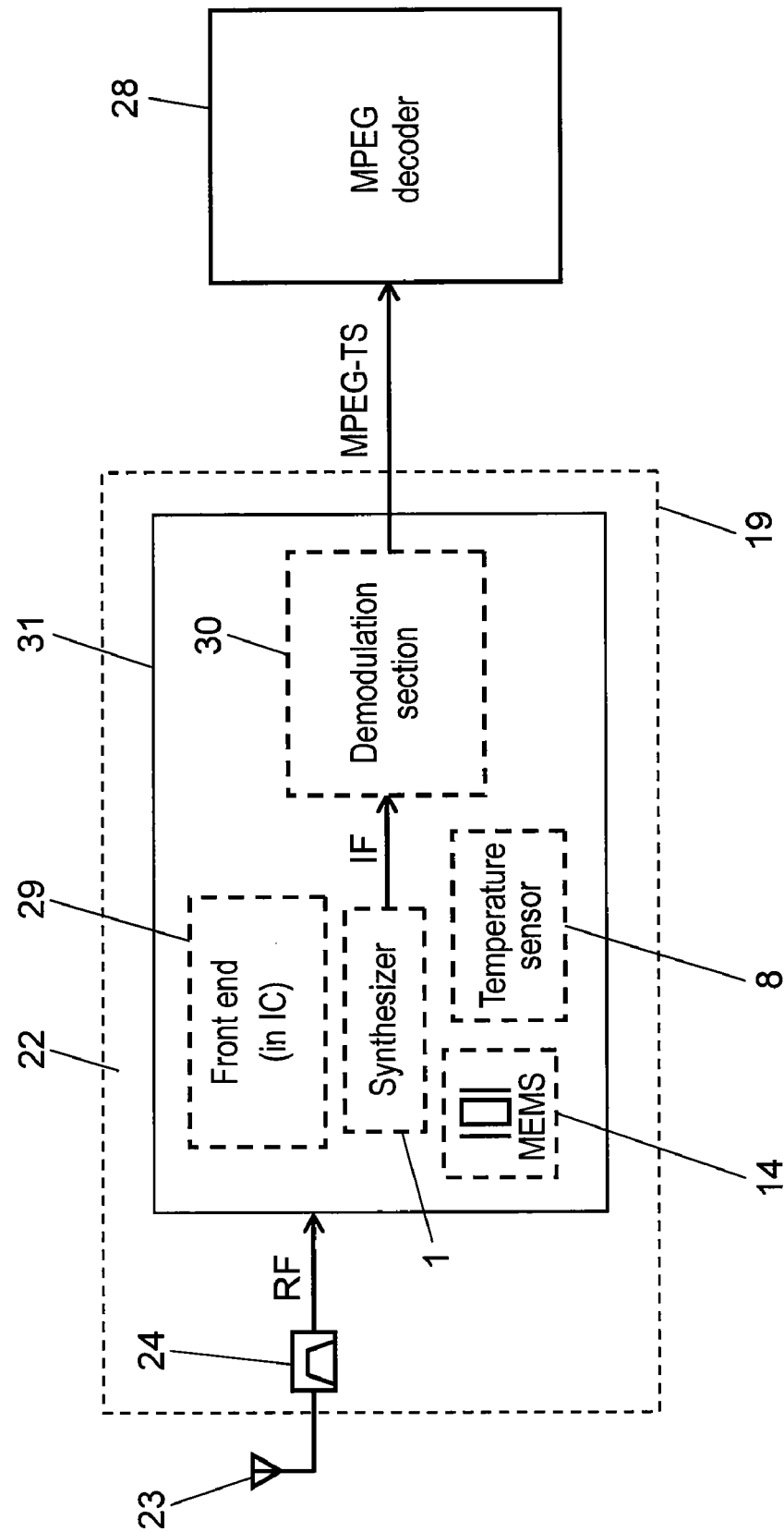
FIG. 13 is another block diagram showing a reception device in accordance with the second exemplary embodiment of the present invention.

FIG. 13 is another block diagram showing the reception device in accordance with the second exemplary embodiment of the present invention. In FIG. 13, RF-IC 20 and BB-IC 21 shown in FIG. 12 are formed as one unit, reception IC 31. BB-IC 21 is integrated into demodulation section 30. In reception IC 31 having functions of both RF-IC 20 and BB-IC 21, since almost all functions of the reception device are integrated into one IC, the size can be remarkably reduced and the production efficiency can be improved.

Furthermore, the number of components on base substrate 19 can be reduced. Therefore, the number of layers of base substrate 19 can be reduced, thus making reception device 22 thin. Furthermore, the decrease in the number of layers of base substrate 19 reduces the cost of base substrate 19. Furthermore, the decrease in the number of components reduces the production cost. As a whole, the costs of the reception device and the electronic device can be reduced.

With the configuration of the present invention in which temperature sensor 8 and MEMS resonator 14 are formed in one IC, functions can be integrated and an effect of reducing heat generation can be obtained remarkably.

Furthermore, in some reception devices for mobile use, electric power is controlled while quality of the reception state is observed. In some systems, an intense temperature change may occur. Furthermore, in systems such as DVB-H, since time slicing is carried out, a large temperature change always occurs. Also in this case, by employing the configuration of the present invention, the effect of the present invention can be obtained further remarkably.

In the above, a temperature-compensated synthesizer using a PLL (Phase Locked Loop) is described. However, a DLL (Delay Locked Loop) may be used. DDS (Direct Digital Synthesizer) that does not form a loop may be used.

Examples of the DDS may include a method of D/A (Digital/Analog)-converting signal information stored previously in a memory and generating signals in various frequencies. Furthermore, the same effect can be obtained by a configuration in which a frequency divider is directly connected behind reference oscillator 2 (see FIG. 1). In an example of such a configuration, a second frequency divider is disposed behind the reference oscillator, the second frequency divider is adjusted, and thus a frequency is adjusted. Furthermore, a configuration in which load impedance of a reference oscillator is adjusted may be employed. In such a configuration, a plurality of capacitors having a switching function are used as a load capacity of a reference oscillator, and the load capacity is changed discretely by changing switches, and thus a frequency is adjusted.

In the above, various types of temperature-compensated synthesizers are described. In a word, an effect of the present invention can be obtained remarkably in any configurations having a frequency adjustment mechanism, in which a frequency is switched digitally, phase discontinuity occurs, and the phase noise is deteriorated.

Examples of a temperature sensor described in the second exemplary embodiment include a commonly used semiconductor-based sensor using temperature characteristics of an electric current flowing in a semiconductor, a thermistor, and the like. However, the sensor is not necessarily limited to the above-mentioned examples. For example, two resonators having different temperature characteristics are prepared, and the frequency difference therebetween is sensed, and thereby a temperature can be indirectly sensed. Alternatively, the finite difference is sensed by comparison with or multiplication by a signal having other clocks or frequency information, and thereby a frequency shift may be sensed. Examples of the clocks include a received signal itself as a desired wave, a signal for GPS (Global Positioning System), a signal supplied from other circuit blocks in the case of an electronic device, and the like.

For example, a frequency error detection section is added to the output side of frequency converter 18, and a frequency difference between a reception frequency and a frequency of a local oscillation output is detected. Then, based on the detected results, the frequency of the local oscillation output may be adjusted. In a MEMS resonator, since frequency fluctuation due to temperatures is large, the difference may correspond to the frequency fluctuation of the MEMS oscillator. Examples of a mechanism of the frequency difference detection section include a frequency discriminator used in FM, a frequency counter formed in a digital circuit, or the like. Furthermore, a mechanism in which temperature information is extracted by detecting a frequency difference from known signals in the received signals may be employed. In a word, any mechanisms may be employed as long as they can extract a frequency difference between a received signal and a synthesizer output by detecting a frequency or a phase.

By providing such alternative mechanisms to a temperature sensor, an influence of delay in temperature conductivity by a physical position of a temperature sensor and a MEMS resonator and thermal capacity, or an influence of temperature detection accuracy by a temperature sensor can be reduced.

As mentioned above, a mechanism capable of directly or indirectly sensing temperature information may be employed. Furthermore, by considering the merit of integration into a semiconductor IC, it is more preferable that a temperature sensor is a semiconductor-based temperature sensor.

Third Exemplary Embodiment

Figure 14:
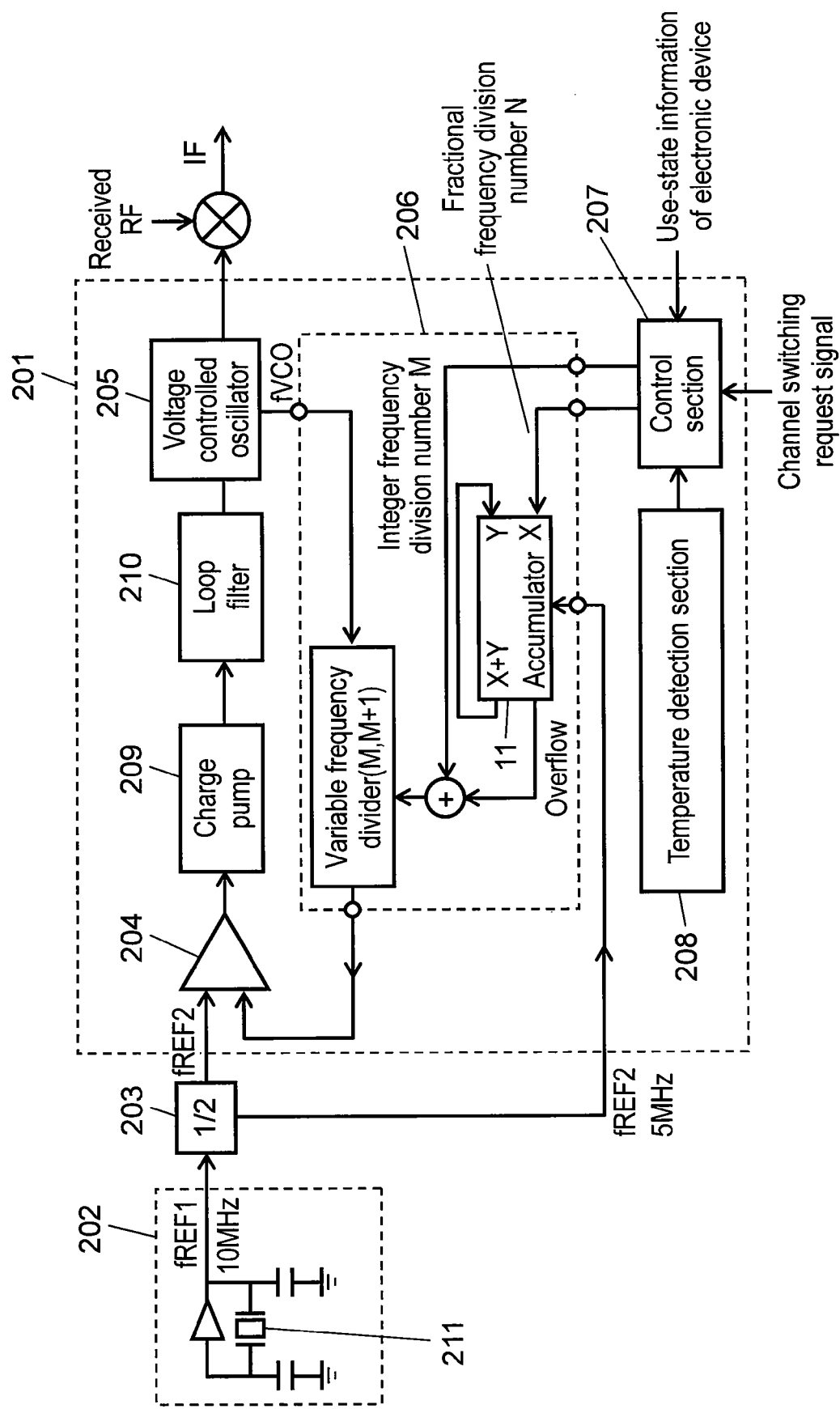
FIG. 14 is a block diagram showing a synthesizer in accordance with a third exemplary embodiment of the present invention.

FIG. 14 is a block diagram showing a synthesizer in accordance with a third exemplary embodiment of the present invention. In FIG. 14, synthesizer 201 of the third exemplary embodiment reduces problems when, for example, a use state of an electronic device is changed and a temperature change of synthesizer 201 becomes larger so that frequency is required to be controlled more largely. For example, at the moment when power supply of an electronic device is changed from the OFF state to the ON state, a temperature change of a reference oscillator becomes large momentarily. To a large temperature change, it is necessary to adjust a frequency by rapidly controlling a variable frequency divider. However, when frequency adjustment is carried out beyond predetermined value F, BER may be deteriorated. Furthermore, immediately after the use state of the electronic device is changed, a temperature difference may occur between a temperature sensor (or another temperature detecting mechanism) and the reference oscillator. In this case, when the frequency is adjusted based on the output value of the temperature sensor, substantial shift of frequency may occur, which may cause deterioration of BER.

Synthesizer 201 of the third exemplary embodiment has a configuration to suppress the shift of oscillation frequency of a synthesizer from a desired oscillation frequency when the use state of the electronic device is changed.

That is to say, in the synthesizer of the third exemplary embodiment, since a frequency division ratio of the frequency divider is preset with respect to the use state of the electronic device, immediately after the use state of the electronic device is changed, the frequency division ratio of the frequency divider can be changed without using temperature information from the temperature detection section. Thus, a synthesizer capable of obtaining a desirable oscillation frequency immediately after the use state of the electronic device is changed can be provided.

Furthermore, when the synthesizer of the third exemplary embodiment is used as a local oscillator, the frequency division ratio of a frequency divider is changed such that the shift between the frequency of a received signal and the frequency of a synthesizer falls within frequency shift ΔFopt that is a permissible shift of a reception device. This change of the frequency division ratio is carried out without using temperature information from a temperature detection section. Thus, it is possible to provide a reception device and an electronic device in which deterioration of reception performance is small even when the use state of the electronic device is changed.

In FIG. 14, synthesizer 201 includes first frequency divider 203 for receiving a reference oscillation signal (fREF1=10 MHz) output from MEMS oscillator 202, comparator 204 for receiving a signal (fREF2=5 MHz) that has been frequency-divided by first frequency divider 203, voltage controlled oscillator 205 for outputting an oscillation signal based on an output signal from comparator 204, second frequency divider 206 for receiving a part of the oscillation signals of voltage controlled oscillator 205, and control section 207 for controlling a frequency division ratio of second frequency divider 206 based on temperature data from temperature detection section 208. An output signal from second frequency divider 206 is input into comparator 204. Comparator 204 compares an input signal from second frequency divider 206 with an input signal from first frequency divider 203, and outputs a signal indicating the comparison result to voltage controlled oscillator 205.

The above-mentioned term "based on an output signal of comparator 204" means that an output result of comparator 204 is received at least indirectly or directly. Therefore, another circuit block is provided and voltage controlled oscillator 205 may receive the output from the other circuit block.

In the third exemplary embodiment, an output of comparator 204 is converted into an electric current component by charge pump 209. An output signal of charge pump 209 is input into loop filter 210. Loop filter 210 extracts only a near-DC component and supplies it to voltage controlled oscillator 205. Loop filter 210 includes a portion for charging an electric current (electric charge) from comparator 204 by a capacitor and a low-pass filter for allowing a low frequency to pass.

Control section 207 transmits appropriate control signals of integer frequency division number M and fractional frequency division number N to second frequency divider 206 based on an output signal from temperature detection section 208 for detecting a temperature. Thus, control section 207 changes a frequency division ratio of second frequency divider 206. That is to say, second frequency divider 206 includes an integer portion to which frequency division number M is input and a fraction portion to which frequency division number N is input. Furthermore, when an electronic device equipped with synthesizer 201 changes a received frequency channel, the electronic device transmits a channel switching signal to control section 207, and control section 207 that has received the channel switching signal changes a frequency division ratio of second frequency divider 206 based on the switched channel.

Note here that MEMS resonator 211 provided in MEMS oscillator 202 is made of, for example, silicon or compounds thereof as a main material. For example, in the temperature characteristic of a resonator made of silicon, a primary frequency-temperature coefficient is so large as about $-30$ ppm/° C. Therefore, as compared with the case in which, for example, an AT-cut quartz resonator is used, the above-mentioned temperature control is required to be carried out frequently. The frequency-temperature coefficient is represented by the mathematical formula Math. 1 shown in the first exemplary embodiment. Furthermore, a reception device (described later, see FIG. 15) equipped with synthesizer 201 includes synthesizer 201 and a signal processing section connected to the output side of synthesizer 201. For example, the signal processing section mixes a received signal received by an antenna (not shown) and an oscillation signal from synthesizer 201 with each other, frequency-converts the mixed signal, and then demodulates the signal.

An electronic device (not shown) equipped with synthesizer 201 includes the reception device, and a display section (not shown) connected to an output side of the signal processing section in the reception device.

Figure 15:
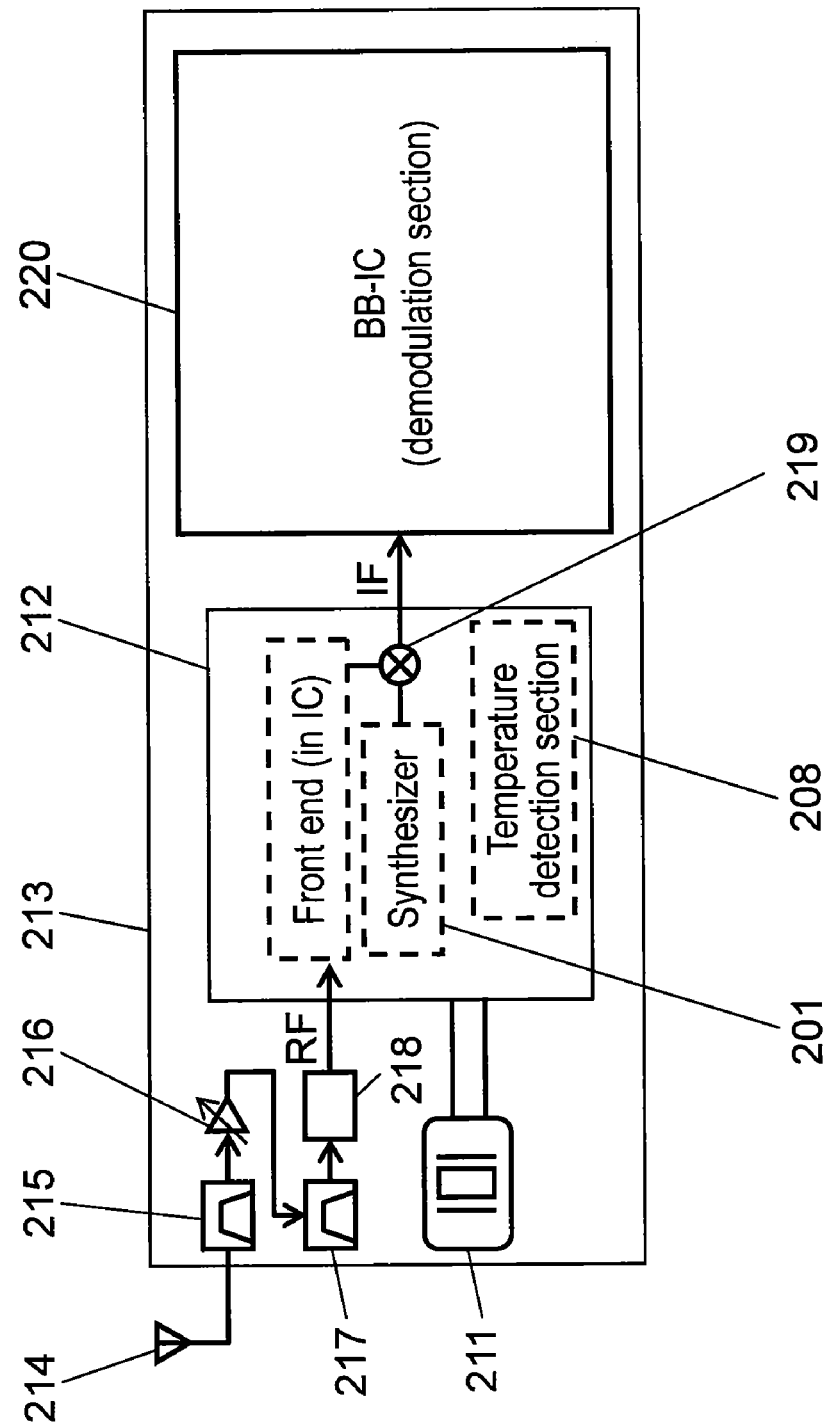
FIG. 15 is a block diagram showing a reception device using the synthesizer in accordance with the third exemplary embodiment of the present invention.

FIG. 15 is a block diagram showing a reception device using the synthesizer in accordance with the third exemplary embodiment of the present invention. In FIG. 15, synthesizer 201 together with temperature detection section 208 are integrated into semiconductor IC 212, and packaged on base substrate 213. Furthermore, MEMS resonator 211 is used as a component element of a reference oscillator, and is packaged on base substrate 213. By using MEMS resonator 211, the size of the reception device can be reduced. For example, a quartz resonator has a size of 2.5×2.0 mm, while a resonator using MEMS resonator 211 can be formed in a size of 1.0×1.0 mm to 0.3 mm×0.3 mm. Furthermore, the height of the resonator using MEMS resonator 211 can be made to be half or lower. This is because when, for example, MEMS resonator 211 is made of silicon, it can be formed by semiconductor processes such as RIE (Reactive Ion Etching) and photolithography. Furthermore, the size of the above-mentioned MEMS resonator is a typical example, and can be formed in a smaller size as compared with the conventional case of using a piezoelectric single crystal such as quartz. Furthermore, a small television reception device to be installed in a portable telephone has a small size, for example, 9×9 mm to 8×8 mm, the above-mentioned size effect is extremely large.

On base substrate 213, first filter 215 for receiving a received signal received by antenna 214, LNA (Low Noise Amplifier) 216 for receiving an output signal from first filter 215, second frequency filter 217 for receiving an output signal from LNA 216, and balun 218 for receiving an output signal from second filter 217 are packaged. Then, an output signal of balun 218 is input into semiconductor IC 212.

Herein, a temperature difference may occur between temperature detection section 208 and MEMS resonator 211 depending upon the position relation therebetween. The cause of the temperature difference includes, in addition to the position relation, the difference in the thermal conductivity among MEMS resonator 211, semiconductor IC 212, base substrate 213, and the like. This is because the temperature difference may occur due to the speed at which heat is conducted. Furthermore, the temperature difference tends to be particularly large when a rapid temperature change occurs. In this case, a temperature detected by temperature detection section 208 and an actual temperature of MEMS resonator 211 are different from each other, and a frequency is corrected to a wrong frequency value in temperature correction. Thus, the oscillation frequency of synthesizer 201 may shift from a desired value, that is, a frequency of the received signal, thereby causing reception deterioration. In particular, for a synthesizer using a MEMS resonator having bad frequency-temperature characteristics, that is, having large frequency-temperature coefficient, a frequency correction error due to the temperature difference is large and the reception characteristics may be deteriorated remarkably.

When an ambient temperature of MEMS resonator 211 rapidly changes at the moment when a use state of an electronic device is changed, synthesizer 201 provided in the reception device of the third exemplary embodiment previously stores frequency division ratio data corresponding to the use state. When the electronic device is in such a use state, control section 207 changes the frequency division ratio of second frequency divider 206 referring to the frequency division ratio data corresponding to the use state. That is to say, synthesizer 201 provided in the reception device of the third exemplary embodiment changes the frequency division ratio of second frequency divider 206 without referring to temperature data obtained from temperature detection section 208 at the moment when the use state of the electronic device is changed. Thus, it is possible to suppress the shift of the oscillation frequency of synthesizer 201, which is caused by the temperature difference between MEMS resonator 211 and temperature detection section 208. This can be achieved because arrangement of components and types of members are naturally the same (thermal conductivity is the same) and an electric current value that is an element for generating heat can be uniformly determined by defining the use state in electronic devices in mass production.

An example of use states of a portable telephone is shown in Table 1. The portable telephone is an example of the electronic device having the reception device in accordance with the third exemplary embodiment of the present invention.

TABLE 1

| Case | Use state before change | Use state after change |
| --- | --- | --- |
| 1 | Portable telephone is turned off | Portable telephone is turned on |
| 2 | Standby state | Conversation state |

TABLE 1-continued

| Case | Use state before change | Use state after change |
|---|---|---|
| 3 | Standby state | Television reception function is on |
| 4 | Conversation state | Standby state |
| 5 | Television reception function is on | Standby state |
| 6 | Portable telephone is turned off | Portable telephone is turned on + Television reception function is on |
| ... | ... | ... |

In Table 1, in a use state of case 1, power supply of a portable telephone is changed from the OFF state to the ON state. In case 1, since an electric current starts to flow in each IC in the portable telephone simultaneously, an ambient temperature of the reception device of the third exemplary embodiment is assumed to rise rapidly. In a use state of case 2, the portable telephone is changed from the standby state to the conversation state.

In case 2 in Table 1, a large electric current starts to flow rapidly in a power amplifier that is one of the circuits at the transmitting side of a RF circuit, and therefore an ambient temperature of the reception device is assumed to rise rapidly.

In Table 1, in a use state of case 3, a television reception function is turned on from the standby state in the portable telephone. In case 3, an electric current starts to flow in the RF circuit necessary for the reception of a television signal and in baseband circuits, and the like, simultaneously, and an ambient temperature of the reception device is assumed to rise rapidly.

In Table 1, in a use state of case 4, a portable telephone is changed from the conversation state to the standby state; in a use state of case 5, the portable telephone is changed from a state in which a television reception function is turned on to the standby state. In both cases, since a relatively large electric current that has been flowing in the necessary components in the portable telephone stops flowing rapidly, an ambient temperature of the reception device is assumed to decrease rapidly.

In Table 1, in a use state of case 6, the portable telephone is changed from a state in which power supply is turned off to a state in which power supply and the television reception function of the portable telephone are turned on. In case 6, from the state in which the power supply of the portable telephone is OFF state, an electric current starts to flow into each IC and the like of the portable telephone, and an ambient temperature of the reception device is assumed to rise rapidly.

In the above-mentioned cases 1 to 6, since an ambient temperature of the reception device is rapidly changed by the change of the use state, a temperature difference may occur between MEMS resonator 211 and temperature detection section 208 that are different in physical positions inside the reception device.

Figure 16:
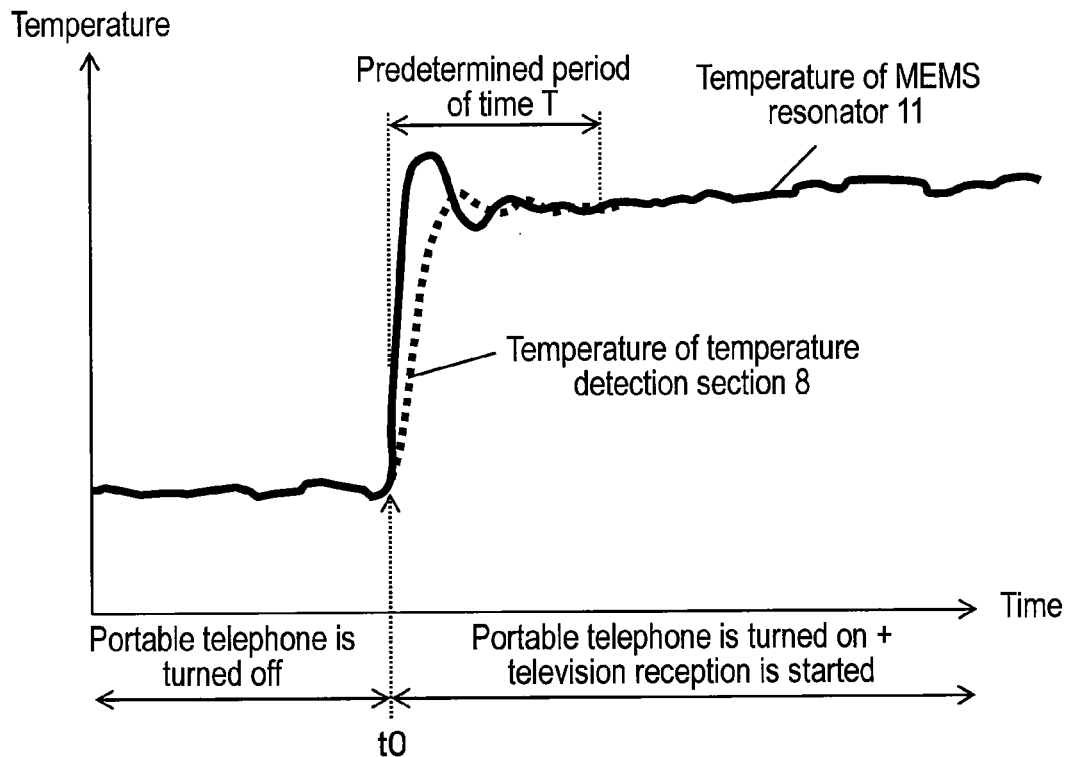
FIG. 16 is a graph showing a temperature change of a MEMS resonator and a temperature detection section in the reception device in accordance with the third exemplary embodiment of the present invention.

FIG. 16 is a graph showing temperature changes of a MEMS resonator and a temperature detection section in a reception device in accordance with the third exemplary embodiment of the present invention. FIG. 16 shows the temperature changes of MEMS resonator 211 and temperature detection section 208 in case 6 in Table 1. This shows a case in which MEMS resonator 211 is disposed nearer to a device as a heat source than temperature detection section 208 is, or a case in which MEMS resonator 211 follows to the environmental temperature better than temperature detection section 208 by the relation of heat capacity (temperature tends to be changed according to the ambient temperature).

In FIG. 16, the abscissa shows time, and the ordinate shows temperatures of MEMS resonator 211 and temperature detection section 208, respectively. The use state of a portable telephone changes as shown in case 6 in Table 1 at the moment of time t0. Thus, an ambient temperature of the reception device of the third exemplary embodiment rapidly rises. As a result, temperatures of MEMS resonator 211 and detection section 208 themselves start to rise. However, MEMS resonator 211 and temperature detection section 208 have different temperature profiles with respect to time because of the above-mentioned position relation and heat capacity. FIG. 16 shows that the temperature of MEMS resonator 211 rises more rapidly than the temperature of temperature detection section 208 does. Furthermore, temperatures of MEMS resonator 211 and temperature detection section 208 are largely different from each other during predetermined period of time. Consequently, when the frequency division ratio of second frequency divider 206 is adjusted based on the temperature data of temperature detection section 208, a desired oscillation frequency cannot be obtained. In order to prevent such a state, synthesizer 201 provided in the reception device of the third exemplary embodiment has a database of the use state of the electronic device and values of the frequency division ratios of the second frequency divider corresponding to the use state. One example of the database is shown in Table 2.

TABLE 2

| Case | Frequency division ratio of second frequency divider |
|---|---|
| 1 | N1 |
| 2 | N2 |
| 3 | N3 |
| 4 | N4 |
| 5 | N5 |
| ... | ... |

The "case" in the left column in Table 2 represents the change of the use state in Table 1.

The databases shown in Tables 1 and 2 may be recorded in, for example, a memory section provided in control section 207. In a word, the databases in Tables 1 and 2 may be recorded in a memory section which control section 207 can access.

At the moment when the use state of the electronic device changes, control section 207 obtains information about the use state from the electronic device, and searches a case that coincides with the change of the use state based on the use states before and after change for the database recorded in the memory section. Then, control section 207 obtains the frequency division ratio data of second frequency divider 206 corresponding to the coinciding case, and changes the frequency division ratio of second frequency divider 206. Thus, at the moment when the use state of an electronic device changes, the frequency division ratio of second frequency divider 206 can be changed to an optimum value without using temperature data of temperature detection section 208. Consequently, it is possible to reduce the difference in the oscillation frequency caused by the temperature difference between temperature detection section 208 and MEMS resonator 211.

Herein, when the maximum temperatures that are assumed in cases 1 to 6 in Table 1 are represented by T1 to T6, respectively, it is clear that the relation: T1, T2, T3, T6>T4, T5 is satisfied. In the MEMS resonator made of silicon having a primary frequency-temperature coefficient of −30 ppm/° C., since the temperature coefficient is minus, when the temperature is large, the resonance frequency of the MEMS resonator becomes low. Therefore, it is necessary to set the frequency division number of second frequency divider 6 to be large, the relation: N1, N2, N3, N6>N4, N5 is satisfied.

Furthermore, also in cases 1, 3, and 6 in the third exemplary embodiment, the temperature in each case has the relation: T1<T3<T6. Therefore, for the frequency division number of second frequency divider 6, the relation: N1<N3<N6 is satisfied.

In FIG. 16, predetermined period of time T is determined so that temperature difference ΔTemp between MEMS resonator 211 and temperature detection section 208 falls within predetermined temperature difference ΔTopt. Herein, it is preferable that predetermined temperature difference ΔTopt is set to a level at which a reception system is not influenced by ΔTemp. In other words, the resonance frequency of MEMS resonator 211 (the oscillation frequency of MEMS oscillator 202) fluctuates by ΔTemp. By the fluctuation, the frequency of the local oscillation output of synthesizer 201 fluctuates from the frequency value that is the same as that of the original received signal, and thereby frequency difference ΔF may occur with respect to the frequency of a reference signal. It is preferable that predetermined temperature difference ΔTopt is set so that a reception state is not deteriorated by frequency difference ΔF.

Herein, examples of problems of deterioration of the reception state include, for television receiving, noises occur in an image; synchronization of data cannot be established, so that reception itself cannot be achieved; and the like. Furthermore, frequency difference ΔFopt corresponding to ΔTopt (ΔF when ΔTemp=ΔTopt is satisfied) is a value depending upon the configuration of the reception system (a configuration of a "signal processing section" in claims).

By making the frequency difference ΔF within the range: ΔF≦ΔFopt, predetermined reception performance can be maintained. In the third exemplary embodiment, it is more preferable that the frequency division ratio of the second frequency divider is adjusted (for example, Table 2) so as to satisfy the above-mentioned condition in various reception states of cases (for example, Table 1).

Note here that in the configuration example of Japanese domestic television system, ISDB-T, ΔFopt can be made to be, for example, ±25 kHz. When the carrier frequency is 770 MHz, ±25 kHz corresponds to a frequency change of ±32.5 ppm. Herein, for a MEMS resonator made of silicon, since the primary frequency-temperature coefficient is −30 ppm/° C., the fluctuation of ±32.5 ppm corresponds to the temperature fluctuation of about ±1.1° C. The ΔTopt may be set to the value in this range. When ΔTopt is defined as an absolute value, it can be used without considering the signs.

Herein, ΔFopt is set to ±25 kHz, but ΔFopt is not necessarily limited to this value. The value is determined when the system is designed. This value may be determined according to individual systems.

Furthermore, Table 1 shows an example of the use states. Therefore, even when the synthesizer provided in the reception device of the third exemplary embodiment is applied to the other changes of use state, the same effect can be obtained. Furthermore, Table 1 describes specific use states of an electronic device. Actually, however, the use states may be managed by numbers that have been assigned to each use state.

For example, a state in which power supply of a portable telephone is turned OFF is managed by the number "1" and a state in which power supply of a portable telephone is turned ON is managed by the number "2." Also when the use state of an electronic device is notified from the electronic device to control section 207, such numbers may be used.

Figure 17:
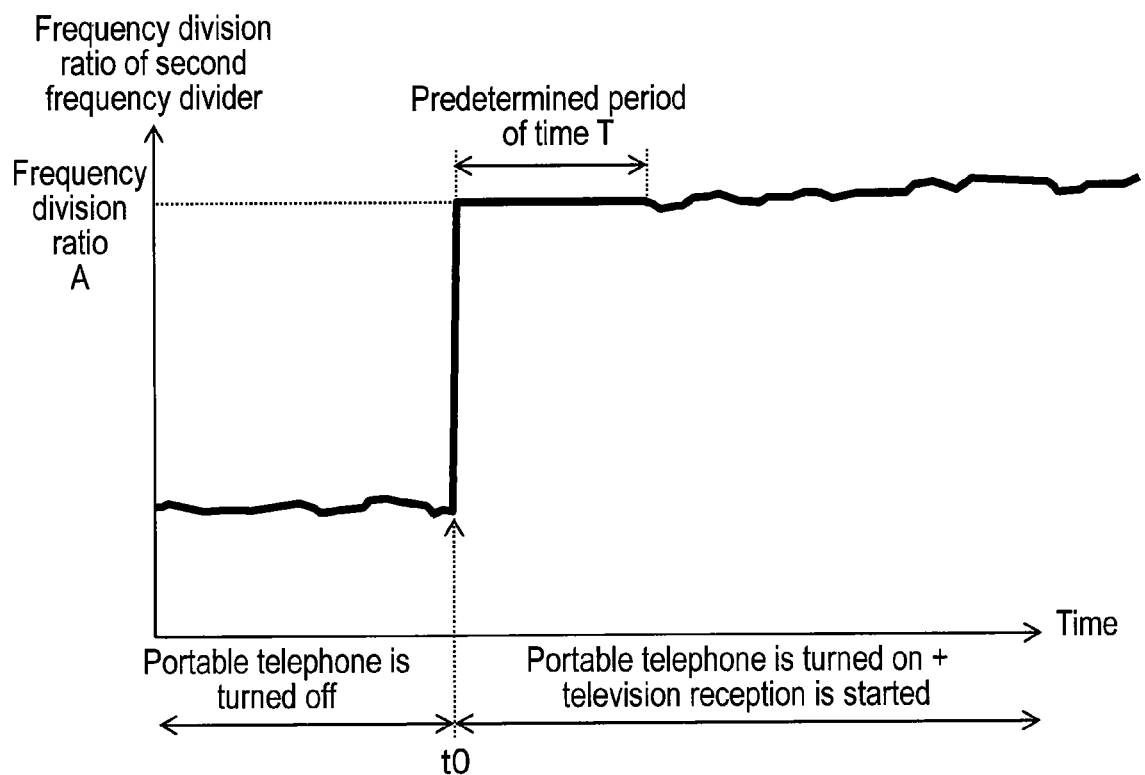
FIG. 17 is a graph showing a change over time of a frequency division ratio of a second frequency divider of the synthesizer provided in the reception device in accordance with the third exemplary embodiment of the present invention.

FIG. 17 is a graph showing a change over time of a frequency division ratio of a second frequency divider of the synthesizer provided in the reception device in accordance with the third exemplary embodiment of the present invention. In FIG. 17, the abscissa shows time, and the ordinate shows the frequency division ratio of second frequency divider 206. FIG. 17 shows an example in which until time t0, power supply of a portable telephone is off, and at the moment of time t0, the portable telephone is changed to a state in which the power supply is turned on and the television reception function is turned on. At the moment of time t0, the use state of the portable telephone is changed, and accordingly, the frequency division ratio of second frequency divider 206 is momentarily changed to frequency division ratio A. Thus, the oscillation frequency difference of synthesizer 201 caused by the temperature difference between temperature detection section 208 and MEMS resonator 211 can be suppressed.

At the moment of time t0, control section 207 changes the frequency division ratio of second frequency divider 206 to the preset frequency division ratio A. Thereafter, control section 207 changes the frequency division ratio of second frequency divider 206 based on the temperature data obtained from temperature detection section 208. This is implemented at time t0 or later and after the lapse of a predetermined period of time (predetermined period of time T in FIG. 17) when the temperature of temperature detection section 208 and the temperature of MEMS resonator 211 are not substantially different from each other. Thus, the accuracy of the oscillation frequency of synthesizer 201 is improved after the lapse of a predetermined period of time T after the use state of the electronic device is changed.

Note here that the demodulation operation of a television signal may be started during the lapse of the predetermined period of time T. This is because synthesizer 201 provided in the reception device of the third exemplary embodiment can output highly accurate oscillation frequency even immediately after the use state of the portable telephone changes. Furthermore, when it is not necessary to shorten the period of time until the start of the demodulation operation of television signals, the demodulation operation of television signals may be started after the lapse of a predetermined period of time T.

After the lapse of the predetermined period of time T from time t0, and in the period of time during which control section 207 changes the frequency division ratio of second frequency divider 206 based on the temperature information obtained from temperature detection section 208, the selected frequency division ratio data of second frequency divider 206 are recorded. Then, with reference to the recorded data, the frequency division ratio of second frequency divider 206 to be used next time when the use state is changed from the standby state to the conversation state may be corrected. Actually, the values of the frequency division ratio of second frequency divider 206, which correspond to the use states of the electronic device, is preset and recorded in the memory section, and the like. In the actual use of the electronic device, however, it is assumed that the preset value of the frequency division ratio may be shifted from the ideal value of the frequency division ratio. In such a case, when a synthesizer is allowed to have the above-mentioned configuration, the frequency division ratio of second frequency divider 206 can be corrected to the ideal value later. As a result, synthesizer 201 provided in the reception device of the third exemplary embodiment can achieve highly accurate oscillation frequency in the actual use state.

Examples the method of correcting the frequency division ratio include calculating an average value of a plurality of frequency division ratio data recorded during a period of time after the lapse of period of time T from the time when the use state of the portable telephone changes from the standby state to the conversation state. Control section 207 uses this average value as a frequency division ratio when the standby state is changed to conversation state next time. As the frequency division ratio data used for calculating the average value, only frequency division ratio data during a predetermined period of time after the lapse of predetermined period of time T may be used. This is because the use of frequency division ratio data immediately after the use state is changed and a predetermined period of time T has passed has the highest reliability in correcting the frequency division ratio data. Furthermore, by limiting the number of data to be used for correcting the frequency division ratio within that of the predetermined period of time, it is possible to reduce the number of data required to be recorded. Thus, the size of the memory section can be reduced.

Figure 18:
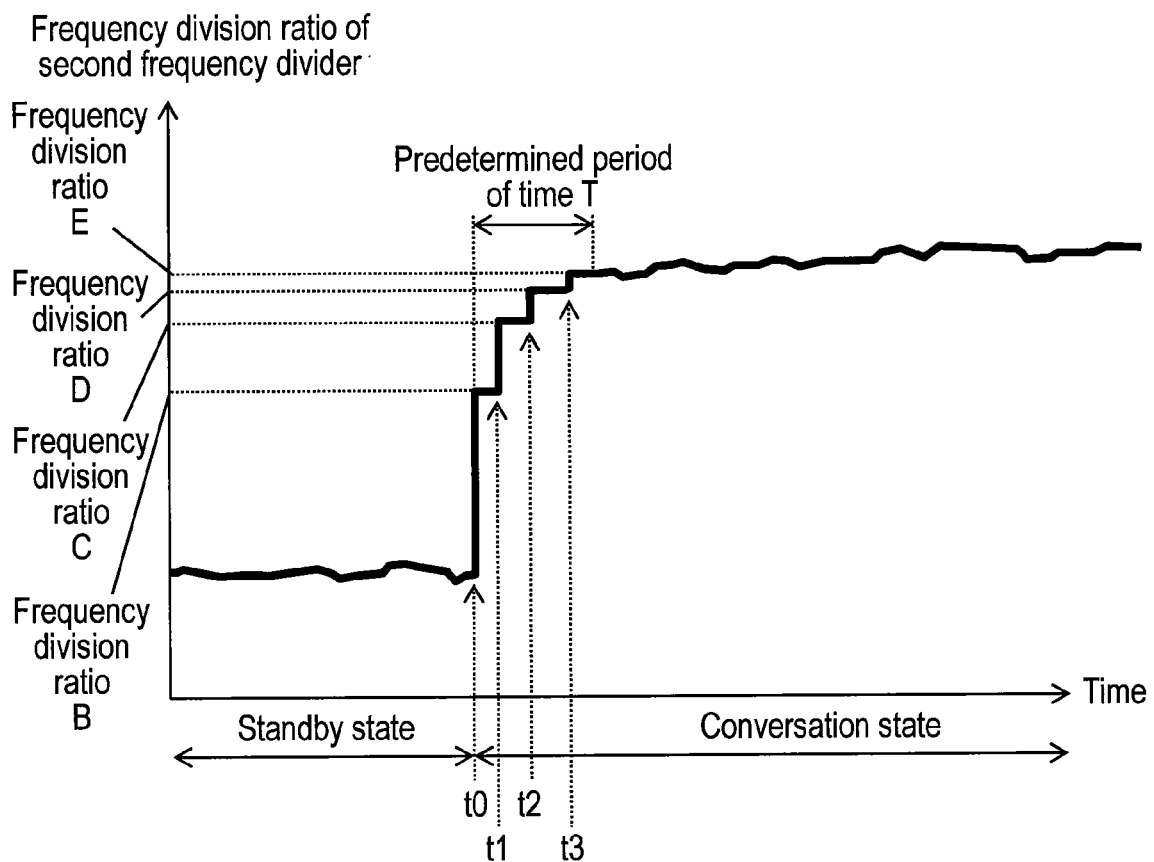
FIG. 18 is a graph showing a change over time of a frequency division ratio of a second frequency divider of another synthesizer provided in the reception device in accordance with the third exemplary embodiment of the present invention.

FIG. 18 is a graph showing a change over time of a frequency division ratio of a second frequency divider of another synthesizer provided in the reception device in accordance with the third exemplary embodiment of the present invention. In FIG. 18, the abscissa shows time, and the ordinate shows the frequency division ratio of second frequency divider 206. FIG. 18 shows an example in which until time t0, a portable telephone is in a standby state, and at the moment of time t0, the portable telephone is changed to a conversation state. At the moment of time t0, the use state of the portable telephone is changed, and accordingly, the frequency division ratio of second frequency divider 206 is momentarily changed to frequency division ratio B. Next, at the moment of time t1, the frequency division ratio of second frequency divider 206 is momentarily changed to frequency division ratio C. Next, at the moment of time t2, the frequency division ratio of second frequency divider 206 is momentarily changed to frequency division ratio D. Next, at the moment of time t3, the frequency division ratio of second frequency divider 206 is momentarily changed to frequency division ratio D.

When the temperature change of MEMS resonator 211 in a predetermined period of time T during which a temperature difference occurs between temperature detection section 208 and MEMS resonator 211 is more moderate as compared with that in FIG. 17, the values of the frequency division ratio may be changed in a step-like manner as shown in FIG. 18. With such a configuration, the accuracy of the oscillation frequency in synthesizer 201 can be improved.

An example of a specific method of achieving the above-mentioned configuration includes a method of previously recording the frequency division ratio data of second frequency divider 206 corresponding to the use state of the electronic device and timing data of the change of the frequency division ratio in a memory section. Table 3 shows an example of the database.

TABLE 3

| Case | Timing at which frequency division ratio is changed (time from a moment at which a use state is changed) | Frequency division ratio of second frequency divider |
|---|---|---|
| 1 | t1 | N1 |
|  | t2 | N2 |
|  | t3 | N3 |
|  | t4 | N4 |
|  | t5 | N5 |

TABLE 3-continued

| Case | Timing at which frequency division ratio is changed (time from a moment at which a use state is changed) | Frequency division ratio of second frequency divider |
|---|---|---|
| 2 | t1 | N6 |
|  | t2 | N7 |
|  | t3 | N8 |
|  | t4 | N9 |
| 3 | t1 | N10 |
| ... | ... | ... |

The "case" in the left column in Table 3 represents the change of the use state in Table 1. The database of Table 3 is recorded in a memory section which control section 207 can access.

Control section 207 changes the frequency division ratio of second frequency divider 206 at an optimal timing with reference to the timing data of the change of the frequency division ratio in Table 3. Thus, it is possible to achieve a synthesizer with highly accurate oscillation frequency.

Note here that the value of the frequency division ratio of second frequency divider 206, which has been previously determined with respect to the use state of the electronic device, may be corrected based on temperature information of temperature detection section 208. Specifically, this means that the value of the frequency division ratio of second frequency divider 206 that has been previously determined with respect to the use state of the electronic device is corrected based on the temperature data obtained from temperature sensor 8 immediately before time t0 (time when the use state of the electronic device changes) in FIG. 17 or FIG. 18. This is because it is expected that the temperature change profile of MEMS resonator 211 after the use state of the electronic device changes is different depending upon the temperatures of MEMS resonator 211 before the use state changes. Therefore, when the preset value of the frequency division ratio of second frequency divider 206 is corrected based on the temperature data obtained from temperature sensor 8 immediately before the use state of the electronic device changes, it is possible to achieve a synthesizer with highly accurate oscillation frequency.

Specific examples of a correction method include a method using a correction expression (approximate expression) derived by considering a thermal resistance of each component in the electronic device, and the like.

Furthermore, another method of using temperature data immediately before the use state of the electronic device changes includes a method of previously recording frequency division ratio data with respect to each temperature in a memory section as shown in Table 4.

TABLE 4

| Case | Temperature immediately before a use state of electronic device is changed (° C.) | Frequency division ratio of second frequency divider |
|---|---|---|
| 1 | 10 | N1 |
|  | 11 | N2 |
|  | ... | ... |
|  | 49 | N40 |
|  | 50 | N41 |
| 2 | 11 | N42 |
| ... | ... | ... |

The "case" in the left column in Table 4 represents the change of the use state in Table 1.

The database of Table 4 is recorded in a memory section which control section 207 can access. Control section 207 receives a signal corresponding to the state change from the electronic device, and then reads the frequency division ratio data of second frequency divider 206 from the database in Table 4 based on the temperature data immediately before the signal indicating the state change is received. Based on the read data, control section 207 changes the frequency division ratio of second frequency divider 206. Thus, it is possible to achieve a synthesizer with highly accurate oscillation frequency.

Note here that synthesizer 201 provided in the reception device of the third exemplary embodiment may store the databases shown in, for example, Tables 2 to 4 with respect to each oscillation frequency to be output. Thus, it is possible to achieve a synthesizer with high accuracy with respect to a plurality of oscillation frequencies.

In the reception device described above in the third exemplary embodiment of the present invention, an output of voltage controlled oscillator 205 is an output of synthesizer 201. However, a frequency divider is provided behind voltage controlled oscillator 205, and an output of the frequency divider may be an output from synthesizer 201. Thus, the oscillation frequency of voltage controlled oscillator 205 can be made to be high and thus the size of voltage controlled oscillator 205 can be reduced.

Furthermore, examples of temperature detection section 208 include a semiconductor transistor-based detection section using a temperature characteristic of an electric current flowing in a semiconductor, a detection section called a thermistor using a characteristic that a resistance value changes according to temperatures, a detection section using a thermocouple using a thermo-electromotive force, and the like.

The configuration of the reception device in the third exemplary embodiment of the present invention exhibits a particularly large effect on resonators with bad frequency-temperature characteristics. This is because the worse the frequency-temperature characteristics are, the larger the oscillation frequency difference of a synthesizer by an actual temperature difference between MEMS resonator 211 and temperature detection section 208 in FIG. 15 is.

Since the frequency-temperature characteristics are represented by mathematical formula Math. 1, in the reception device in the third exemplary embodiment, a configuration using a MEMS resonator exhibits a particularly larger effect than a configuration using a more common quartz resonator.

Furthermore, the third exemplary embodiment describes a silicon resonator using semiconductor material as a base material as an example of the MEMS resonator. However, another example of the MEMS resonator includes a resonator using a polysilicon resonator that is similarly a semiconductor material, a resonator called FBAR (Film Bulk Acoustic Resonator) including a thin film piezoelectric material such as AlN, ZnO, and PZT as a base, a resonator using the other thin film materials such as $SiO_2$ as a base, or the like. Furthermore, the examples include a SAW (Surface Acoustic Wave) resonator using surface acoustic wave, a resonator using a boundary wave transmitting over boundaries of different materials, and the like. Most of the resonators hardly have the same level of frequency-temperature characteristic as that of the AT-cut quartz resonator, and almost all of them have the primary temperature coefficient (not negligible).

For example, in a resonator using thickness longitudinal vibration (vibration in the direction in which an electric field is applied), FBAR using AlN has a temperature coefficient of −25 ppm/° C., and FBAR using ZnO has a temperature coefficient of about −60 ppm/° C. Furthermore, in resonators using SAW, a resonator using 36° y-cut lithium tantalite as a base material has a temperature coefficient of about −35 ppm/° C., and a resonator using 64° y-cut lithium niobate as a base material has a temperature coefficient of about −72 ppm/° C.

The third exemplary embodiment describes a temperature-compensated synthesizer using a PLL (Phase Locked Loop) as a first synthesizer section. However, a DLL (Delay Locked Loop) or an ADPLL (All Digital PLL) may be used. Furthermore, DDS (Direct Digital Synthesizer) that does not a loop may be used.

Examples of the DDS may include a method of D/A (Digital/Analog)-converting signal information stored previously in a memory and generating signals in various frequencies. Furthermore, a configuration in which a frequency divider is directly connected behind the reference oscillator and thereby a frequency is adjusted may employed. In such a configuration example, second frequency divider 206 is disposed behind reference oscillator 202, the second frequency divider is adjusted, and frequency is adjusted.

Furthermore, a configuration in which a load impedance of a reference oscillator is adjusted may be employed. In such a configuration example, a plurality of capacitors having switching function are used as load capacity of a reference oscillator, and by changing switches, the load capacity is changed discretely so as to adjust a frequency.

In the above, various temperature-compensated synthesizers are described. In a word, any methods may be employed as long as frequency can be adjusted in a predetermined frequency adjustment range.

Note here that as an effect of the third exemplary embodiment, when a phase lock loop such as PLL or a frequency lock loop is used, a convergence time to the lock can be shortened. The lock loop is described by taking the PLL as an example.

In a PLL operation, firstly, frequency acquisition is carried out (frequency lock operation). Then, phase acquisition is carried out (phase lock operation). This is carried out by comparing a signal of first frequency divider 203 with a signal of second frequency divider 206 in comparator 204 of FIG. 14. In general, when the frequencies of the two signals are much different from each other, frequency lock operation takes a long time. However, in the third exemplary embodiment, since the second frequency divider is previously set according to the use state of the electronic device, it is possible to make the initial frequency difference small. Thereby, time required for carrying out frequency lock and phase lock can be shortened. Thus, it is possible to establish an excellent reception state more rapidly.

According to the description of the third exemplary embodiment, ΔFopt is ±25 kHz, this is determined at the designing time, and is not necessarily limited to this value. Hereinafter, details thereof are described.

The Japanese digital terrestrial broadcasting (Integrated Services Digital Broadcasting for Terrestrial, ISDB-T) uses Orthogonal Frequency Division Multiplexing (OFDM). The reception bandwidth is about 5.6 MHz, and it is divided into 13 frequency segments. Among them, 12 segments (full segment) are used for televisions for household use, and 1 segment (one segment) is used for televisions of mobile terminals such as portable telephones and the like. Furthermore, a multiple-carrier system is employed. In, for example, mode 3 of one-segment system, 433 carriers are arranged at a carrier interval of about 1 kHz so as to form one reception channel. In these carriers, known signals for synchronization are embedded, and frequency is corrected. Thereby, frequency difference ΔF can be substantially eliminated. This makes is possible to correct the frequency to the half of the intervals of the carrier in which known signals are embedded. However, when the correctable frequency is made to be too large, it takes a long time to correct a frequency, and load is burdened to a circuit. Therefore, by trading off these things, the correctable frequency is determined at the time of designing. In the third exemplary embodiment, ΔTopt may be made to be a predetermined temperature difference according to the correctable frequency determined as mentioned above, that is, ΔFopt described in the third exemplary embodiment. Thus, by considering the above-mentioned things, in the third exemplary embodiment, ΔFopt is set to be ±25 kHz.

Herein, the temperature detection section may be a temperature sensor such as a semiconductor-based sensor or a thermistor, or may be other temperature detection mechanisms. Furthermore, an effect of correcting the difference in physical positions of the temperature detection section and the MEMS oscillator is larger in the detection mechanism by which a temperature is directly measured. Furthermore, in an indirect temperature detection method by detecting the frequency difference between the reception frequency and a frequency of the local oscillation output and adjusting the frequency of the local oscillation output based on the detection results, a time table is formed by considering a time lag to the detection, the effect of the third exemplary embodiment is increased. The time lag used herein denotes, for example, a time required to carry out signal processing until the frequency difference is detected. The time lag denotes a time from the time when a temperature is actually shifted to the time when a frequency is adjusted.

Fourth Exemplary Embodiment

The configuration described in the first exemplary embodiment has an effect of remarkably reducing deterioration of BER. By using a fourth exemplary embodiment together, this effect can be further enhanced.

As described in FIG. 4 in the first exemplary embodiment, when variable frequency divider 13 is controlled, spuriousness occurs, C/N of signals is deteriorated, and BER is deteriorated. The interval of the main spuriousness is an inverse number of the control time interval. That is to say, a control signal is transmitted at a uniform time interval so as to correct the shift of oscillation frequency caused by the change of an ambient temperature. However, due to the transmitting of a control signal at a uniform time interval, spectra are concentrated on the position of the same frequency. As a result, the phase noise is increased, and the C/N of a receiver is deteriorated, and excellent reception characteristics cannot be achieved. The fourth exemplary embodiment focuses on the time interval of transmitting the control signal.

In a synthesizer of the fourth exemplary embodiment, a control signal is transmitted from a control section at a nonuniform time interval. Therefore, unlike the case in which a signal is transmitted at a uniform time interval, it is possible to suppress concentration of noises on a frequency that is apart from the oscillation frequency by a certain frequency. Thus, it is possible to provide a synthesizer capable of achieving a receiver having excellent reception characteristics.

Figure 19:
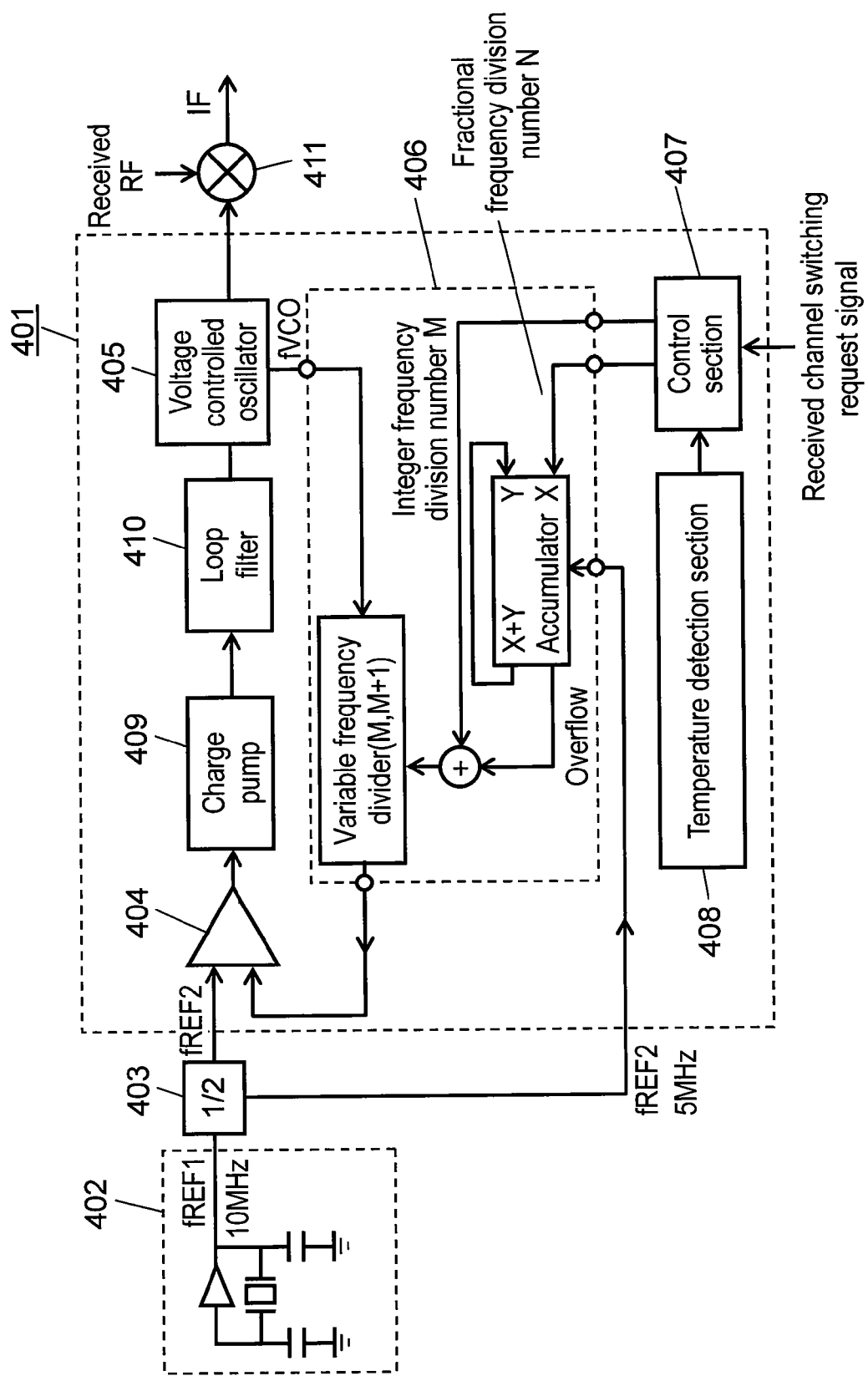
FIG. 19 is a block diagram showing a synthesizer in accordance with a fourth exemplary embodiment of the present invention.

FIG. 19 is a block diagram showing a synthesizer in accordance with a fourth exemplary embodiment of the present invention. In FIG. 19, in synthesizer 401, a reference oscillation signal (fREF1=10 MHz) output from MEMS oscillator 402 is frequency-divided (fREF2=5 MHz) by first frequency divider 403, and then input into comparator 404. Based on an output signal from comparator 404, voltage controlled oscillator 405 outputs an oscillation signal. The other output is input into second frequency divider 406. The term "based on comparator 404" used herein means that an output result of comparator 404 is received at least indirectly or directly. Therefore, another circuit block is provided and voltage controlled oscillator 405 may receive the output from the other circuit block. In the fourth exemplary embodiment, the output from comparator 404 is converted into an electric current component by charge pump 409. Furthermore, loop filter 410 receives an output from charge pump 409 and extracts only a near-DC component and supplies it to voltage controlled oscillator 405. Furthermore, loop filter 410 includes a portion for charging an electric current (electric charge) from comparator 404 by a capacitor and a low-pass filter for allowing a low frequency to pass.

Next, second frequency divider 406 frequency-divides an oscillation signal of voltage controlled oscillator 405 based on the control signal from control section 407 and outputs it to comparator 404. Comparator 404 compares an input signal from second frequency divider 406 with an input signal from first frequency divider 403 mentioned above, and outputs a signal indicating the comparison result to voltage controlled oscillator 405. By repeating the above-mentioned procedures, synthesizer 401 operates.

Temperature detection section 408 senses an ambient temperature, converts the temperature data from an analog quantity to a digital quantity, and transmits it to control section 407. Control section 407 transmits appropriate control signals of integer frequency division number M and fractional frequency division number N to second frequency divider 406 based on an output signal of temperature detection section 408 for detecting a temperature so as to change a frequency division ratio of second frequency divider 406. That is to say, second frequency divider 406 includes an integer portion to which frequency division number M is input and a fraction portion to which frequency division number N is input. Control section 407 changes a frequency division ratio of second frequency divider 406 at a nonuniform time interval based on a temperature signal of temperature detection section 408 for detecting a temperature.

Figure 20A:
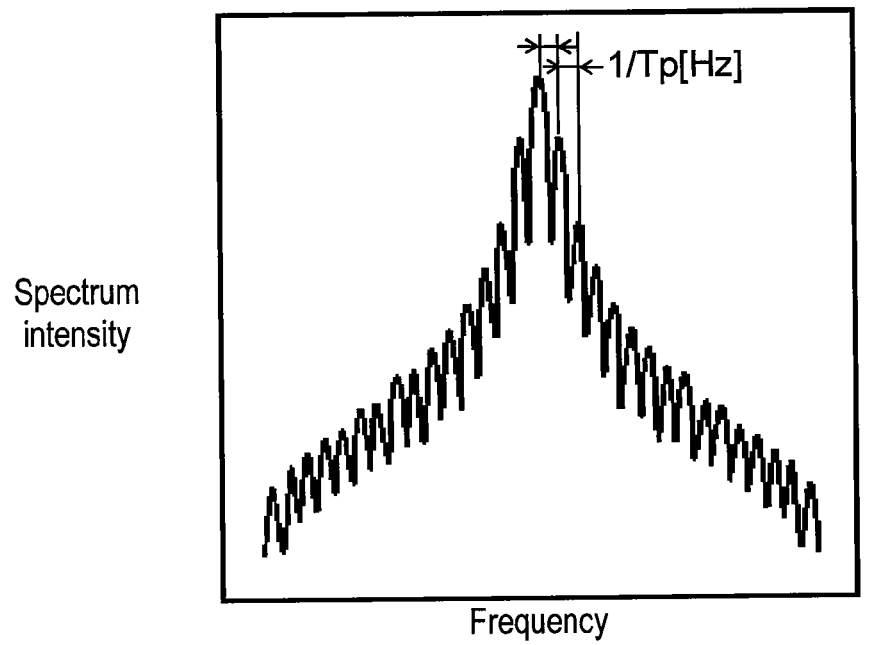
FIG. 20A is a graph showing a spectrum of an output signal of a synthesizer when a time interval for controlling a frequency division ratio in the synthesizer is equal.

FIG. 20A is a graph showing a spectrum of an output signal of a synthesizer when a time interval for controlling a frequency division ratio in the synthesizer is equal. In FIG. 20A, the ordinate shows spectrum intensity, and the abscissa shows a frequency, showing an average frequency spectrum in a predetermined period of time.

When the time interval for controlling the frequency division ratio of a synthesizer is an equal interval, the phase noise of the output signal of voltage controlled oscillator 405 may be deteriorated. Herein, a state of a spectrum of a synthesizer output when the frequency is controlled at a uniform time interval, for example, at an interval of 20 msec is described. In FIG. 20A, a frequency in a spurious portion other than the original carrier signal is noted, and this is located in the upper and lower parts from the carrier signal located in the center at a predetermined frequency, that is, at an interval of 1/Tp=50 Hz. The 50 Hz corresponds to a frequency in the control period of 20 msec, that is, $1/(20 \times 10^{-3})$.

The present inventors have focused on the result and have found that by controlling the frequency division ratio at a nonuniform time interval, the level of spuriousness can be reduced.

Figure 20B:
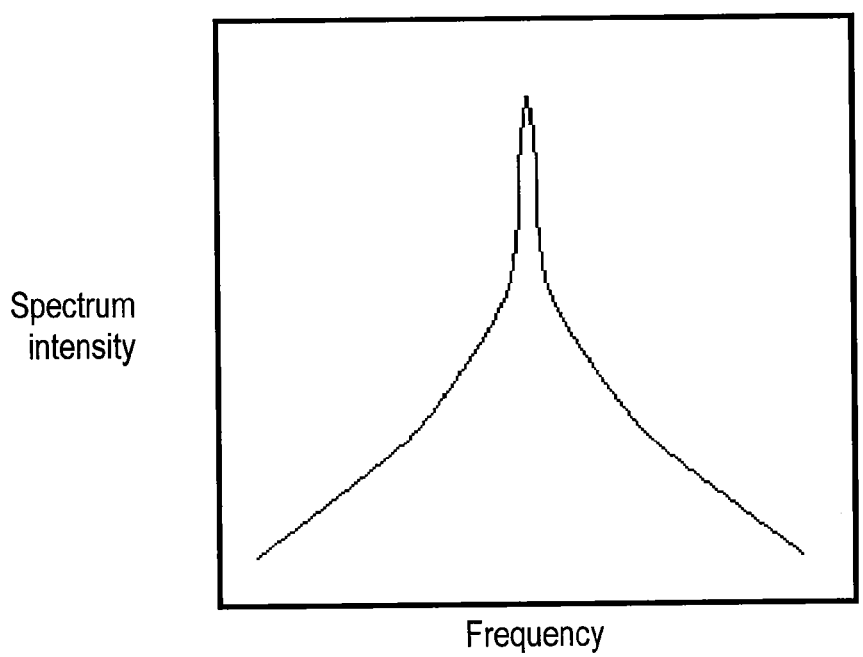
FIG. 20B is a graph showing a spectrum of an output signal of a synthesizer in the fourth exemplary embodiment of the present invention.

FIG. 20B is a graph showing a spectrum of an output signal of a synthesizer in the fourth exemplary embodiment of the present invention. The ordinate shows spectrum intensity, and the abscissa shows a frequency, showing an average frequency spectrum for a predetermined period of time.

FIG. 20B shows a state of a spectrum output from a synthesizer when the frequency is controlled at a nonuniform time interval. Herein, a control time interval T is determined by generating random numbers, and time interval is substantially at random. Thus, the level of spuriousness occurring at a predetermined interval (for example, at an interval of 50 Hz) is reduced, and the phase noise is also reduced.

Next, an example in which the phase noises can be reduced more easily by switching time intervals and repeating at a predetermined period is described.

FIG. 21 is a timing chart showing a state in which a control section of a synthesizer transmits a control signal to a second frequency divider in the fourth exemplary embodiment of the present invention. In FIG. 21, an interval at which temperature detection section 408 transmits a temperature signal to control section 407 is T1 and is uniform. When control section 407 transmits a control signal to a second frequency divider at this timing every time, an oscillation frequency of a voltage controlled oscillator changes at time interval T1. As a result, spuriousness occurs with respect to the oscillation frequency at a frequency interval of 1/T1, thus deteriorating the phase noise performance. In order to suppress the occurrence of spuriousness, in a synthesizer of the fourth exemplary embodiment of the present invention, control section 407 transmits a control signal to second frequency divider 406 at a nonuniform time interval.

As shown in the timing chart in the lower part in FIG. 21, a control signal is firstly transmitted at time interval T1 twice. Thereafter, the time interval is changed to T2, T3, T4, and T1 nonuniformly. As a whole, a control signal is transmitted aperiodically. As a result, it is possible to reduce the occurrence of spuriousness due to switching control of second frequency divider 406, and to reduce the deterioration of the phase noise performance. In this case, by distributing the spuriousness at frequency intervals with respect to 1/T1, 1/T2, 1/T3, and 1/T4 corresponding to time intervals of T1, T2, T3, and T4, the phase noise is reduced.

The term "nonuniform time interval" described in the claims denotes that a time interval at which a control signal is transmitted changes at least partly as shown in FIG. 21.

FIG. 22 is another timing chart showing a state in which a control section of a synthesizer transmits a control signal to a second frequency divider in the fourth exemplary embodiment of the present invention. In FIG. 22, the transmission interval of a control signal is a nonuniform time interval, but, as a whole, a control signal is transmitted at time interval T4, and a control signal is not transmitted at an aperiodic time interval. Therefore, when a control signal is transmitted according to the timing chart in FIG. 22, it is expected that noises are generated more frequently than in the case in which a control signal is transmitted according to the timing chart shown in FIG. 21. However, as compared with the case in which a control signal is transmitted from control section 407 in FIG. 22 every time a temperature signal is transmitted from temperature detection section 408 to control section 407 as in a conventional synthesizer, occurrence of spuriousness is reduced. This is also because of an effect of distributing spuriousness as mentioned above. Ideally, however, spuriousness can be reduced when a control signal is transmitted at a more nonuniform interval and an aperiodic time interval. Therefore, it is more preferable that control is carried out by using a time interval generated by the use of random numbers, and the like.

The random numbers may be generated by using Monte Carlo method used in simulation, or by maximum length sequence, or the like. The latter is known as, for example, a pseudo noise code, and easily configured by a logic circuit including a shift register and exclusive OR (XOR), an adder, and the like.

Figure 23:
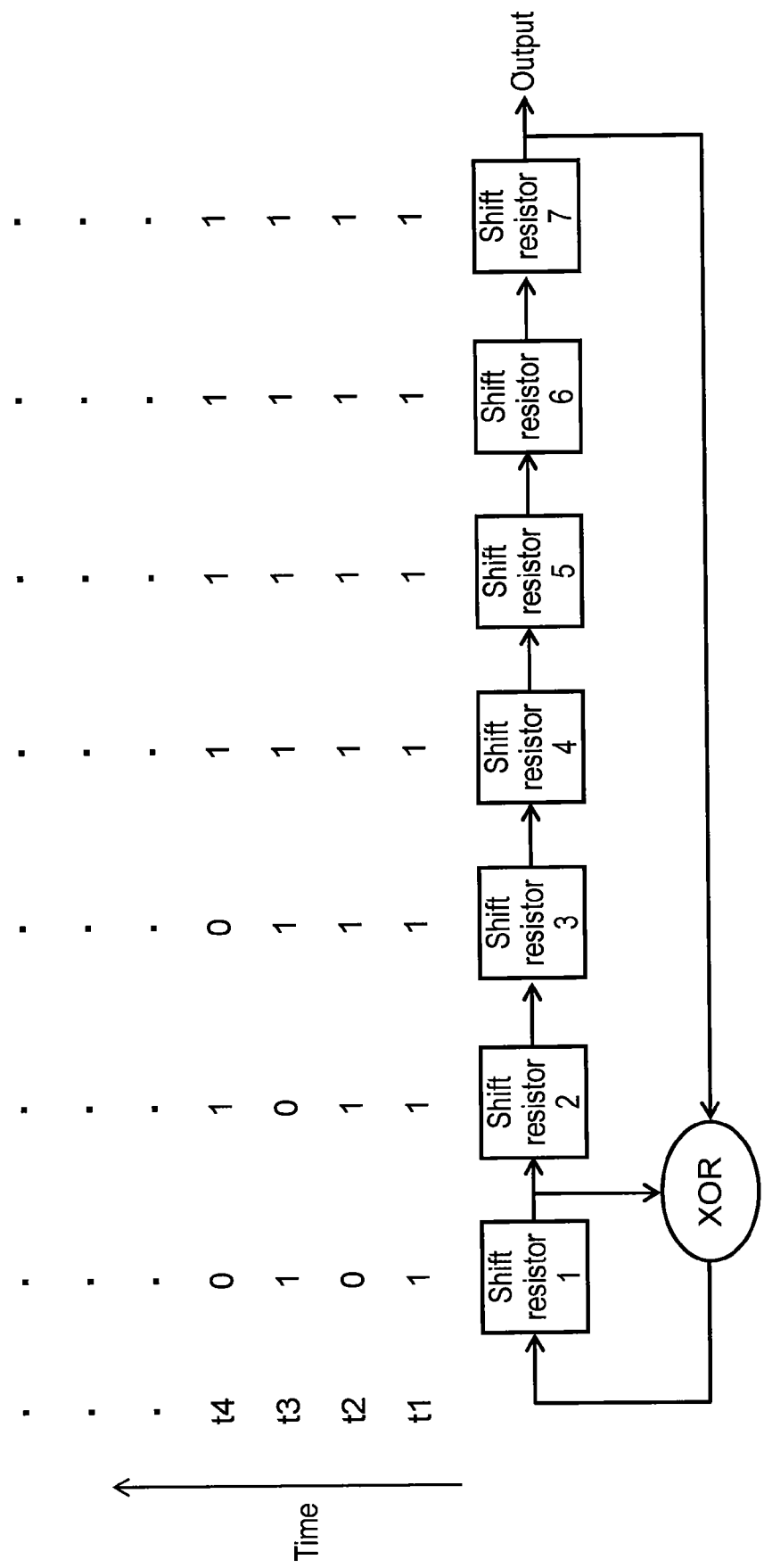
FIG. 23 is a view showing a random number generator applied to the synthesizer in the fourth exemplary embodiment of the present invention.

FIG. 23 is a view showing a random number generator applied to the synthesizer in the fourth exemplary embodiment of the present invention. In FIG. 23, with respect to seven stages of shift registers 1 to 7, exclusive OR (XOR) of an output of the seventh resister and an output of the first resister is taken, and the result is fed back to the input stage. Every time clock is input, a shift register is shifted, and content is rewritten. A method of using numeric values of the control interval includes, for example, a method of using a value of each of shift registers 1 to 7, a method of using numeric values of predetermined bits of outputs, and the like.

For example, when values of shift registers 1 to 7 at a moment are 1, 1, 1, 1, 1, 1, and 1 (time t1 in FIG. 23), the values become 0, 1, 1, 1, 1, 1, and 1 at the next clock (time t2 in FIG. 23). Every time a clock comes one clock after another, the content of the shift register is rewritten, and random numbers are generated (t3, t4, . . . ). When a value of the shift register at a moment is defined as S, S is 1111111 (binary numeral) at the initial time t1. The value of S that is recalculated every time a clock is input may be used as a control interval. When it is judged that the sizes of the intervals are too different from each other, the control interval T may be redefined as a function of S.

The control interval may be defined as, for example, $T=f(S)=T0+a\times S$. In this case, since period T0 remains, when T0 itself is made to be a function of S, randomness is further increased.

When the above-mentioned random numbers are used as the control interval, the deterioration of the phase noise performance can be further reduced. In the above-mentioned example, the random numbers return to the original value at the $2^7-1$ times of clocks. That is to say, the number of times of a period is $2^7-1$.

Next, the timing charts of "control section→second frequency divider" in FIGS. 21 and 22 show an example of criterion of judging whether or not a control signal is transmitted.

Control section 407 has a memory. The memory includes discrete temperature data and frequency division ratio data corresponding at 1:1 to the temperature data. Examples of data recorded in the memory are shown in Table 5.

TABLE 5

| Data No. | Temperature data (° C.) | Frequency division ratio |
|---|---|---|
| . . . | . . . | . . . |
| 300 | 20.1 | 16550 |
| 301 | 20.2 | 16238 |
| 302 | 20.3 | 15932 |
| 303 | 20.4 | 15610 |
| 304 | 20.5 | 15312 |
| 305 | 20.6 | 14980 |
| . . . | . . . | . . . |

In Table 5, temperature data are recorded at an interval of 0.1° C. Herein, when control section 407 receives a temperature signal indicating that an ambient temperature is 20.3° C. from temperature detection section 408, control section 407 refers to Table 5 in the memory and confirms that the frequency division ratio to be transmitted to second frequency divider 406 is 15932. Then, control section 407 transmits a control signal for changing the frequency division ratio to 15932 to second frequency divider 406.

Next, when control section 407 receives a temperature signal indicating that an ambient temperature is 20.33° C. from temperature detection section 408, control section 407 refers to Table 1 in the memory again. However, the temperature data are recorded at an interval of 0.1° C., frequency division ratio data corresponding to 20.33° C. are not recorded. When the recorded temperature data "20.3° C." and "20.4° C." are compared with each other, 20.33° C. is near to "20.3° C." Therefore, the frequency division ratio data for "20.3° C.," that is, "15932" is employed. However, since a control signal for changing the frequency division ratio to "15932" has been transmitted from control section 407 to second frequency divider 406 in the previous time, the frequency division number of the second frequency divider has been already set to 15932. Therefore, this time, it can be judged that it is not necessary to transmit a control signal.

By judging whether or not a control signal is transmitted based on an actual temperature change according to the above-mentioned criterion, the transmission interval of the control signal can simply be made to be nonuniform. This is an example using randomness of a temperature change itself in the natural world.

With the above-mentioned simple method, nonuniformity of the transmission interval of a control signal may be lowered. Therefore, a method for improving this point is described hereinafter.

In order to improve nonuniformity of the transmission interval of a control signal, contents of data recorded in the memory are improved. The contents in the memory are specifically shown in Table 6.

TABLE 6

| Data No. | Temperature data (° C.) | Frequency division ratio |
|---|---|---|
| ... | ... | ... |
| 300 | 20.1 | 16550 |
| 301 | 20.2 | 16238 |
| 302 | 20.3 | 15932 |
| 303 | 20.4 | 15610 |
| 304 | 20.6 | 15312 |
| 305 | 20.9 | 14980 |
| 306 | 21.5 | 14648 |
| 307 | 21.7 | 14316 |
| 308 | 22.1 | 13984 |
| 309 | 22.2 | 13652 |
| 310 | 22.4 | 13320 |
| 311 | 22.7 | 12988 |
| ... | ... | ... |

In Table 6, the temperature data in data Nos. 300-303 are recorded at an interval of 0.1° C., but the temperature data interval of data No. 303 or later are set to be nonuniform. Thus, even when it is judged whether or not a control single is transmitted by the above-mentioned simple criterion, it is possible to prevent the nonuniformity of the transmission interval of control signals from being lowered. Furthermore, in the temperature characteristics of reference oscillator 402, in the temperature range in which sensitivity is low, by skipping some of temperature data as in data Nos. 303 or later, need for transmitting a control signal frequently is reduced. Thus, since the occurrence frequency itself of spuriousness can be reduced, a period of time during which the phase noise is deteriorated can be shortened in total.

FIG. 24 is another timing chart showing a state in which the control section of the synthesizer transmits a control signal to the second frequency divider in the fourth exemplary embodiment of the present invention. A method for further improving the nonuniformity of the transmission interval of a control signal is described with reference to FIG. 24.

In FIG. 24, control section 407 inserts any delay time from the time when control section 407 receives a temperature signal from temperature detection section 408 to the time when control section 407 transmits a control signal to second frequency divider 406. Since the length of the delay time is changed every time the control signal is transmitted, the nonuniformity of the transmission interval of the control signal is improved. Examples of methods by which control section 407 determines the length of the delay time include a method using the generation of random numbers or an added value of a pseudo noise code such as maximum length sequences as mentioned above.

Another method for improving the nonuniformity of the transmission interval of a control signal includes a method of recording the transmission intervals of control signals of any times in the past in the memory. When control section 407 transmits a control signal, it reads out the transmission intervals of control signals of any times in the past from the memory and transmits a control signal at a transmission interval that is different from the read-out intervals. Thus, it is possible to make the transmission interval of a control signal be extremely nonuniform.

FIG. 25 is another timing chart showing a state in which the control section of the synthesizer transmits a control signal to the second frequency divider in the fourth exemplary embodiment of the present invention. In FIG. 25, a temperature signal from temperature detection section 408 is transmitted to control section 407 at time interval T1. At t2 after the lapse of time: T2=2×T1 from time t1 when a control signal is transmitted from control section 407 in the previous time, a control signal is newly transmitted from control section 407. In this case, after the lapse of time interval T1 from time t1, since a temperature change is small and a frequency change amount of reference oscillator 402 is small, control section 407 does not transmit a control signal. Therefore, it is expected that the time interval at which temperature detection section 408 transmits a temperature signal to control section 407 may be longer than T1. Therefore, at time t2 or later, the transmission interval of a temperature signal is changed to T3=T1×1.4. Thus, when the temperature change is small, it is possible to prevent temperature detection section 408 from unnecessarily transmitting a temperature signal to control section 407. T3 is defined as a value obtained by multiplying T1 by 1.4. The same effect is obtained as long as T3 is a multiple of a numeric value larger than 1.

At time t2 or later, a temperature signal is transmitted from temperature detection section 408 at time interval T3 (=T1× 1.4). Then, at time t3 that is the first transmission time of a temperature signal after time t2, a control signal is transmitted from control section 407. This means that a temperature change that requires to transmit a new frequency division ratio data occurs during time interval T3. Therefore, for the state of this temperature change, it is expected that time interval T3 is too long for sampling a temperature. Therefore, at time t3 or later, temperature detection section 408 transmits a temperature signal at time interval T4=T3×0.5. Thus, even when a large temperature change occurs, flexible correspondence to the situations can be carried out. It is possible to minimize the shift of an oscillation frequency of synthesizer 401. Herein, time interval T4 is defined as a value obtained by multiplying T3 by 0.5. The same effect is obtained as long as time interval T4 is a multiple of a numeric value of more than zero and less than one.

At time t3 or later, a temperature signal is transmitted from temperature detection section 408 to the control section at time interval T4. Then, at time t4 that is the fourth transmission of a temperature signal after time t3, a control signal is transmitted from control section 407. As a result, during the time interval from time t3 to time t4, since the state of the temperature change is moderate, it is expected that an ambient temperature may be sampled at an interval of time interval T4 or more. Therefore, at time t4 or later, a temperature signal is transmitted at time interval T6=T4×3.4.

In this way, the value of multiple m may be determined according to the number of times which control section 407 receives a temperature signal from temperature detection section 408 during the period of time from the time when a control signal is transmitted in the previous time to the time when a control signal is transmitted this time. Furthermore, multiple m or multiple k may be changed every time a control signal is transmitted. Thus, the nonuniformity of the transmission interval of a control signal can be further improved. It is preferable that multiple m and multiple k satisfy the relation represented by the mathematical formula Math. 2:

$$(1/m) \neq k \qquad \text{[Math. 2]}$$

The merit obtained by satisfying mathematical formula Math. 2 is described by taking a case as an example in which (1/m)=k is satisfied, that is, a case that does not satisfy the relation represented by the mathematical formula Math. 2.

In FIG. 25, the time interval is determined by satisfying the relation: (1/m)=k, time intervals T1, T4 and T7 are equal. Furthermore, time intervals T3 and T6 are equal. Therefore, as a whole, the time interval may have periodicity. When the time interval is determined by satisfying the relation of mathematical formula Math. 2, such a risk can be prevented.

Figure 26:
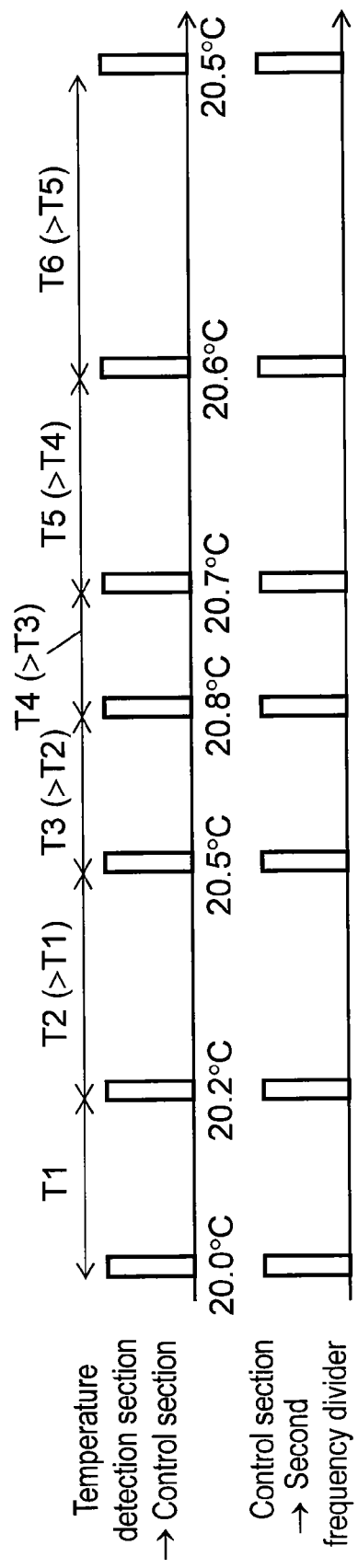
FIG. 26 is a further timing chart showing a state in which the control section of the synthesizer transmits a control signal to a second frequency divider in the fourth exemplary embodiment of the present invention.

FIG. 26 is another timing chart showing a state in which the control section of the synthesizer transmits a control signal to the second frequency divider in the fourth exemplary embodiment of the present invention. Also in the timing chart shown in FIG. 26, the transmission interval of a temperature signal from temperature detection section 408 is nonuniform.

The time interval at which a temperature signal is transmitted from temperature detection section 408 to control section 407 is set so that the next time interval is longer than the time interval in the previous time when a difference between the previous temperature sensed by temperature detection section 408 and this time temperature is smaller than a preset value. Furthermore, the time interval is set so that the next time interval is shorter than the time interval in the previous time when a difference between the previous temperature sensed by temperature detection section 408 and this time temperature is larger than the preset value.

FIG. 26 shows an example in which a preset value of the difference between the previous temperature and this time temperature is set to 0.25° C. The rate of lengthening the time interval and the rate of shortening the time interval may be changed every time a temperature signal is transmitted. Thus, the nonuniformity of the transmission interval of a temperature signal can be improved. As a result, the nonuniformity of the transmission interval of a control signal can be improved. Furthermore, a method of transmitting a control signal every time a temperature signal is transmitted is employed. However, as shown in FIGS. 21, 22, and 24, some of the number of times of transmitting a control signal may be skipped. Thus, the nonuniformity of the transmission interval of a control signal can be improved.

Note here that a preset value of the difference between the previous temperature and this time temperature may be changed at any time in each temperature region based on the temperature characteristics of reference oscillator 402. Thus, the preset value can be set to be small in a temperature region in which a frequency change with respect to the temperature of reference oscillator 402 is large, and a preset value can be set to be large in a temperature region in which frequency change with respect to the temperature of reference oscillator 402 is small. Thus, it is possible to prevent control signals from being unnecessarily transmitted.

Furthermore, the preset value may be changed every time a temperature signal is transmitted. Thus, the nonuniformity of the transmission interval of a temperature signal can be improved. As a result, the nonuniformity of the transmission interval of a control signal can be improved.

Note here that a synthesizer module (not shown) having synthesizer 401 includes synthesizer 401 and reference oscillator 402 including a resonator formed of a MEMS (Micro-Electro-Mechanical Systems) element. An output signal of reference oscillator 402 is input into comparator 404 via first frequency divider 403. The MEMS element is formed of, for example, silicon or compounds thereof as a main material.

In a silicon resonator for example, the temperature characteristic is extremely large such as about −30 ppm/° C. Therefore, as compared with the case in which, for example, an AT-cut quartz resonator is used, the above-mentioned temperature control is required to be carried out more frequently. Therefore, the deterioration of the phase noise is increased in terms of frequency and amount, so that the effect obtained by making the control interval nonuniform is increased.

Furthermore, a reception device (not shown) equipped with synthesizer 401 includes synthesizer 401, and mixer 411 (see FIG. 19) for converting a frequency of a received signal based on the oscillation signal from synthesizer 401. In this case, synthesizer 401 is used as a local oscillator for converting the received signal into a different frequency. That is to say, since it is used as a reference oscillator for selecting a frequency of the received signal, the deterioration of the phase noise may have an influence on the entire system.

For example, in a multiple-carrier system such as OFDM (Orthogonal Frequency Division Multiplexing), spuriousness is superimposed on neighboring carriers. As mentioned above, in the use in a reception device, an effect of the deterioration of the phase noise inflects the entire system.

Note here that an electronic device (not shown) equipped with synthesizer 401 includes a signal processing section (not shown) connected to the output side of mixer 411 in the above-mentioned reception device, and a display section connected to the output side of the signal processing section. In this case, for example, when an output of synthesizer 401 is used also in other blocks, directly or indirectly by changing a frequency, the same effect can be obtained.

In television receivers or portable telephones, the interference resistant property is improved. Furthermore, it is possible to reduce problem that, for example, spuriousness enters the other systems as a noise and is mixed therewith, thus generating a signal of an utterly different frequency band and bringing an influence on the other systems. Since a signal of a synthesizer section has relatively high electric power among high frequency circuit blocks, it is desirable that spuriousness is minimized by considering the influence on the other systems. This is particularly remarkable when a synthesizer is used as an electric device, that is, used as a device composed of a plurality of systems, and the effect and influence of the present invention becomes large as compared with the case where a synthesizer is used singly.

As mentioned above, by providing the control interval with nonuniformity (randomness), deterioration of the phase noise of a synthesizer can be reduced. Furthermore, by extremely reducing the controlling times, a period of time during which the phase noise is deteriorated can be shortened.

Fifth Exemplary Embodiment

Figure 27:
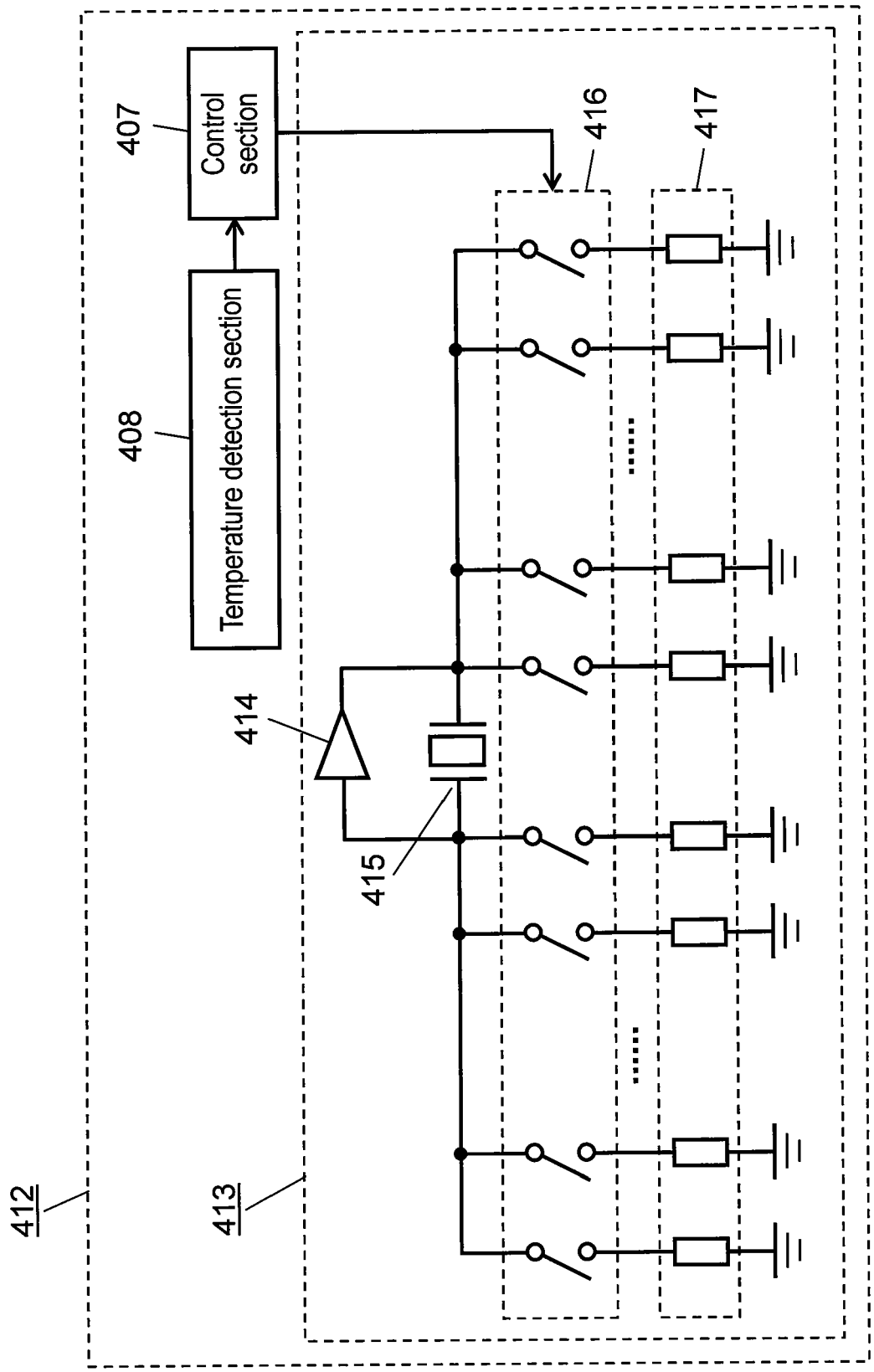
FIG. 27 is a block diagram showing an oscillator module in accordance with a fifth exemplary embodiment of the present invention.

Hereinafter, an oscillator module of a fifth exemplary embodiment is described with reference to FIG. 27. FIG. 27 is a block diagram showing an oscillator module in accordance with the fifth exemplary embodiment of the present invention. In FIG. 27, oscillator module 412 includes temperature detection section 408 and frequency variable oscillator 413. Furthermore, frequency variable oscillator 413 includes driver amplifier 414, resonator 415 connected to driver amplifier 414, switch section 416 connected to resonator 415, and reactance section 417 connected between switch section 416 and ground.

Control section 407 discretely changes an oscillation frequency of frequency variable oscillator 413 based on a temperature signal of temperature detection section 408. Specifically, a control signal transmitted from control section 407 is input into switch section 416, so that the state of switch is changed to be optimal for correcting the frequency change by a temperature change. The term "discretely change an oscillation frequency" denotes that frequency is digitally changed from a first frequency to a second frequency, and does not denote that a frequency is changed in an analog manner by using only an applied voltage of a varicap, and the like. This is because when a frequency is changed in an analog manner, phase discontinuity is not generated and thus the phase noise is not likely to be generated. The fifth exemplary embodiment does not include, for example, a case in which switch section 416 is not provided, resonator 415 is directly connected to reactance section 417, reactance section 417 is a varicap, and a voltage to be applied to the varicap is changed in an analog manner. However, a case in which a voltage to a varicap is controlled digitally by a discrete amount selected from, for example, 0.5V, 1V, and 1.5V, is included in the fifth exemplary embodiment, and can obtain the effect of the fifth exemplary embodiment.

In the oscillator module shown in FIG. 27, frequency variable oscillator 413 is controlled by control section 407 at a nonuniform time interval. Thus, similar to the case of the synthesizer of the present invention shown in the fourth exemplary embodiment, occurrence of a noise accompanying the control of switch section 416 is suppressed. A method for determining a time interval of a control signal from control section 407 to frequency variable oscillator 413 is the same method as in the method shown in FIGS. 21 to 26 in the fourth exemplary embodiment. Thus, it is possible to achieve an oscillator module with less phase noise.

Sixth Exemplary Embodiment

Figure 28:
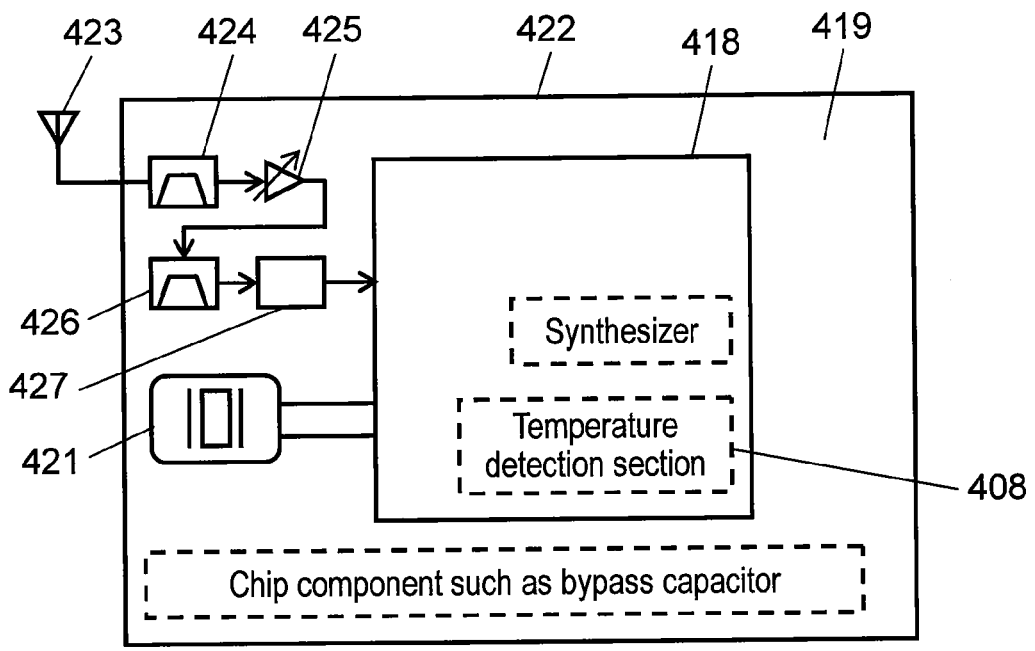
FIG. 28 is a block diagram showing an electronic device in accordance with a sixth exemplary embodiment of the present invention.

FIG. 28 is a block diagram showing an electronic device in accordance with a sixth exemplary embodiment of the present invention. In FIG. 28, a synthesizer together with temperature detection section 408 are integrated into the same semiconductor IC 418, and packaged on base substrate 419. Furthermore, MEMS resonator 421 is used as a component element of a reference oscillator, and is packaged on base substrate 419. By using MEMS resonator 421 as a component element of a reference oscillator, the size of television receiving module 422 can be reduced.

For example, a quartz resonator needs a size of 2.5×2.0 mm while the MEMS resonator can be formed in a size of 1.0×1.0 mm to 0.3 mm×0.3 mm. Furthermore, the MEMS resonator can be formed at half height or lower. This is because when MEMS resonator 421 is formed of, for example, a silicon resonator, it can be formed by a semiconductor process, a manufacturing process such as RIE (Reactive Ion Etching), and a photolithography process. Furthermore, the above-mentioned size is a typical example, which can be formed in a smaller size as compared with the case in which a conventional piezoelectric single crystal such as quartz is used. Furthermore, for a small television receiving module such as a module to be installed in a portable telephone, the size is small such as 9×9 mm to 8×8 mm. Therefore, the above-mentioned size effect is extremely large. That is to say, the influence of the size of a resonator on the size of a reception module can be reduced.

On base substrate 419, first filter 424 for receiving a received signal received by antenna 423, LNA (Low Noise Amplifier) 425 for receiving an output signal of first filter 424, second filter 426 for receiving an output signal of LNA 425, and balun 427 for receiving an output signal of second filter 426 are packaged. An output signal of balun 427 is input into semiconductor IC 418.

Figure 29:
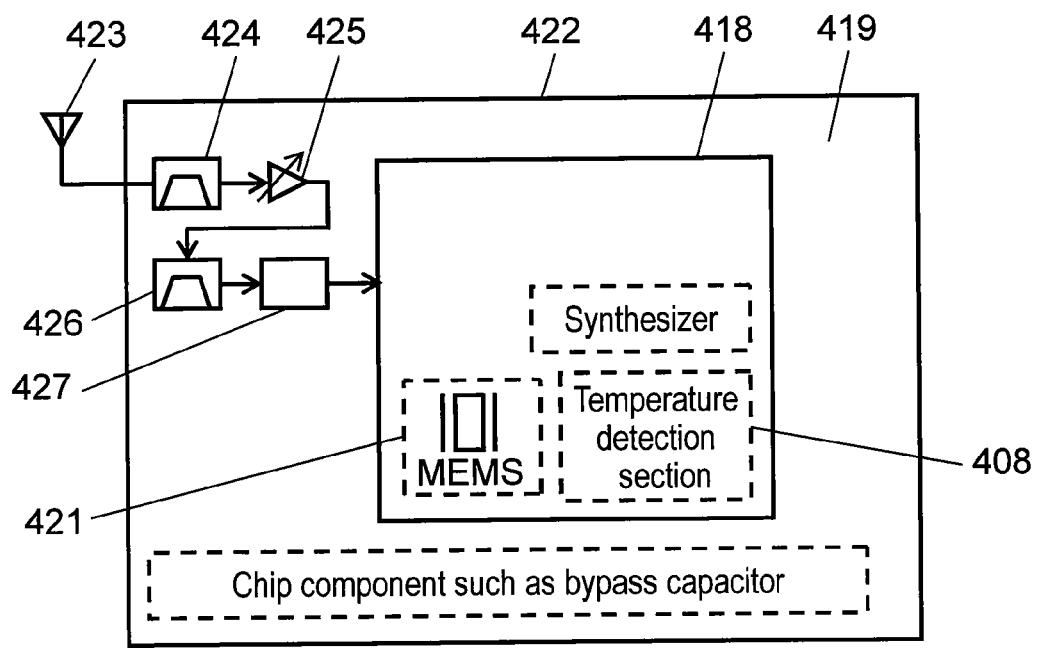
FIG. 29 is another block diagram showing an electronic device in accordance with the sixth exemplary embodiment of the present invention.
Figure 30:
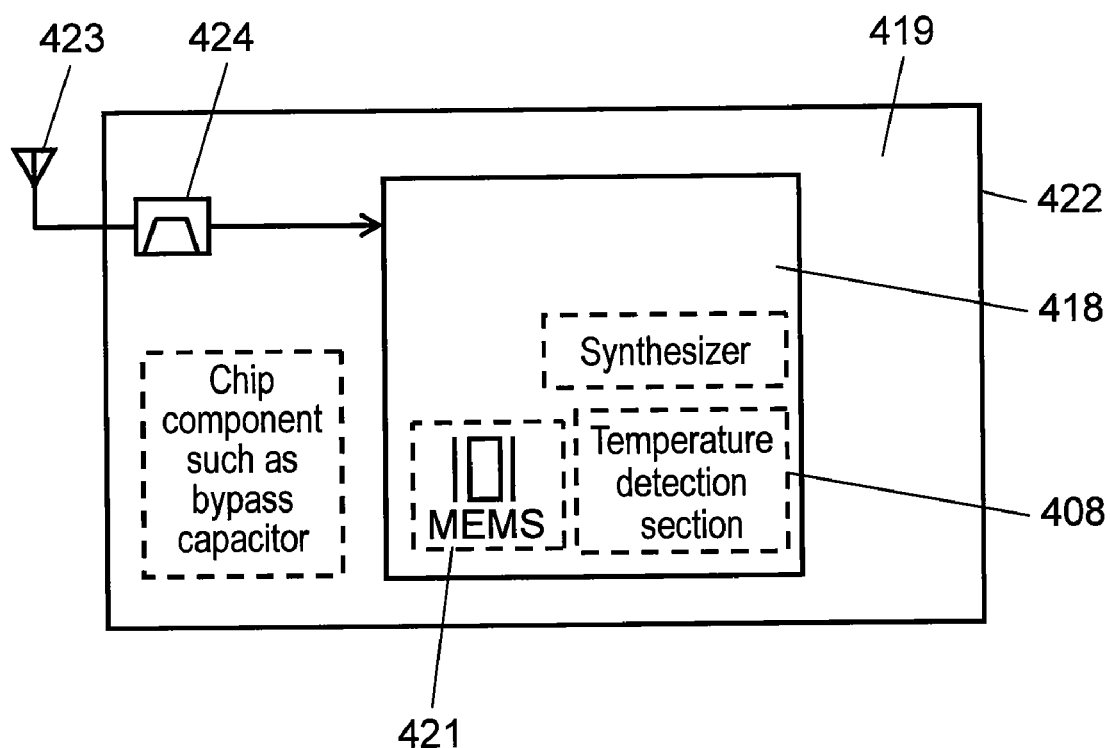
FIG. 30 is another block diagram showing an electronic device in accordance with the sixth exemplary embodiment of the present invention.
Figure 31:
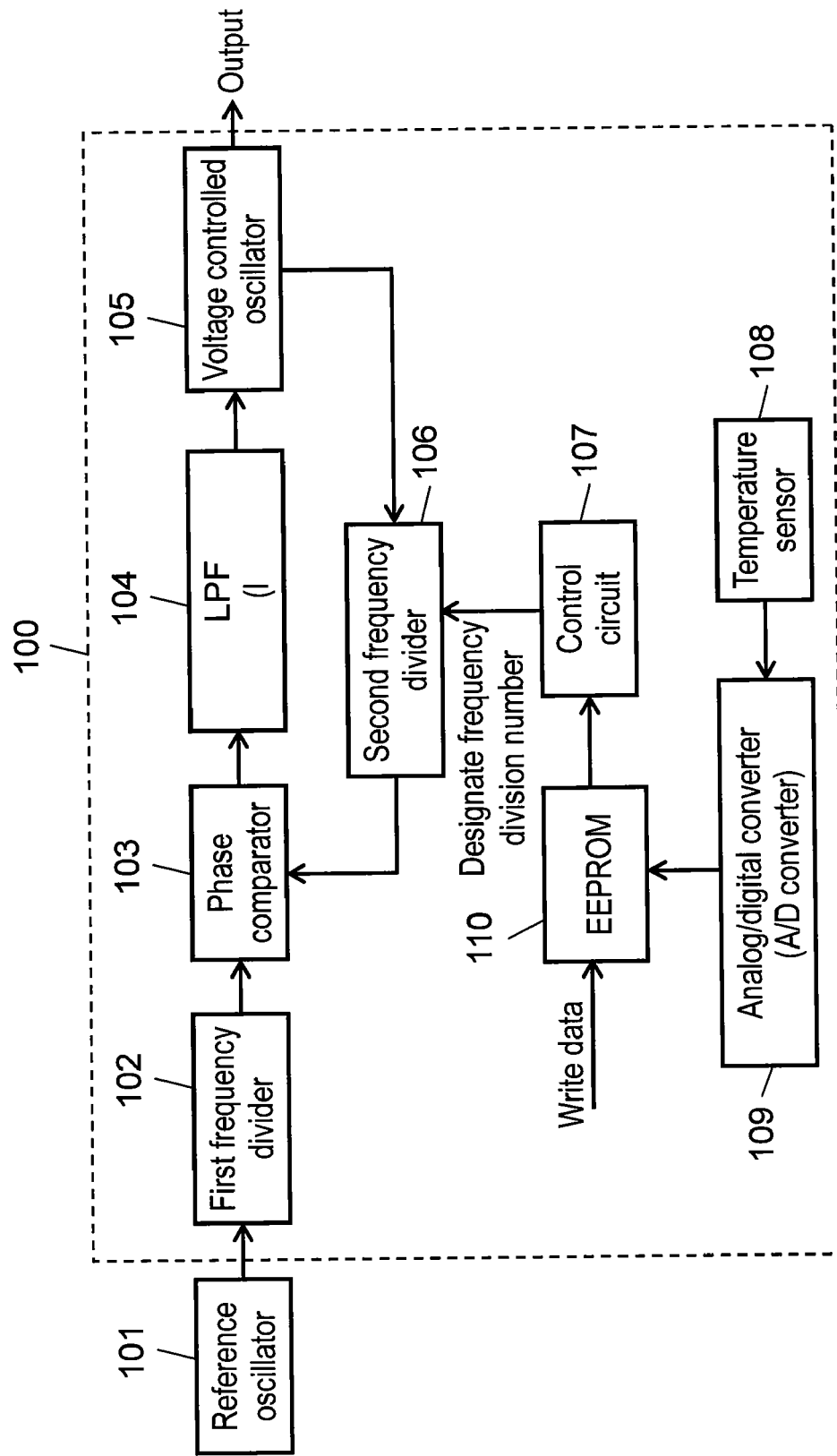
FIG. 31 is a block diagram showing a conventional synthesizer.

FIGS. 29 and 30 are other block diagrams showing the electronic device in accordance with the sixth exemplary embodiment of the present invention. In FIG. 29, MEMS resonator 421 is incorporated in an IC. Furthermore, in FIG. 30, the above-mentioned LNA 425 is incorporated in the inside of semiconductor IC 418. The system is formed so that second filter 426 and balun 427 are unnecessary in configuring the IC.

Thus, when the MEMS resonator and the temperature detection section are incorporated in the same IC chip, an actual temperature of the MEMS resonator can be sensed more exactly. Thus, adjustment accuracy of an oscillation frequency of the MEMS oscillator can be improved.

For example, even when a rapid temperature change occurs, a temperature can be sensed in a state in which delay in the temperature conductivity hardly occurs. Therefore, the reception deterioration thereby does not occur. Furthermore, in particular, a configuration shown in FIG. 30, since an outside component elements can be formed in one semiconductor IC 418, the size can be radically reduced and the production efficiency can be improved. Furthermore, since a heat-generating component such as an amplifier is incorporated inside, the effect of installing temperature detection section 408 and MEMS resonator 421 in the same IC chip becomes larger as compared with the configuration shown in FIG. 29.

In the above-mentioned sixth exemplary embodiment of the present invention, as shown in FIG. 19, an output of voltage controlled oscillator 405 is an output of synthesizer 401. However, by providing a frequency divider behind voltage controlled oscillator 405, an output of the frequency divider may be made to be an output of synthesizer 401. Thus, an oscillation frequency of voltage controlled oscillator 405 can be increased, and the size of voltage controlled oscillator 405 can be reduced.

Furthermore, in FIG. 30, MEMS resonator 421 is used. However, a quartz resonator may be used unless it is necessary to consider the effect of reducing the size mentioned above. Furthermore, a resonator using other piezoelectric single crystals, a ceramic resonator, a resonator using a thin film of a FBAR (Film Bulk Acoustic Resonator), or the like, may be used. Furthermore, in general, such resonators use a vibration mode of a bulk wave, a SAW resonator using a vibration mode of a surface acoustic wave may be used. The resonators may be selected depending upon the application of use of the synthesizer of the present invention.

An example of a temperature detection section mentioned above includes a commonly used semiconductor transistor-based sensor using temperature characteristics of an electric current flowing in a semiconductor, a sensor called a thermistor using a characteristic that a resistance value changes according to temperatures, a thermocouple using a thermo-electromotive force, and the like. However, the sensor is not necessarily limited to these examples.

For example, two resonators having different temperature characteristics are prepared, and the frequency difference therebetween is sensed, and thereby a temperature can be indirectly sensed. Alternatively, the finite difference is sensed by comparison with or multiplication by a signal having other clocks or frequency information, and thereby a frequency shift may be sensed. Examples of the clocks include a received signal itself as a desired wave, a signal for GPS (Global Positioning System), a signal supplied from other circuit blocks in the case of an electronic device, and the like. In a word, any members capable of sensing temperature information indirectly or directly may be used.

Furthermore, in a reception device or an electronic device, by sensing the finite difference between a received signal and an output from a synthesizer, and sensing the shift of the frequency from the difference, a temperature may be detected indirectly.

For example, a received signal and a synthesizer output are input into a frequency mixing device (mixer). From the frequency mixing device, frequencies of a sum and a difference between the received signal and the output from the synthesizer are output. When the output frequency of the synthesizer is a target desirable value, the frequency of the difference becomes a predetermined value. When the output frequency of the synthesizer is not the target desirable value, the frequency of the difference becomes a different value. By sensing the frequency of the difference, it is possible to sense temperature information indirectly. In a sensor for directly sensing a temperature, for example, a temperature detecting section based on a semiconductor transistor, the accuracy is at most about 0.1° C. However, in a method for sensing the frequency of the difference, when a silicon resonator is used, temperature can be detected with about two-digit accuracy. The temperature characteristic of a silicon resonator is −30 ppm/° C. By a method for sensing the frequency of the difference, about 0.01 to 0.1 ppm of frequency shift can be sensed. Herein, 0.01 to 0.1 ppm is a ratio with respect to the output of a synthesizer. For example, the shift of 0.05 ppm corresponds to a temperature of 0.0017° C.

Note here that both a sensor of directly sensing a temperature and a sensor of indirectly sensing a difference of frequencies may be used in combination.

For example, a method of using a sensor for directly sensing a temperature before the initial synchronization is established, and using the latter sensor after the initial synchronization is established may be used. In a word, a method may be selected according to systems and applications of use.

FIGS. 28 to 30 describe an example using a synthesizer of the present invention. However, the same is true to the case using an oscillator module of the present invention.

INDUSTRIAL APPLICABILITY

In a synthesizer of the present invention, in frequency adjustment by a control section, frequency adjustment unit $\Delta fcont$ of a synthesizer section is within predetermined value F so that quality of an output signal from a frequency converter is more excellent than a quality limit threshold value.

Therefore, since it is possible to reduce the dependence of a resonator constituting a reference oscillator on the frequency-temperature characteristics, the synthesizer of the present invention is useful for a digital TV receiver, and the like.

The invention claimed is:
1. A synthesizer comprising:
a synthesizer section for generating an oscillation signal based on a reference oscillation signal output from a reference oscillator including a micro-electro-mechanical system (MEMS) resonator, and inputting the oscillation signal to a frequency converter; and
a control section for adjusting a frequency of the oscillation signal output from the synthesizer section by a frequency adjustment value $\Delta fcont$,
wherein, when a signal quality of an output signal from the frequency converter is better than or equal to a signal quality represented by a quality limit threshold value, the control section adjusts the frequency adjustment value $\Delta fcont$ to be less than or equal to a predetermined value F associated with the quality limit threshold value, based on a predetermined relationship between the frequency adjustment value $\Delta fcont$ and the signal quality.

2. The synthesizer of claim 1,
wherein the quality limit threshold value is an error rate limit threshold value.

3. The synthesizer of claim 2,
wherein the error rate limit threshold value is $3 \times 10^{-3}$.

4. The synthesizer of claim 1,
wherein the synthesizer is installed in a reception device for receiving a time division signal, and
the control section makes the frequency adjustment value of the synthesizer section larger than the predetermined value F during a period of time in which the reception device does not receive a desired signal.

5. The synthesizer of claim 1,
wherein the synthesizer is installed in a reception device for receiving a signal including a guard interval signal, and
the control section makes the frequency adjustment value of the synthesizer section larger than the predetermined value F during a period of time in which the reception device receives the guard interval signal.

6. The synthesizer of claim 1,
wherein when a frequency fluctuation of the oscillation signal is out of a permissible range, the frequency adjustment value of the synthesizer section is made to be larger than the predetermined value F.

7. The synthesizer of claim 1,
further comprising a temperature detection section for detecting a temperature,
wherein the control section adjusts the frequency of the oscillation signal based on a detection result by the temperature detection section.

8. The synthesizer of claim 1,
further comprising a frequency difference detection section connected to an output side of the frequency converter,
wherein the control section adjusts the frequency of the oscillation signal based on a detection result by the frequency difference detection section.

9. The synthesizer of claim 8,
wherein the control section carries out an amount of frequency adjustment derived from the detection result by a plurality of frequency adjustments.

10. The synthesizer of claim 1,
wherein the predetermined value F is 160 Hz.

11. A reception device comprising the synthesizer of claim 1.

12. The synthesizer of claim 1,
the synthesizer outputting an oscillation signal,
wherein a correction amount of an oscillation frequency of the synthesizer is determined based on a use state of an electronic device using the synthesizer.

13. The synthesizer of claim 1, comprising:

a comparator for receiving a reference oscillation signal;

an oscillator for outputting an oscillation signal based on an output signal of the comparator; and a frequency divider for frequency-dividing the output signal of the oscillator based on a control signal from the control section, wherein the comparator compares an output signal from the frequency divider with an output signal from a reference oscillator, and outputs a signal indicating a comparison result to the oscillator, and a value of a frequency division ratio of the frequency divider is determined based on the use state of the electronic device using the synthesizer.

14. The synthesizer of claim 1, a comparator for receiving a reference oscillation signal;

an oscillator for outputting an oscillation signal based on an output signal of the comparator; and a frequency divider for frequency-dividing the output signal of the oscillator based on a control signal from the control section, wherein the comparator compares an output signal from the frequency divider with an output signal from the reference oscillator, and outputs a signal indicating a comparison result to the oscillator, a value of a frequency division ratio of the frequency divider is determined based on the use state of the electronic device using the synthesizer, and a timing is previously determined, at which the frequency division ratio of the frequency divider is changed to the value of the frequency division ratio that is determined according to the use state of the electronic device.

* * * * *